(12) United States Patent
Shirakawa et al.

(10) Patent No.: US 10,593,398 B2
(45) Date of Patent: Mar. 17, 2020

(54) SEMICONDUCTOR STORAGE DEVICE INCLUDING A CONTROLLER CONFIGURED TO EXECUTE A FIRST WRITE AND A SECOND WRITE

(71) Applicant: TOSHIBA MEMORY CORPORATION, Minato-ku (JP)

(72) Inventors: Masanobu Shirakawa, Chigasaki (JP); Takayuki Akamine, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 331 days.

(21) Appl. No.: 15/459,542

(22) Filed: Mar. 15, 2017

(65) Prior Publication Data

US 2018/0075902 A1    Mar. 15, 2018

Related U.S. Application Data

(60) Provisional application No. 62/393,744, filed on Sep. 13, 2016.

(51) Int. Cl.
*G11C 11/56* (2006.01)
*G11C 16/34* (2006.01)
(Continued)

(52) U.S. Cl.
CPC ...... *G11C 11/5642* (2013.01); *G06F 11/1048* (2013.01); *G06F 11/1068* (2013.01); *G06F 11/1072* (2013.01); *G11C 11/5628* (2013.01); *G11C 16/0483* (2013.01); *G11C 16/3459* (2013.01); *G11C 29/52* (2013.01); *H03M 13/2906* (2013.01); *G11C 2029/0411* (2013.01); *G11C 2211/5642* (2013.01); *G11C 2211/5643* (2013.01)

(58) Field of Classification Search
None
See application file for complete search history.

(56) References Cited

U.S. PATENT DOCUMENTS

2006/0018162 A1* 1/2006 Kawai ............... G11C 16/12
                                                    365/185.28
2006/0215450 A1  9/2006 Honma et al.
(Continued)

FOREIGN PATENT DOCUMENTS

JP      8-263229 A    10/1996
JP      2006-277785   10/2006
(Continued)

*Primary Examiner* — Justin R Knapp
(74) *Attorney, Agent, or Firm* — Oblon, McClelland, Maier & Neustadt, L.L.P.

(57) ABSTRACT

According to one embodiment, a semiconductor storage device includes a first memory cell capable of storing n-bit data (n is a natural number not less than 4). When receiving first data, including first and second bits of the n-bit data, from a controller, the semiconductor storage device writes the received first data to the first memory cell. After receiving the first data, when the semiconductor storage device receives second data including third and fourth bits of the n-bit data, the semiconductor storage device reads the first and second bits from the first memory cell and writes the n-bit data to the first memory cell based on the read first and second bits and the received second data.

14 Claims, 52 Drawing Sheets

(51) Int. Cl.
  *G11C 16/04* (2006.01)
  *H03M 13/29* (2006.01)
  *G06F 11/10* (2006.01)
  *G11C 29/52* (2006.01)
  *H03M 13/00* (2006.01)
  *G11C 29/04* (2006.01)

(56) References Cited

U.S. PATENT DOCUMENTS

| | | |
|---|---|---|
| 2007/0285980 A1 | 12/2007 | Shimizu et al. |
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0194347 A1 | 8/2011 | Chae |
| 2011/0284946 A1 | 11/2011 | Kiyotoshi |
| 2012/0054416 A1 | 3/2012 | Kobayashi et al. |
| 2012/0069663 A1 | 3/2012 | Itagaki et al. |
| 2013/0148436 A1 | 6/2013 | Kurosawa |
| 2013/0332659 A1* | 12/2013 | Maejima ............... G11C 16/10 711/103 |
| 2014/0143631 A1 | 5/2014 | Varanasi |
| 2016/0172041 A1* | 6/2016 | Sakui ............... G11C 16/3459 365/185.03 |
| 2017/0046225 A1* | 2/2017 | Yang .................... G11C 7/1006 |
| 2018/0061489 A1* | 3/2018 | Shibata ............... G11C 11/5635 |

FOREIGN PATENT DOCUMENTS

| | | |
|---|---|---|
| JP | 2007-157315 A | 6/2007 |
| JP | 2007-305210 | 11/2007 |
| JP | 2012-48791 | 3/2012 |
| JP | 2016-504658 A | 2/2016 |

* cited by examiner

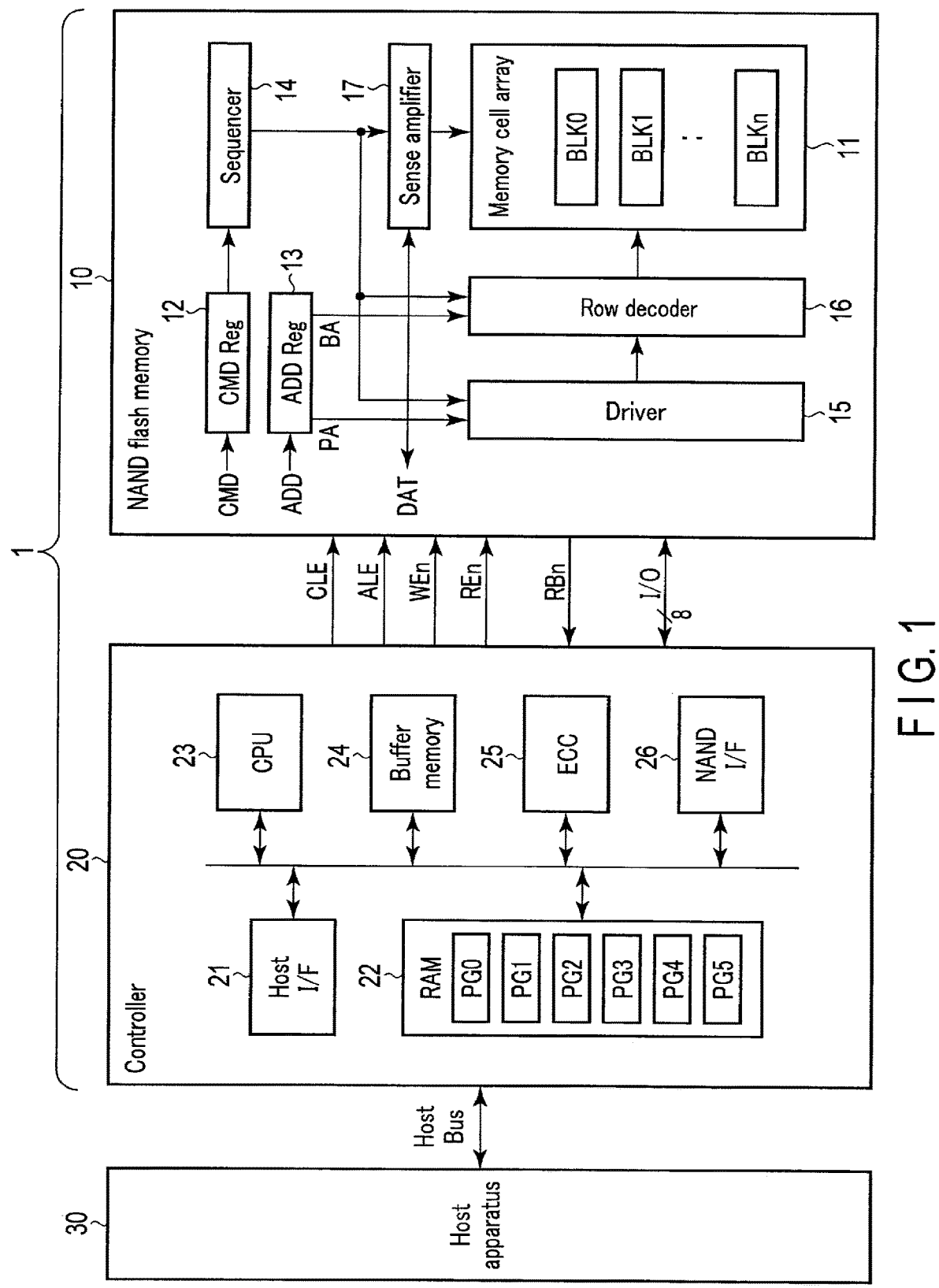
F I G. 1

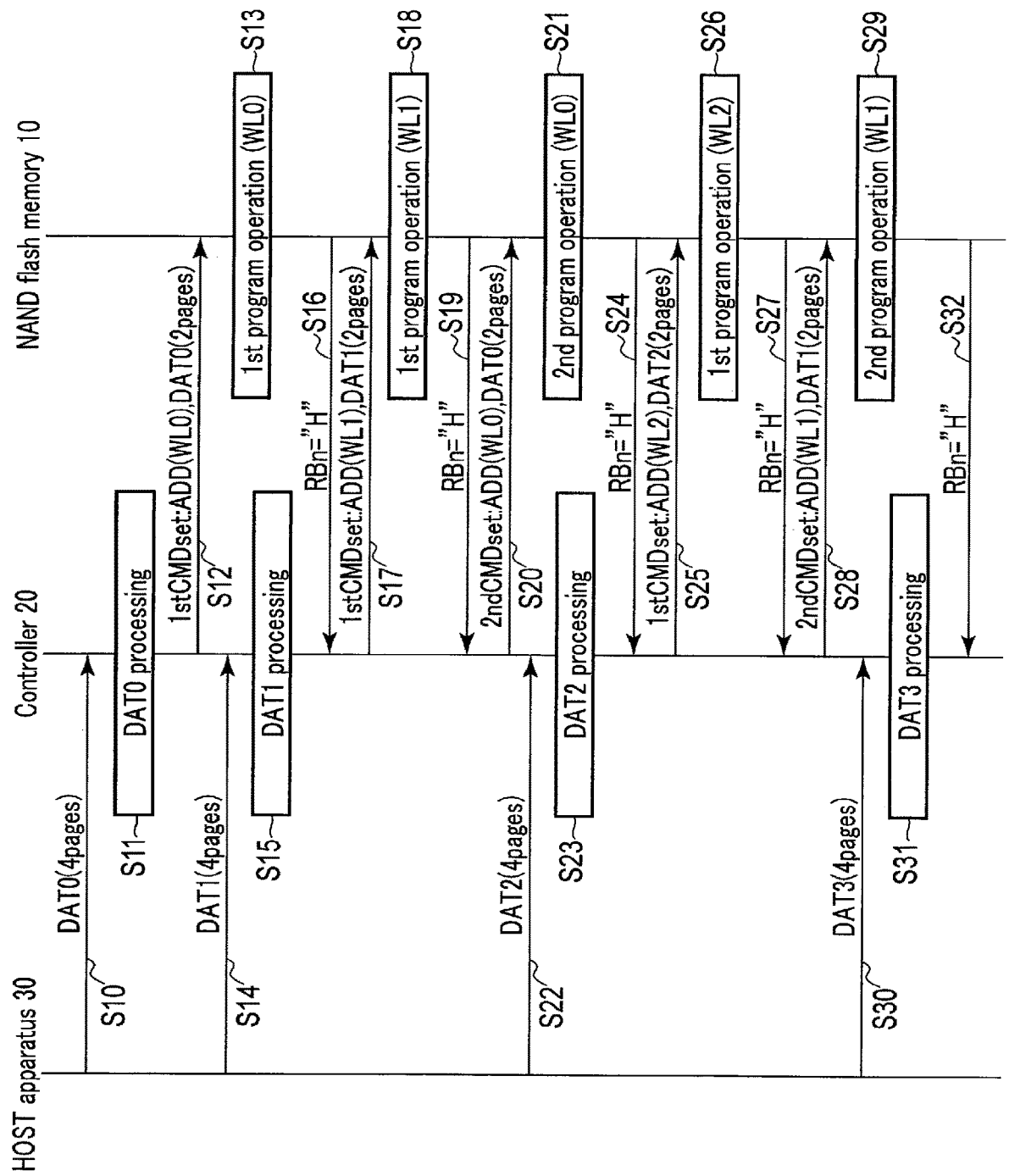
F I G. 5

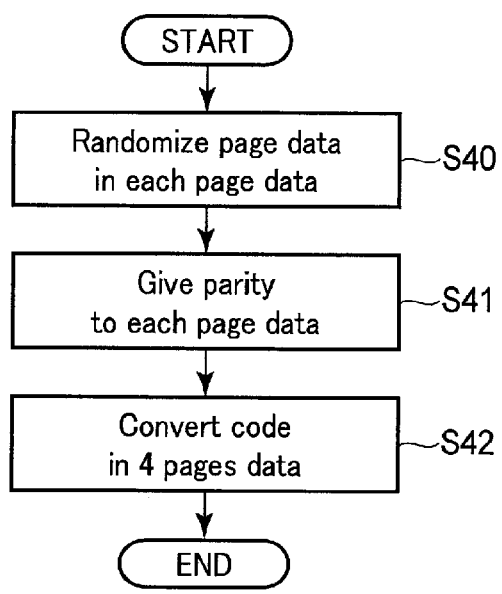
F I G. 7

4-4-3-4 code

| Page | Data | | | | | | | | | | | | | | |
|---|---|---|---|---|---|---|---|---|---|---|---|---|---|---|---|
| Top | 1 | 1 | 1 | 1 | 0 | 1 | 1 | 0 | 0 | 0 | 1 | 1 | 1 | 0 | 1 |
| Upper | 1 | 1 | 0 | 0 | 0 | 1 | 1 | 1 | 0 | 1 | 1 | 0 | 1 | 0 | 1 |
| Middle | 1 | 1 | 0 | 0 | 0 | 0 | 0 | 1 | 1 | 0 | 0 | 1 | 0 | 1 | 1 |
| Lower | 1 | 0 | 0 | 1 | 1 | 0 | 0 | 0 | 0 | 1 | 1 | 1 | 1 | 1 | 1 |

Convert code "4-4-3-4" to "1-2-4-8"

1-2-4-8 code

| Page | Data | | | | | | | | | | | | | | |
|---|---|---|---|---|---|---|---|---|---|---|---|---|---|---|---|
| MU2 | 1 | 0 | 1 | 1 | 0 | 0 | 1 | 0 | 0 | 0 | 1 | 1 | 0 | 0 | 1 |
| ML2 | 1 | 1 | 0 | 0 | 0 | 0 | 1 | 1 | 1 | 1 | 0 | 0 | 0 | 1 | 1 |
| MU1 | 1 | 1 | 1 | 0 | 1 | 0 | 0 | 0 | 0 | 1 | 1 | 1 | 1 | 1 | 1 |
| ML1 | 1 | 1 | 1 | 1 | 1 | 0 | 1 | 0 | 0 | 0 | 1 | 0 | 0 | 0 | 0 |

F I G. 8

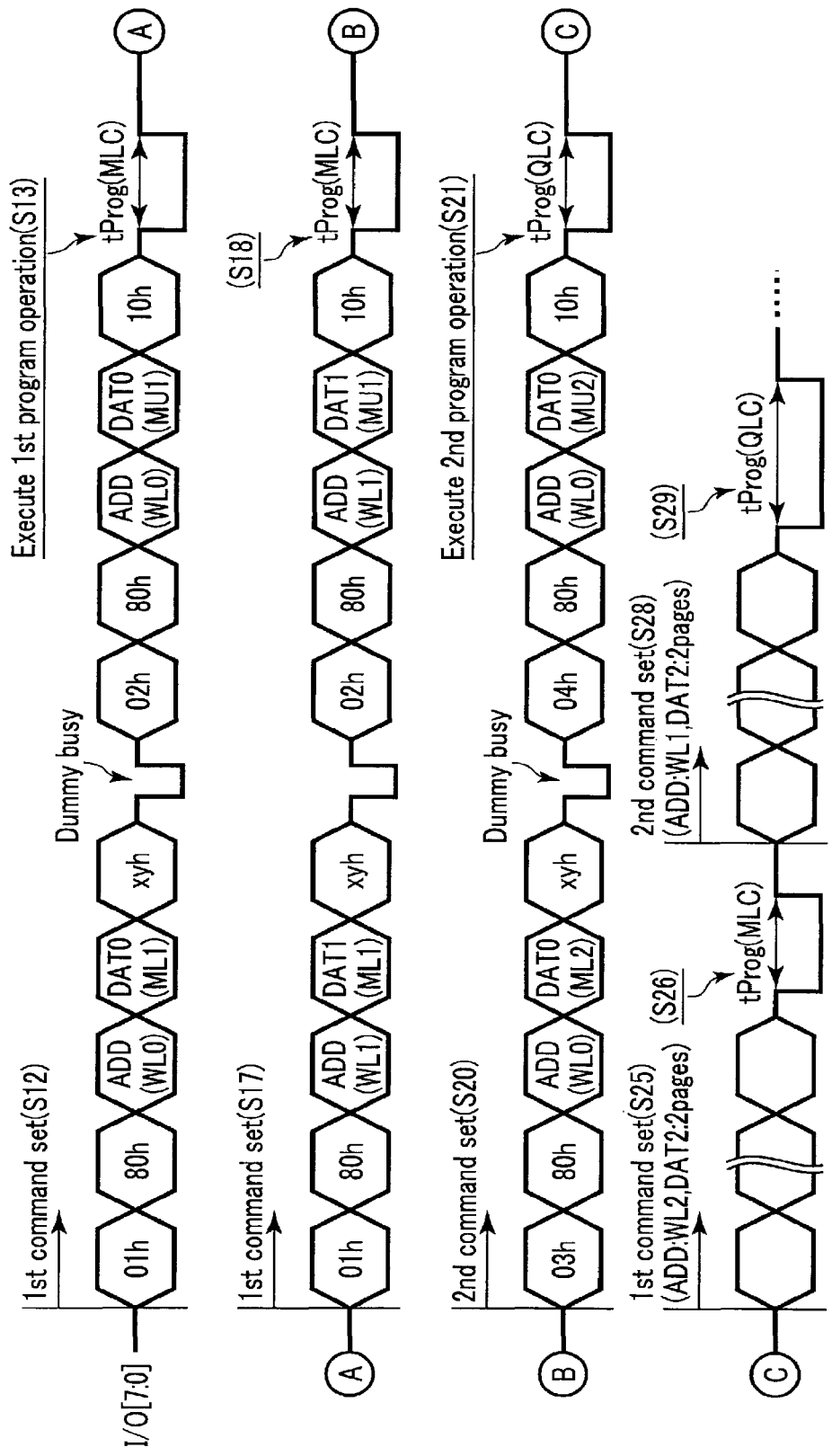
F I G. 11

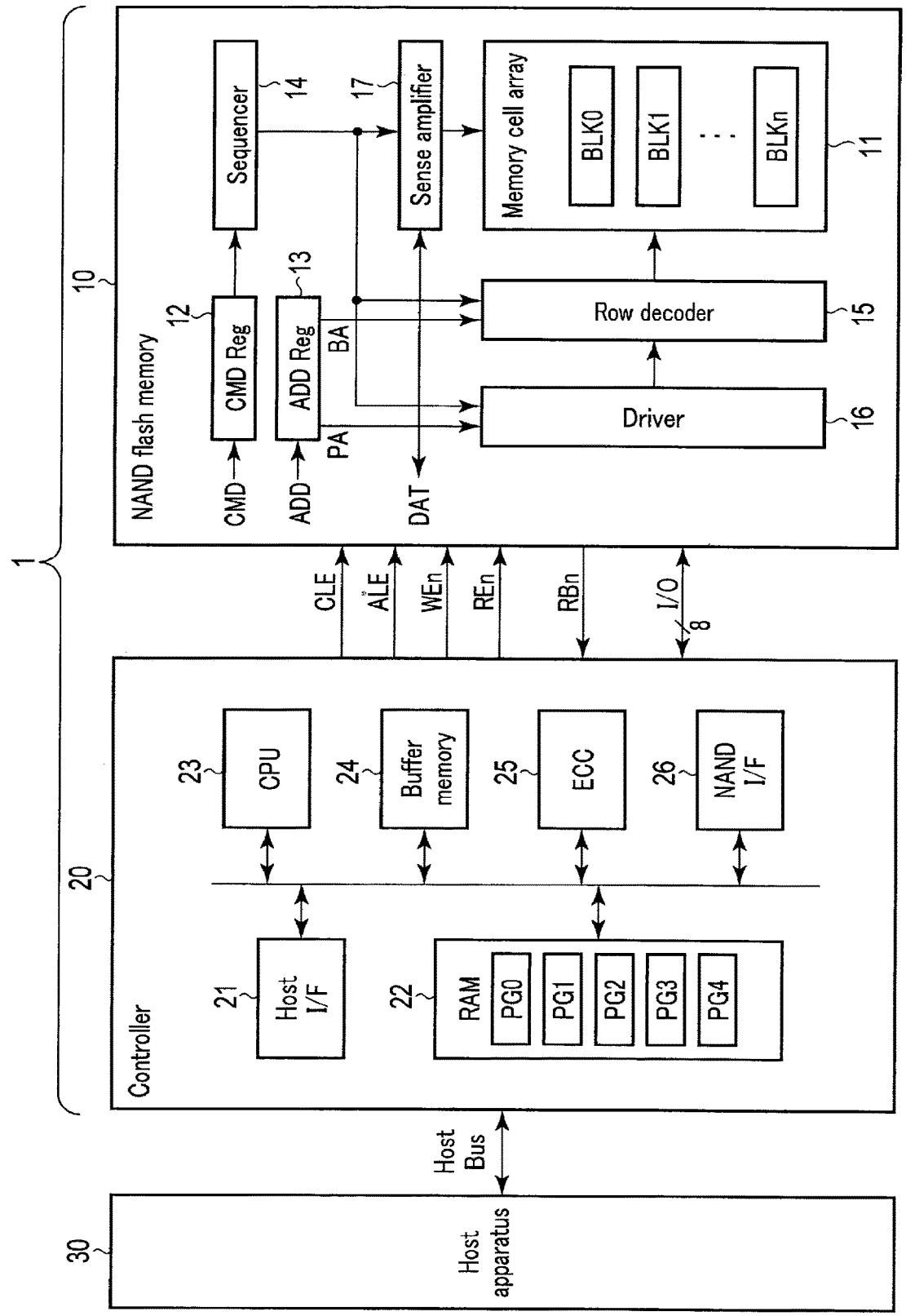
F I G. 15

4-4-3-4 code

| Page | Data | | | | | | | | | | | | | | |
|---|---|---|---|---|---|---|---|---|---|---|---|---|---|---|---|
| Top | 1 | 1 | 1 | 1 | 1 | 0 | 0 | 0 | 0 | 1 | 1 | 0 | 0 | 0 | 1 |
| Upper | 1 | 1 | 0 | 0 | 0 | 0 | 1 | 0 | 1 | 1 | 1 | 1 | 1 | 0 | 0 |
| Middle | 1 | 1 | 1 | 0 | 0 | 0 | 0 | 0 | 0 | 0 | 1 | 0 | 1 | 1 | 0 |
| Lower | 1 | 0 | 0 | 1 | 1 | 0 | 1 | 0 | 0 | 1 | 1 | 1 | 1 | 1 | 1 |

⇩ Convert code "4-4-3-4" to "1-2-4-8"

1-2-4-8 code

| Page | Data | | | | | | | | | | | | | | |
|---|---|---|---|---|---|---|---|---|---|---|---|---|---|---|---|
| SL2 | 1 | 0 | 0 | 1 | 1 | 0 | 1 | 0 | 0 | 1 | 0 | 1 | 1 | 1 | 0 |
| TU1 | 1 | 1 | 0 | 0 | 0 | 0 | 1 | 0 | 1 | 1 | 1 | 0 | 0 | 1 | 1 |
| TM1 | 1 | 1 | 1 | 0 | 1 | 0 | 0 | 0 | 0 | 0 | 0 | 0 | 1 | 1 | 1 |
| TL1 | 1 | 1 | 1 | 1 | 1 | 1 | 0 | 0 | 0 | 0 | 0 | 0 | 0 | 0 | 0 |

F I G. 18

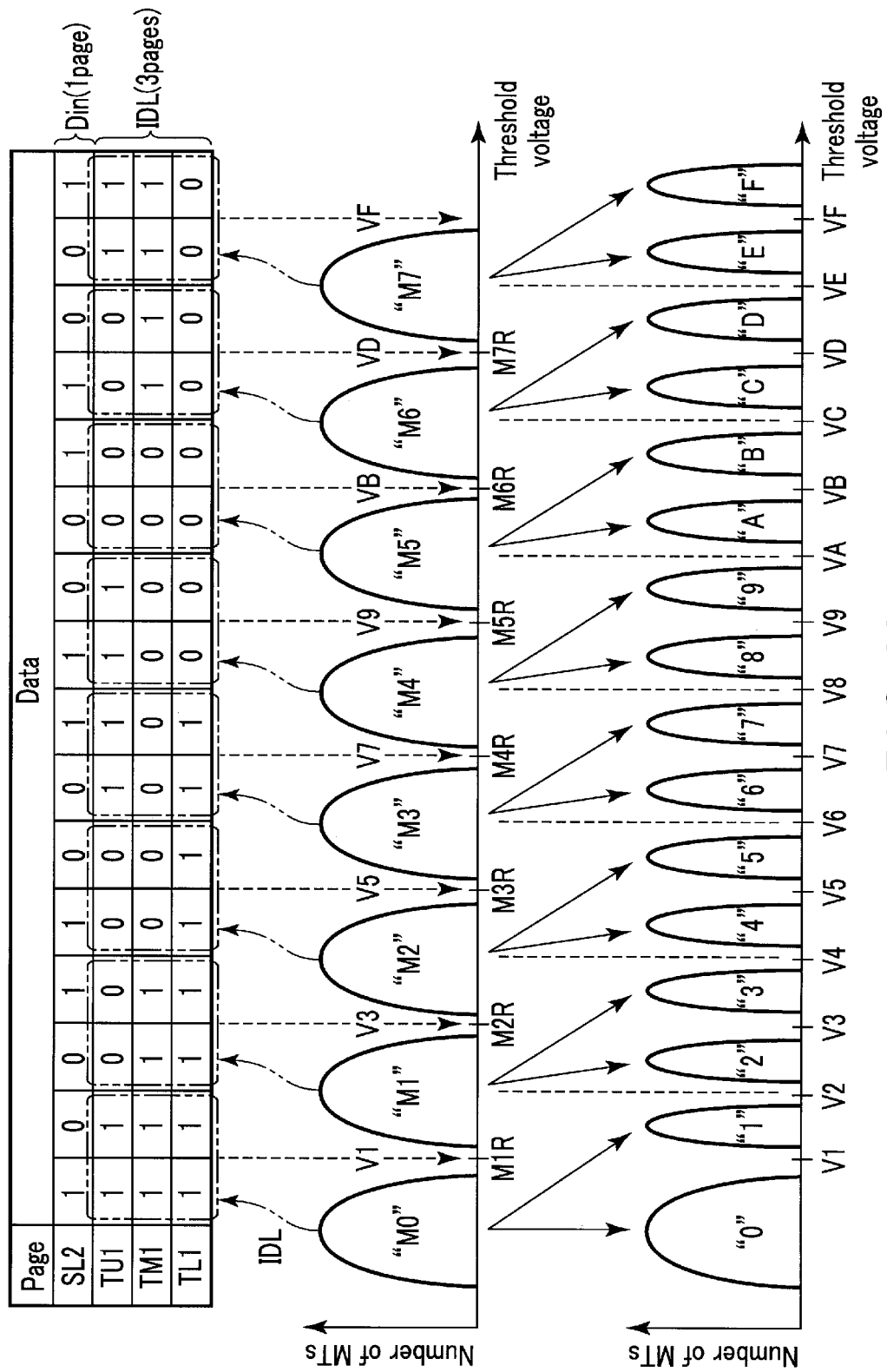
F I G. 20

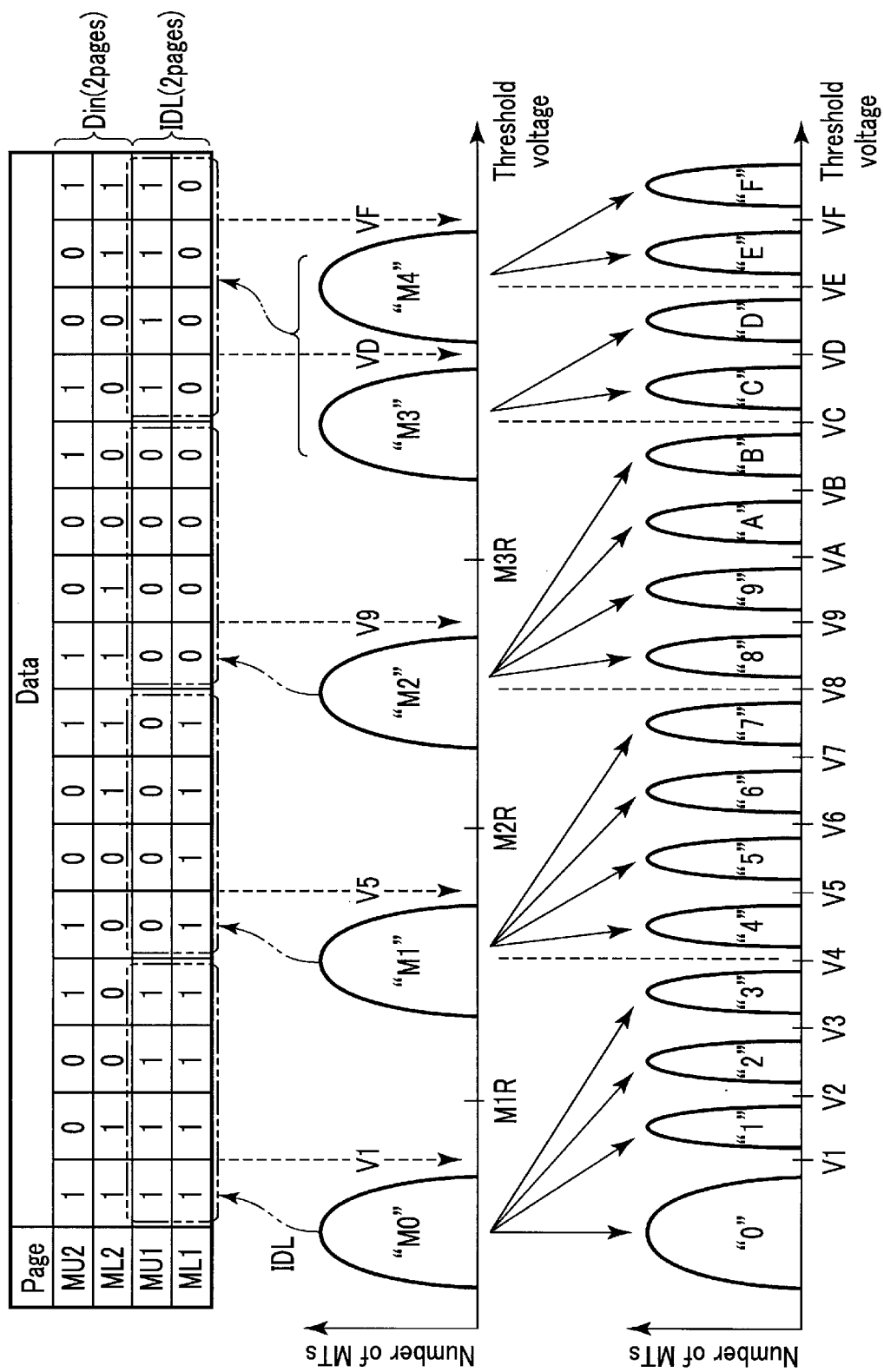
F I G. 26

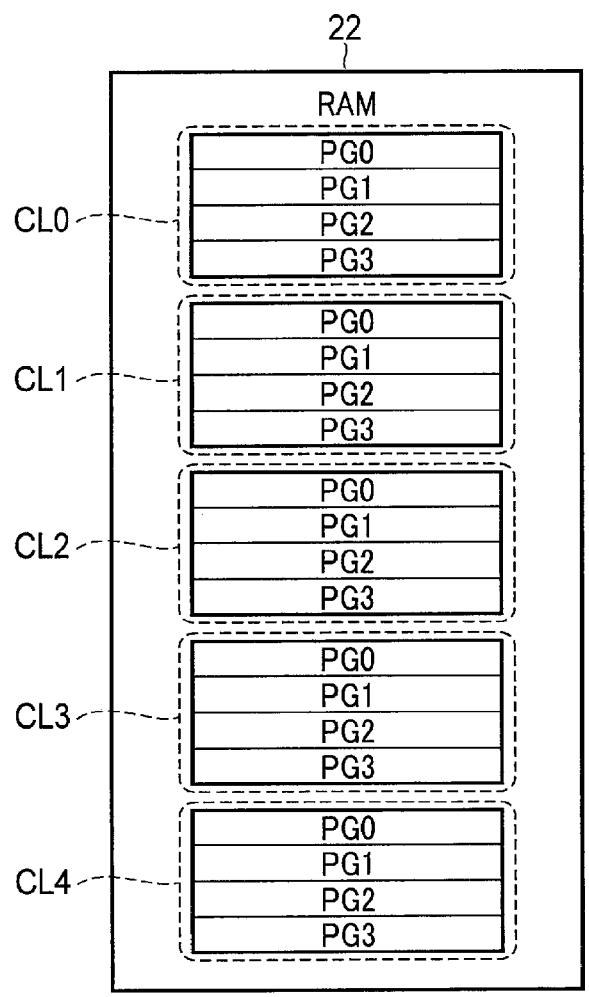
F I G. 33

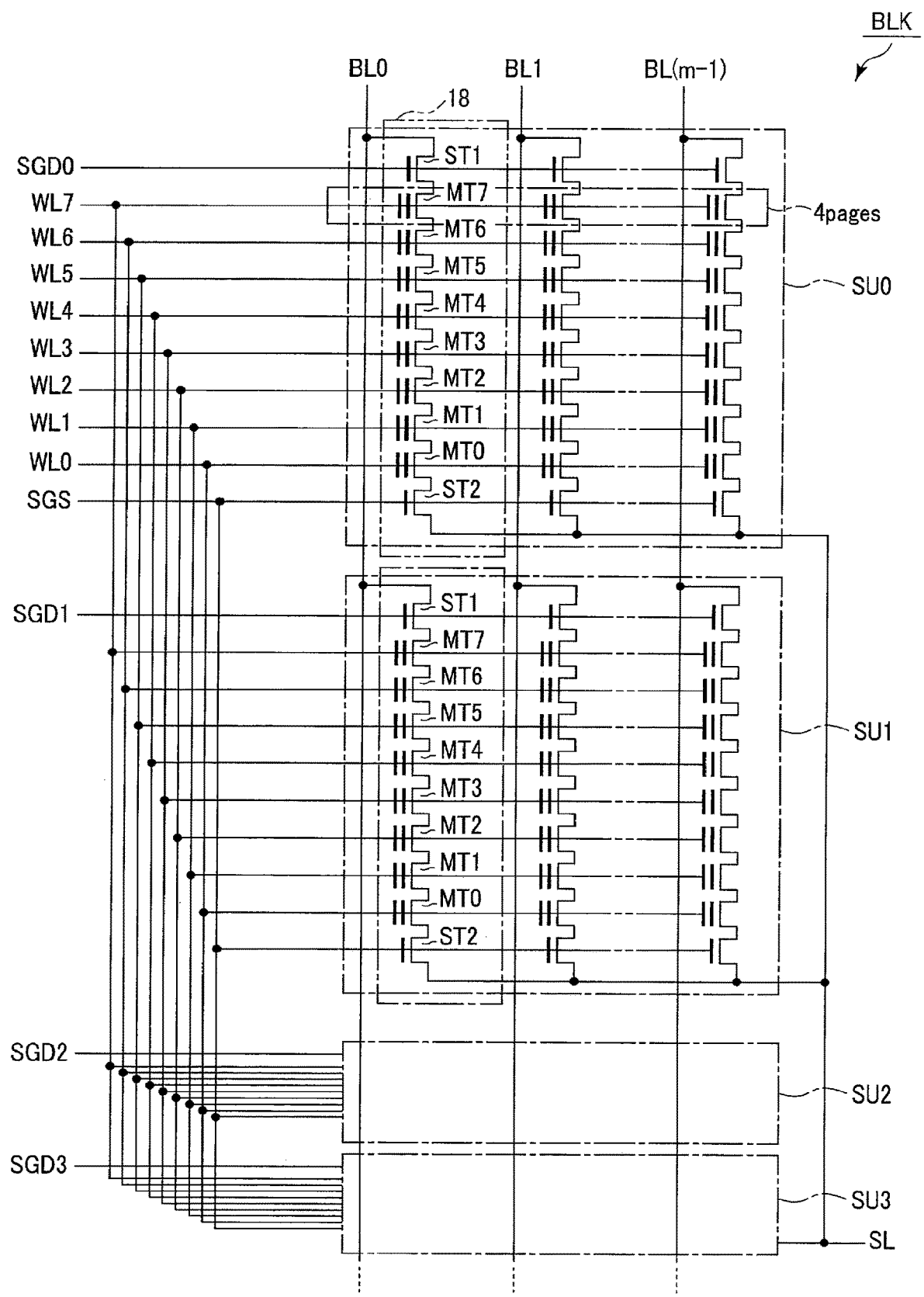
F I G. 34

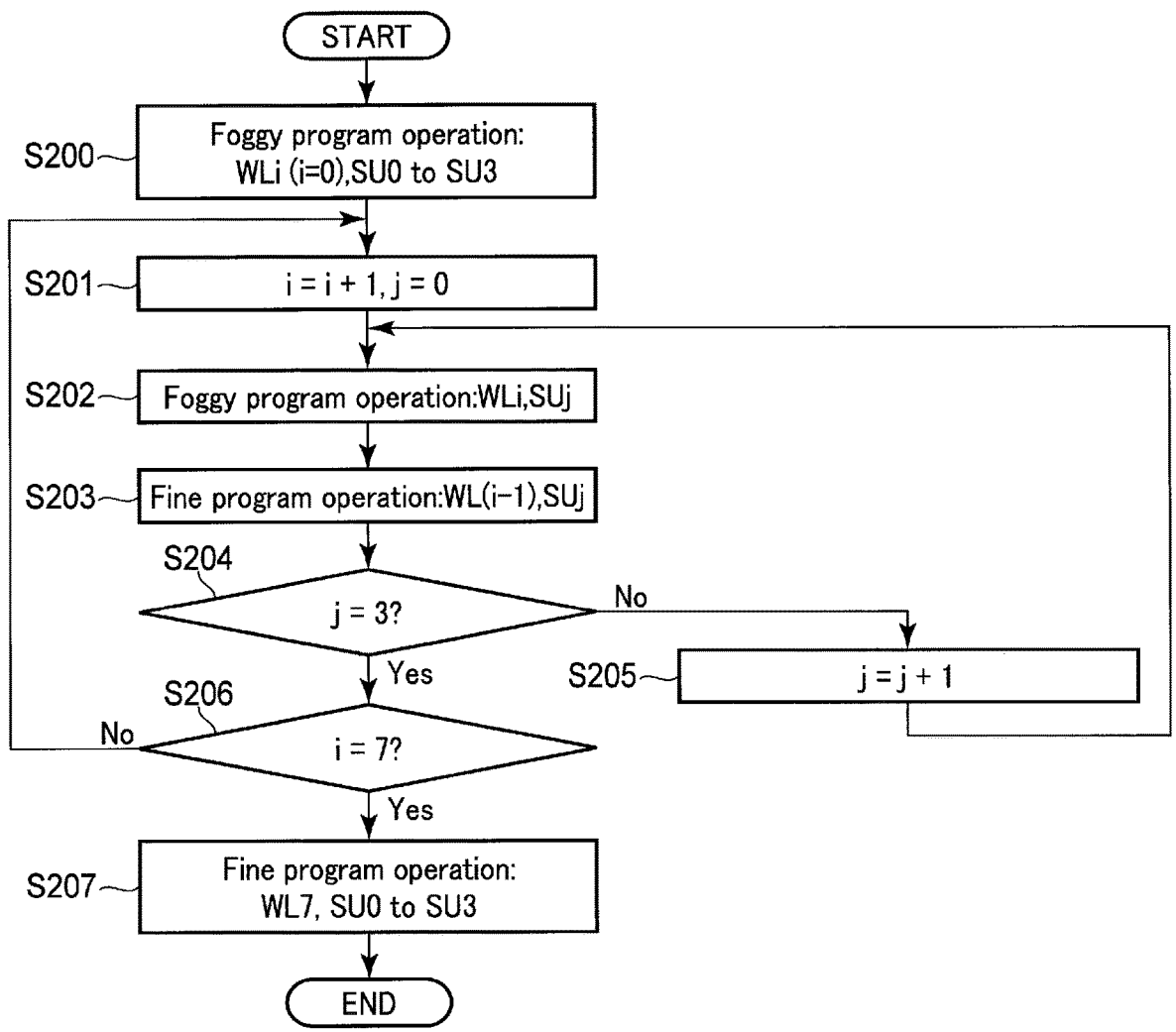
F I G. 35

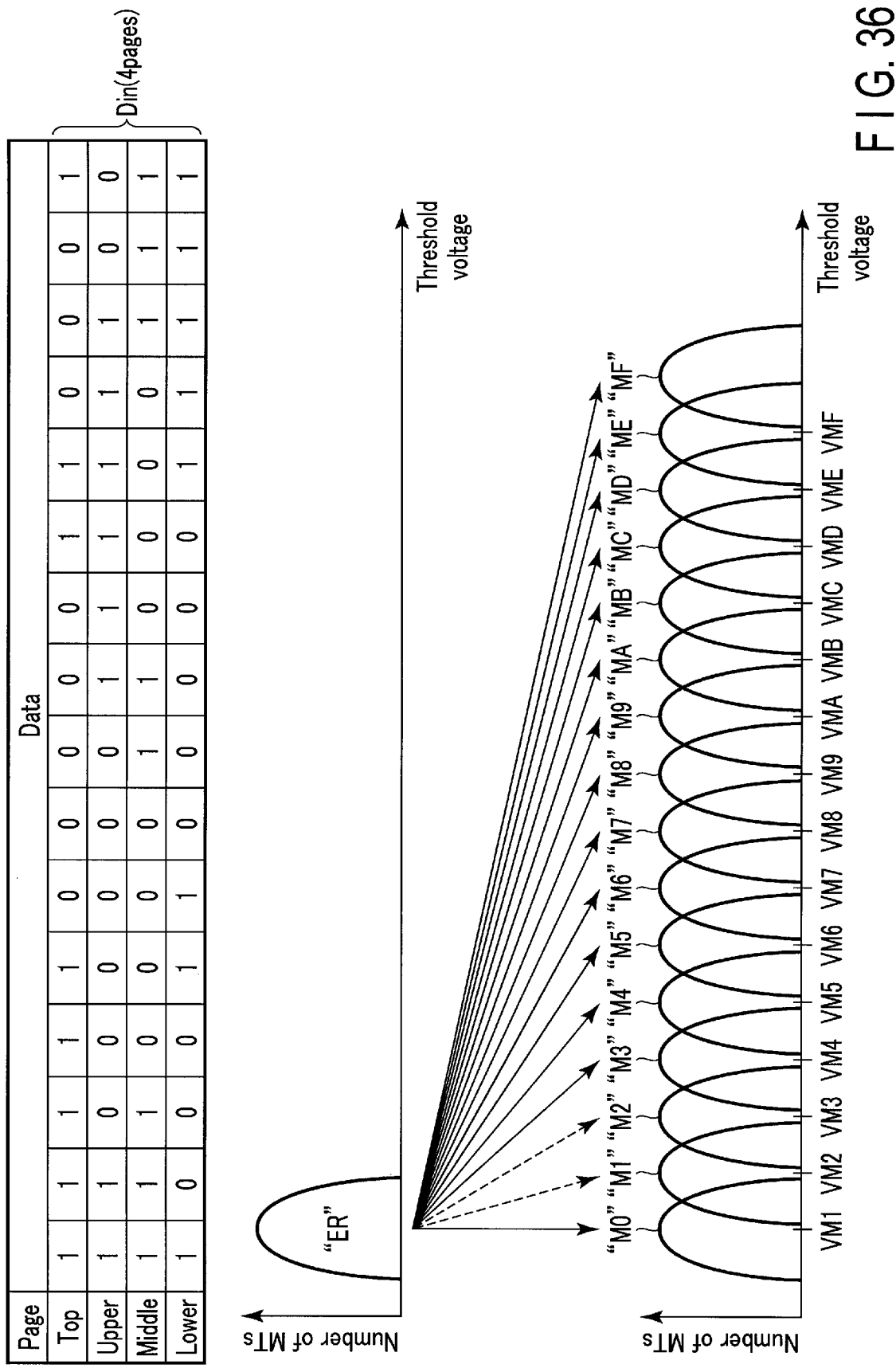
F I G. 36

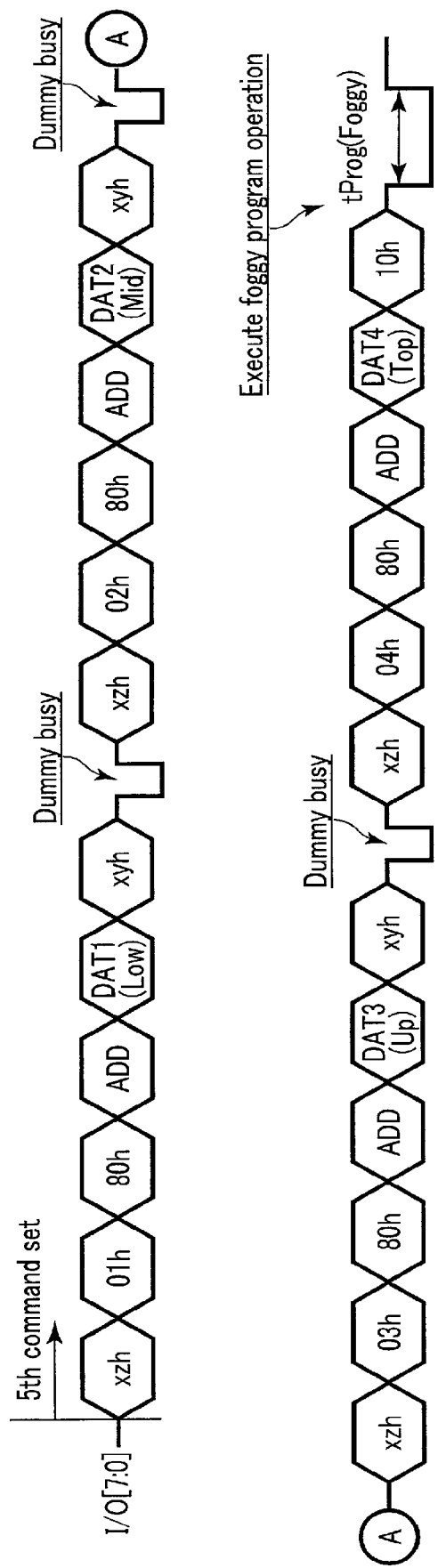
F I G. 39

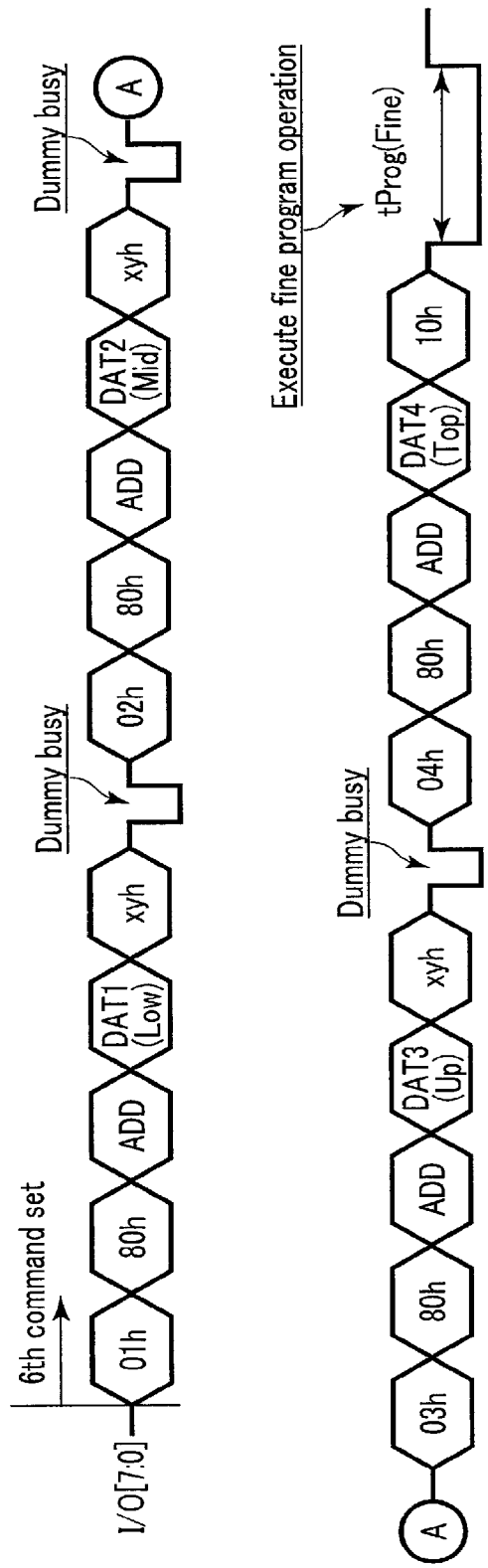
F I G. 40

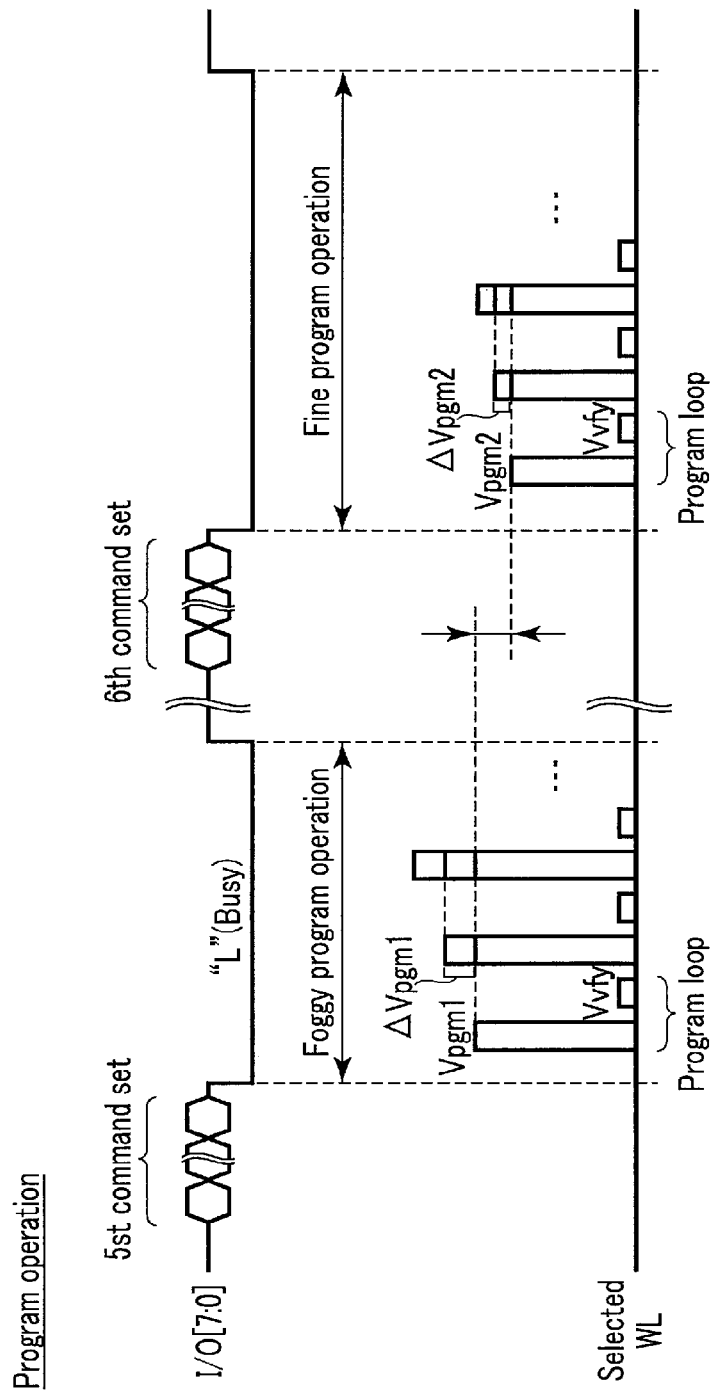
F I G. 41

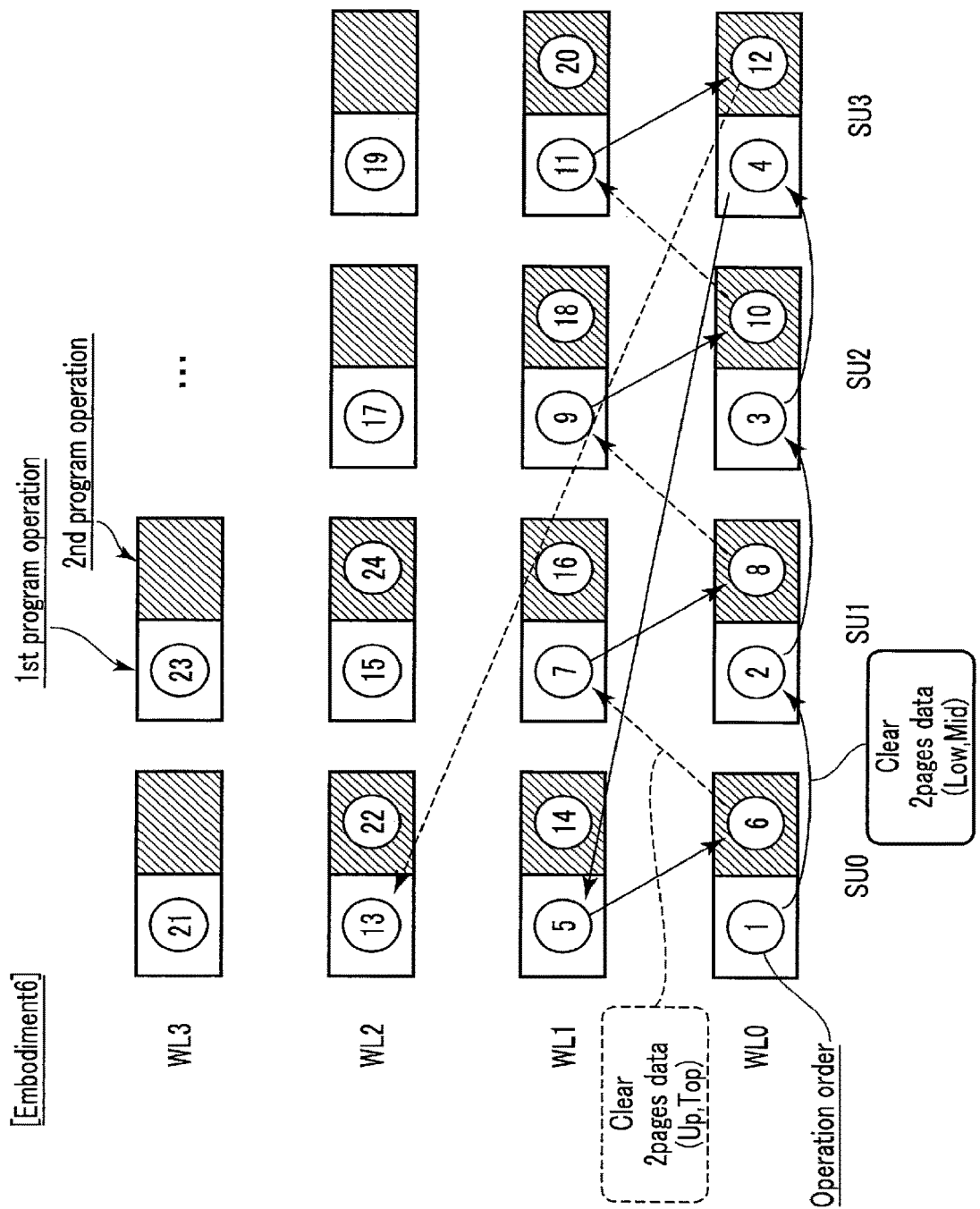
F I G. 46

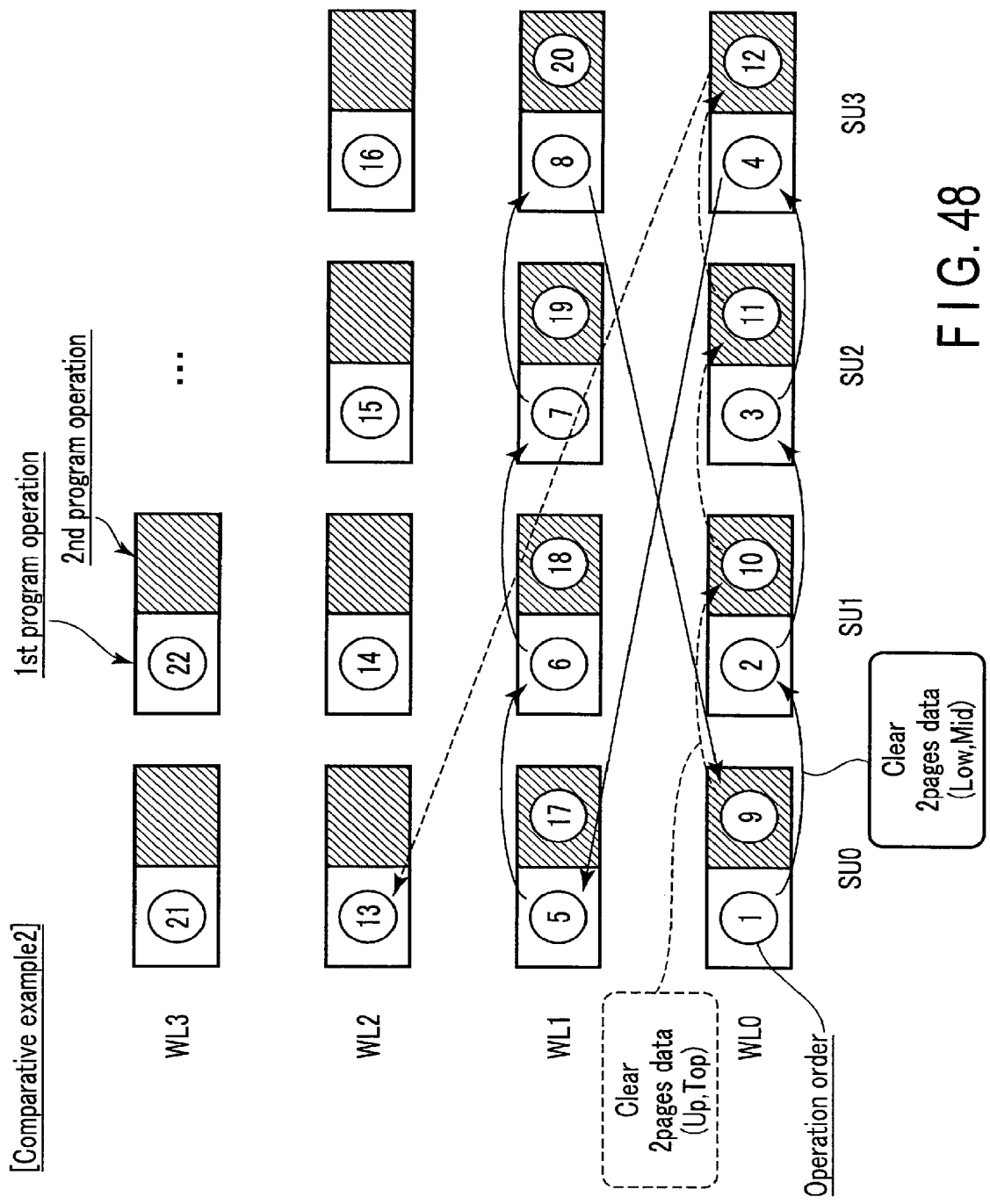
F I G. 48

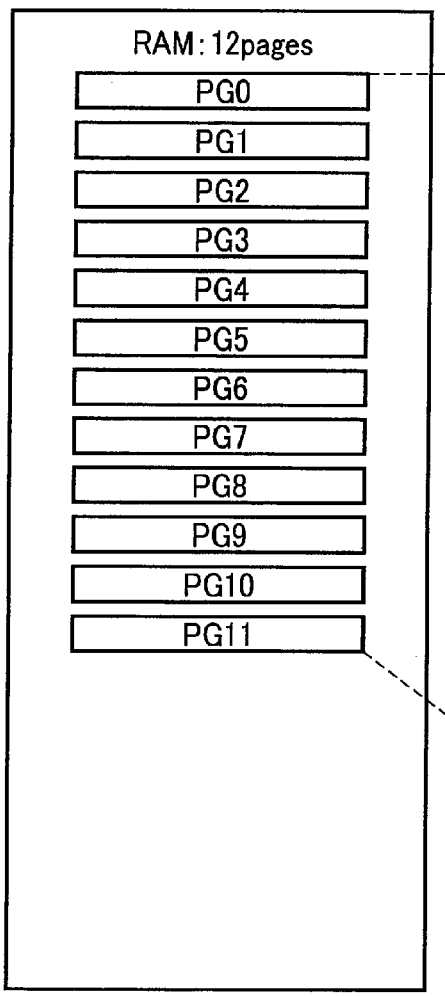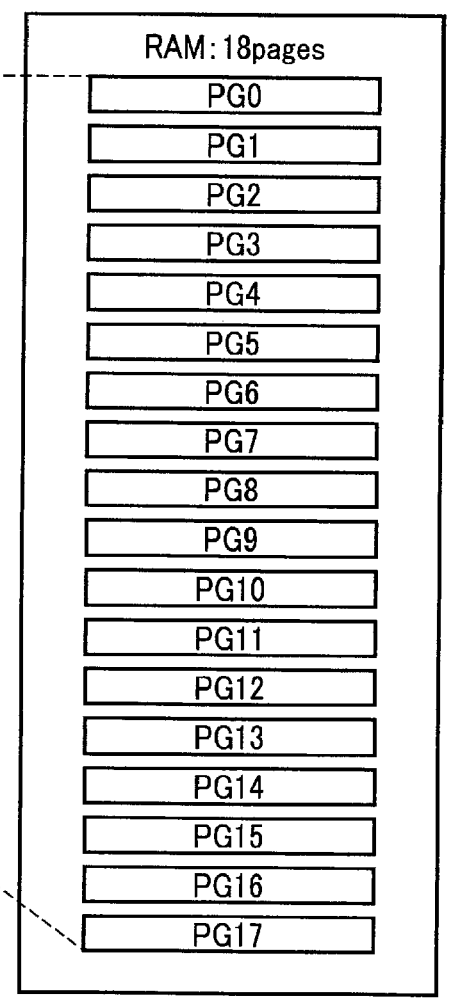
F I G. 49

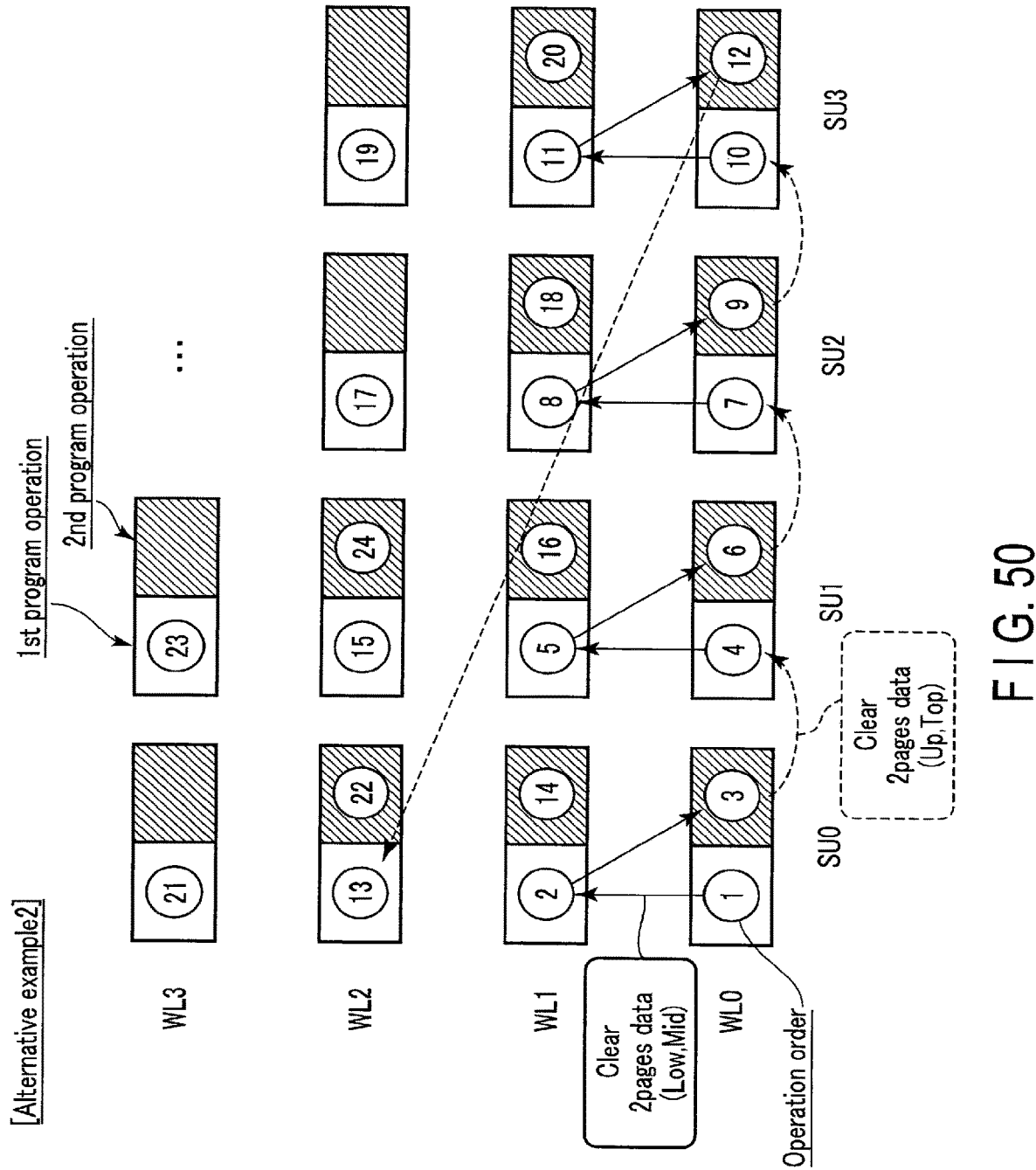
F I G. 50

SEMICONDUCTOR STORAGE DEVICE INCLUDING A CONTROLLER CONFIGURED TO EXECUTE A FIRST WRITE AND A SECOND WRITE

CROSS-REFERENCE TO RELATED APPLICATIONS

This application claims the benefit of U.S. Provisional Application No. 62/393,744, filed Sep. 13, 2016, the entire contents of which are incorporated herein by reference.

FIELD

Embodiments described herein relate generally to a semiconductor storage device and a memory system.

BACKGROUND

A NAND flash memory is widespread as a data storage device.

BRIEF DESCRIPTION OF THE DRAWINGS

FIG. 1 is a block diagram of a memory system according to a first embodiment;

FIG. 5 is a flowchart of a write operation in the memory system according to the first embodiment;

FIG. 7 is a flowchart showing a write data processing method during the write operation in the controller according to the first embodiment;

FIG. 8 is a graph for explaining write data code conversion during the write operation in the controller according to the first embodiment;

FIG. 11 is a command sequence of the write operation in the memory system according to the first embodiment;

FIG. 15 is a block diagram of a memory system according to a second embodiment;

FIG. 18 is a graph for explaining write data code conversion during the write operation in the controller according to the second embodiment;

FIGS. 19 and 20 are views showing a change in threshold distribution in the write operation in the semiconductor storage device according to the second embodiment;

FIGS. 25 and 26 are views showing a change in threshold distribution in the write operation in the semiconductor storage device according to the third embodiment;

FIG. 33 is a block diagram of a RAM of a controller according to a fifth embodiment;

FIG. 34 is a circuit diagram of a memory cell array of a semiconductor storage device according to the fifth embodiment;

FIG. 35 is a flow chart of a program operation in a memory system according to the fifth embodiment;

FIGS. 36 and 37 are views showing a change in threshold distribution in a program operation in the semiconductor storage device according to the fifth embodiment;

FIGS. 39 and 40 are command sequences of the program operation in the memory system according to the fifth embodiment;

FIG. 41 is a command sequence and a waveform chart of the program operation in the semiconductor storage device according to the fifth embodiment;

FIG. 46 is a view showing a writing order in a program operation in a memory system according to a sixth embodiment;

FIG. 48 is a view showing a writing order in a program operation in a memory system according to a comparative example of the sixth embodiment;

FIG. 49 is a view for comparing the storage capacity of RAM between a controller according to the sixth embodiment and a controller according to the comparative example;

FIG. 50 is a view showing the writing order in the program operation in the memory system according to a variation of the sixth embodiment.

DETAILED DESCRIPTION

Figure 2:
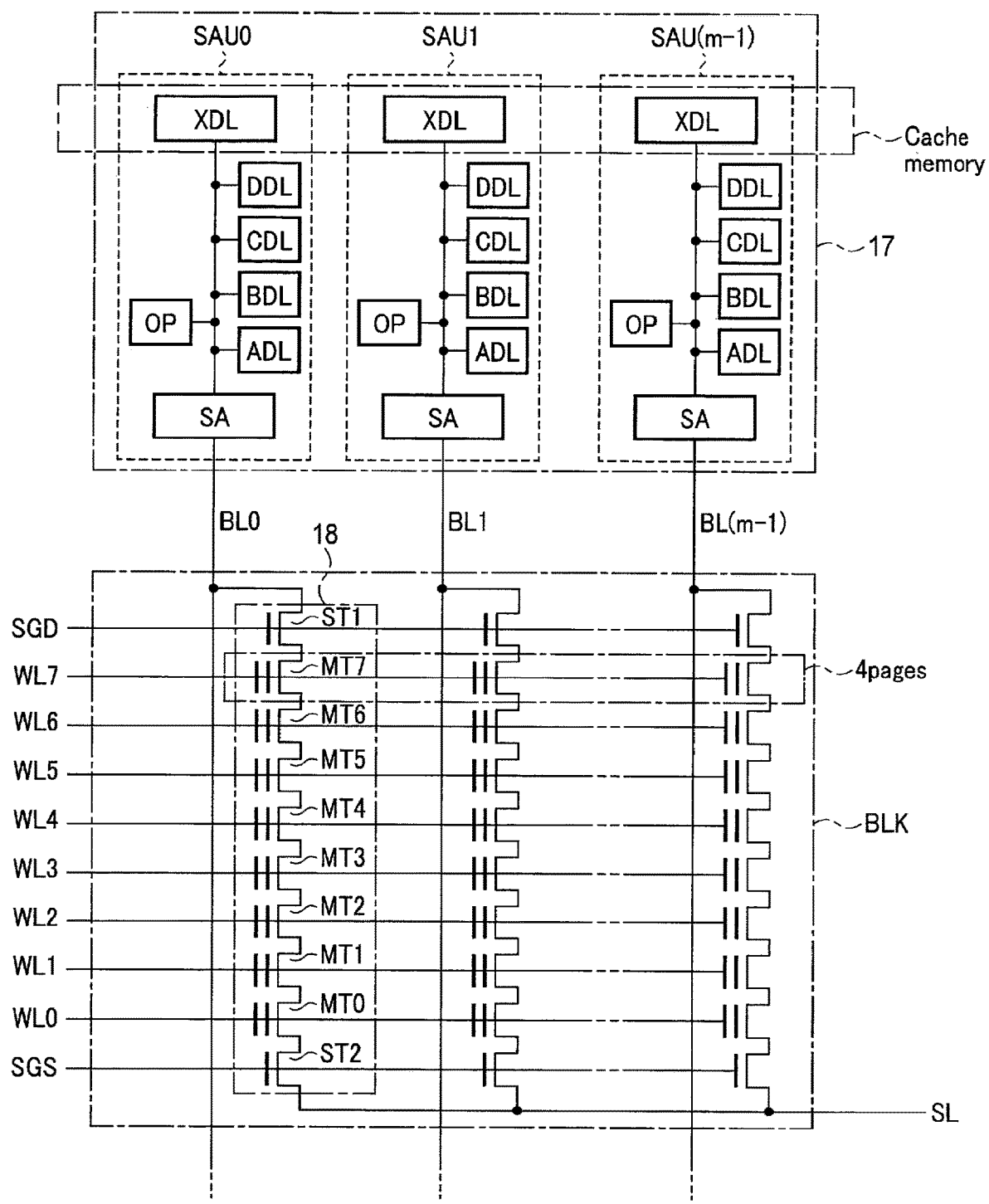
FIG. 2 is a circuit diagram of a memory cell array and a sense amplifier module of a semiconductor storage device according to the first embodiment.

In general, according to one embodiment, a semiconductor storage device includes a first memory cell capable of storing n-bit data (n is a natural number not less than 4). When receiving first data, including first and second bits of the n-bit data, from a controller, the semiconductor storage device writes the received first data to the first memory cell. After receiving the first data, when the semiconductor storage device receives second data including third and fourth bits of the n-bit data, the semiconductor storage device reads the first and second bits from the first memory cell and writes the n-bit data to the first memory cell based on the read first and second bits and the received second data.

Hereinafter, embodiments will be described with reference to the drawings. The drawings are schematic. The embodiments to be described below exemplify devices and methods for embodying the technical concepts of the embodiments.

In the following explanation, the same reference numerals denote constituent elements having almost the same functions and arrangements. A number just after a letter constituting a reference numeral is referred to by the reference numeral containing the same letter and is used for distinguishing the components having a similar configuration. When the components indicated by the reference numerals containing the same letter do not need to be distinguished from each other, the components are referred to by the reference numeral containing only a letter.

[1] First Embodiment

A semiconductor storage device and a memory system according to a first embodiment will be described.

[1-1] Configuration

[1-1-1] Configuration of Memory System 1

A configuration of a memory system 1 will be described using FIG. 1. FIG. 1 is a block diagram of the memory system 1. As shown in FIG. 1, the memory system 1 includes a semiconductor storage device 10 and a controller 20, and is connected to an external host apparatus 30.

The semiconductor storage device 10 is a NAND-type flash memory which nonvolatilely stores data. A configuration of the semiconductor storage device 10 will be described later.

The controller 20 issues commands for reading, writing, erasing or the like to the semiconductor storage device 10, in response to an instruction from the host apparatus 30. As shown in FIG. 1, the controller 20 includes a host interface circuit 21, a built-in memory (RAM) 22, a processor (CPU) 23, a buffer memory 24, an ECC circuit 25, and a NAND interface circuit 26.

The host interface circuit 21 is connected to the host apparatus 30 through a host bus and communicates with the host apparatus 30. For example, the host interface circuit 21 transfers an instruction and data, received from the host apparatus 30, respectively to the processor 23 and the buffer memory 24. The host interface circuit 21 further transfers data in the buffer memory 24 to the host apparatus 30, in response to an instruction from the processor 23.

The RAM 22 is a semiconductor memory such as DRAM, and retains firmware for management of the semiconductor storage device 10, various management tables, or the like. The RAM 22 is used as a work area of the processor 23 and, for example, includes regions PG0 to PG5 used during a write operation. The regions PG each can hold 1 page data. The definition of the "page" will be described later.

The CPU 23 controls the overall operation of the controller 20. For example, the CPU 23 issues a write command to the NAND interface circuit 26, in response to a write instruction received from the host apparatus 30. This operation is similar for reading and erasing. Further, the CPU 23 executes various processes for managing a memory space of the semiconductor storage device 10, such as wear leveling.

The buffer memory 24 temporarily retains read data, received by the controller 20 from the semiconductor storage device 10, write data, received from the host apparatus 30, and so on.

The ECC circuit 25 executes a data error checking and correcting (ECC) process. Specifically, the ECC circuit 25 generates parity bits, based on write data during data writing. Then, the ECC circuit 25 generates syndrome bits from the parity bits during data reading, to detect an error, and thus to correct the detected error.

The NAND interface circuit 26 is connected to the semiconductor storage device 10 through a NAND bus and communicates with the semiconductor storage device 10. A signal is transmitted or received between the semiconductor storage device 10 and the controller 20 in accordance with the NAND interface. For example, the NAND interface circuit 26 transmits a command latch enable signal CLE, an address latch enable signal ALE, a write enable signal WEn, and a read enable signal REn to the semiconductor storage device 10, receives a ready/busy signal RBn from the semiconductor storage device 10, and transmits or receives an input/output signal I/O to or from the semiconductor storage device 10.

The signals CLE and ALE indicate the fact that the input signals I/O transmitted to the semiconductor storage device 10 are a command CMD and address information ADD to the semiconductor storage device 10. The signal WEn is asserted with an "L" level and allows the semiconductor storage device 10 to take the input signal I/O. The signal REn is asserted with the "L" level and a signal for reading the output signal I/O from the semiconductor storage device 10.

The ready/busy signal RBn indicates whether the semiconductor storage device 10 can receive an instruction from the controller 20. The ready/busy signal RBn is set to an "H" level, for example when the semiconductor storage device 10 is in a ready state in which the semiconductor storage device 10 can receive the instruction from the controller 20, and the ready/busy signal RBn is set to the "L" level when the semiconductor storage device 10 is in a busy state in which the semiconductor storage device 10 cannot receive the instruction.

The input/output signal I/O is a signal of 8 bits, for example, and corresponds to the command CMD, the address information ADD, data DAT, and the like. For example, during a write operation, the input/output signal I/O transferred to the semiconductor storage device 10 includes a write command CMD issued by the CPU 23 and write data DAT in the buffer memory 24. On the other hand, during a read operation, the input/output signal I/O transferred to the semiconductor storage device 10 includes a read command, and the input/output signal I/O transferred to the controller 20 includes read data DAT.

Examples of the host apparatus 30 using the memory system 1 described above include a digital camera and a personal computer.

A semiconductor device may be constituted by combining the semiconductor storage device 10 and the controller 20, for example. Examples of such a semiconductor device include a memory card, such as SD™ card, and SSD (solid state drive).

[1-1-2] Configuration of Semiconductor Storage Device 10

Next, a configuration of the semiconductor storage device 10 will be described continuously using FIG. 1. As shown in FIG. 1, the semiconductor storage device 10 includes a memory cell array 11, a command register 12, an address register 13, a sequencer 14, a driver circuit 15, a row decoder 16, and a sense amplifier module 17.

The memory cell array 11 includes blocks BLK0 to BLKn (n is an integer of 1 or more). The block BLK is a collection of a plurality of nonvolatile memory cells associated with a bit line and a word line, and is, for example, a data erase unit. The present embodiment will be described, taking as an example a case where memory cells are arrayed two-dimensionally on a semiconductor substrate.

The command register 12 retains the command CMD received from the controller 20. The address register 13 retains address information ADD received from the controller 20. The address information ADD includes a page address PA and a block address BA.

The sequencer 14 controls the overall operation of the semiconductor storage device 10, based on the command CMD retained by the command register 12. Specifically, the sequencer 14 controls the driver circuit 15, the row decoder 16, the sense amplifier module 17, and so on, based on the command CMD, and executes a write operation, a read operation, or the like.

The driver circuit 15 generates a desired voltage, based on an instruction from the sequencer 14. Further, the driver circuit 15 supplies the generated voltage to the row decoder 16, based on the page address PA retained by the address register 13.

The row decoder 16 selects any one of the blocks BLK0 to BLKn, based on the block address BA retained by the address register 13. Further, the row decoder 16 selects a row direction in the selected block BLK, and applies the voltage, supplied from the driver circuit 15, to a selected word line.

The sense amplifier module 17 outputs the data DAT, read from the memory cell array 11, to the controller 20. Further, the sense amplifier module 17 transfers the write data DAT, received from the controller 20, to the memory cell array 11.

[1-1-3] Configuration of Memory Cell Array 11

A configuration of the memory cell array 11 will be described using FIG. 2. FIG. 2 is a circuit diagram of the memory cell array 11 and the sense amplifier module 17, and shows a detailed circuit configuration regarding the block BLK in the memory cell array 11. As shown in FIG. 2, the block BLK includes a plurality of NAND strings 18.

The NAND strings 18 are provided corresponding to the bit lines BL0 to BL(m-1) ((m-1) is an integer of 1 or more), and, for example, the NAND string 18 includes eight memory cell transistors (MT0 to MT7) and select transistors ST1 and ST2. The number of the memory cell transistors MT included in the NAND string 18 is not limited thereto and, there may be an arbitrary number of memory cell transistors MT.

The memory cell transistor MT includes a control gate and a charge accumulation layer, and nonvolatilely retains data. The memory cell transistors MT0 to MT7 are connected in series between a source of the select transistor ST1 and a drain of the select transistor ST2. Gates of the select transistors ST1 and ST2 in the same block BLK are commonly connected to select gate lines SGD and SGS, respectively. Similarly, control gates of the memory cell transistors MT0 to MT7 in the same block BLK are commonly connected to word lines WL0 to WL7, respectively.

In the memory cell array 11, drains of the select transistors ST1 in the NAND strings NS on the same column are commonly connected to the bit line BL. Namely, the bit line BL commonly connects the NAND strings NS on the same column between the blocks BLK. Sources of the select transistors ST2 are commonly connected to a source line SL.

In the above constitution, a collection of 1-bit data retained by the memory cell transistors MT connected to the common word line WL is referred to as a "page". Accordingly, when 4-bit data is stored in the memory cell transistor MT, data corresponding to four pages is stored in a collection of memory cells connected to the word line WL.

In the present embodiment, the single memory cell transistor MT can retain 4-bit data. The 4-bit data are referred to as a lower bit, a middle bit, an upper bit, and a top bit in order from lower bits. A collection of lower bits retained by the memory cell transistors MT connected to the same word line WL is referred to as a "lower page", and a collection of middle bits is referred to as a "middle page", a collection of upper bits is referred to as an "upper page", and a collection of top bits is referred to as a "top page". Namely, in this example, four pages are assigned to the single word line WL, so that the block BLK including eight word lines WL has a capacity corresponding to 32 pages.

[1-1-4] Configuration of Sense Amplifier Module 17

Figure 3:
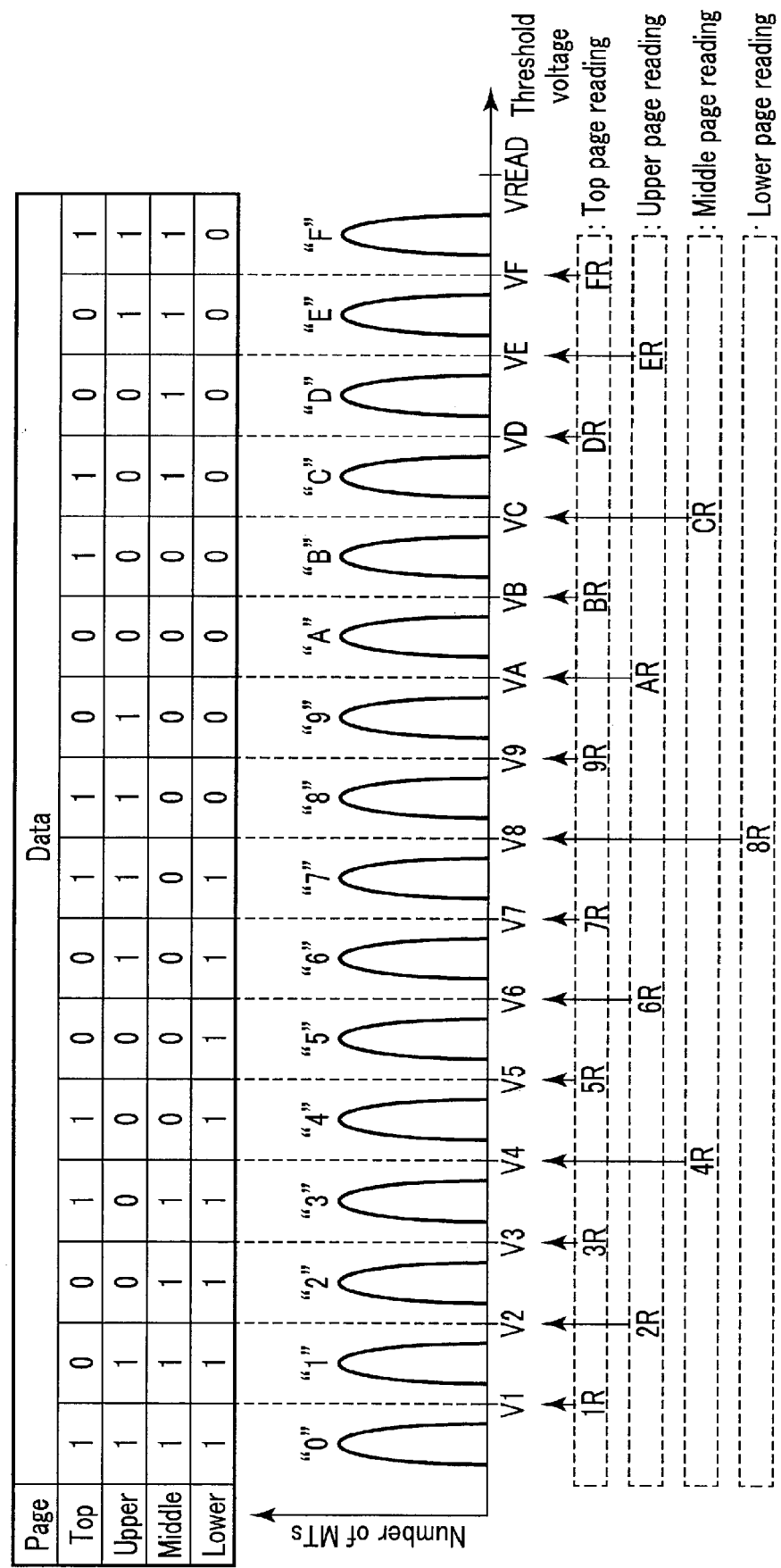
FIGS. 3 and 4 are views showing data, a threshold distribution, and a read level that can be taken by a memory cell according to the first embodiment.

Next, a configuration of the sense amplifier module 17 will be described continuously using FIG. 2. As shown in FIG. 3, the sense amplifier module 17 includes sense amplifier units SAU (SAU0 to SAU (m-1)) provided for each of the bit lines BL.

The sense amplifier units SAU each include a sense amplifier part SA, latch circuits ADL, BDL, CDL, DDL, and XDL, and an operation part OP. The sense amplifier part SA, the latch circuits ADL, BDL, CDL, DDL, and XDL, and the operation part OP are connected so as to be able to transmit and receive data to and from each other.

The sense amplifier part SA senses read data on the corresponding bit line BL during a read operation, and determines whether the read data is "0" or "1". Further, the sense amplifier part SA applies a voltage to the bit line BL during a write operation, based on write data.

The latch circuits ADL, BDL, CDL, and DDL temporarily retain read data and write data. The read data determined by the sense amplifier part SA during the read operation and the write data transferred to the latch circuit XDL during the write operation are transferred to any of the latch circuits ADL, BDL, CDL, and DDL, for example.

The operation part OP performs various operations, such as logical sum (OR) operation, logical product (AND)

operation, and exclusive logical sum (XOR) operation, with respect to data retained in the latch circuits ADL, BDL, CDL, and DDL.

The latch circuit XDL is used in input and output of data between the sense amplifier SAU and the controller 20. For example, the data received from the controller 20 is transferred to the latch circuit ADL, BDL, CDL, or DDL or the sense amplifier part SA through the latch circuit XDL. Similarly, data retained by the latch circuit ADL, BDL, CDL, or DDL or the sense amplifier part SA is transferred to the controller 20 through the latch circuit XDL.

The latch circuit XDL functions as a cache memory of the semiconductor storage device 10. For example, even if the latch circuits ADL, BDL, CDL, and DDL are being used, the semiconductor storage device 10 can be held in the ready state if the latch circuit XDL is not used.

The configuration of the sense amplifier module 17 is not limited thereto and may be variously changed. For example, the sense amplifier unit SAU may be provided with six or more latch circuits.

[1-1-5] Threshold Distribution of Memory Cell Transistor MT

Next, a threshold distribution of the memory cell transistor MT will be described using FIG. 3. FIG. 3 shows data, the threshold distribution, and a voltage used during a read operation that can be taken by each of the memory cell transistors MT.

As shown in FIG. 3, when the memory cell transistor MT retains 4 bit data, a distribution of a threshold voltage thereof is divided into 16 segments. The 16 threshold distributions are referred to as a "0" level, a "1" level, a "2" level, a "3" level, a "4" level, a "5" level, a "6" level, a "7" level, an "8" level, a "9" level, an "A" level, a "B" level, a "C" level, a "D" level, an "E" level, and an "F" level in the ascending order of threshold voltages.

Voltages V1, V2, V3, V4, V5, V6, V7, V8, V9, VA, VB, VC, VD, VE, and VF shown in FIG. 3 are used for verification of the "0" level, the "1" level, the "2" level, the "3" level, the "4" level, the "5" level, the "6" level, the "7" level, the "8" level, the "9" level, the "A" level, the "B" level, the "C" level, the "D" level, the "E" level, and the "F" level, respectively, during a write operation. A voltage VREAD is applied to a unselected word line during a read operation. When the voltage VREAD is applied to the gate of the memory cell transistor MT, the memory cell transistor MT is retained in an on state regardless of retained data. A relationship of those voltage values is V1<V2<V3<V4<V5<V6<V7<V8<V9<VA<VB<VC<VD<VE<VF<VREAD.

The "0" level of the above threshold distributions corresponds to an erase state of the memory cell transistor MT. A threshold voltage at the "0" level is less than the voltage V1. A threshold voltage at the "1" level is not less than the voltage V1 and less than the voltage V2. A threshold voltage at the "2" level is not less than the voltage V2 and less than the voltage V3. A threshold voltage at the "3" level is not less than the voltage V3 and less than the voltage V4. A threshold voltage at the "4" level is not less than the voltage V4 and less than the voltage V5. A threshold voltage at the "5" level is not less than the voltage V5 and less than the voltage V6. A threshold voltage at the "6" level is not less than the voltage V6 and less than the voltage V7. A threshold voltage at the "7" level is not less than the voltage V7 and less than the voltage V8. A threshold voltage at the "8" level is not less than the voltage V8 and less than the voltage V9. A threshold voltage at the "9" level is not less than the voltage V9 and less than the voltage VA. A threshold voltage at the "A" level is not less than the voltage VA and less than the voltage VB. A threshold voltage at the "B" level is not less than the voltage VB and less than the voltage VC. A threshold voltage at the "C" level is not less than the voltage VC and less than the voltage VD. A threshold voltage at the "D" level is not less than the voltage VD and less than the voltage VE. A threshold voltage at the "E" level is not less than the voltage VE and less than the voltage VF. A threshold voltage at the "F" level is not less than the voltage VE and less than the voltage VREAD.

In order to simplify the description, the read operation in this example will be described, taking as an example a case where a verify voltage is used as a read voltage. Hereinafter, read operations using the voltages V1, V2, V3, V4, V5, V6, V7, V8, V9, VA, VB, VC, VD, VE, and VF are referred to as read operations 1R, 2R, 3R, 4R, 5R, 6R, 7R, 8R, 9R, AR, BR, CR, DR, ER, and FR, respectively. The read operation 1R determines whether or not the threshold voltage of the memory cell transistor MT is less than the voltage V1. The read operation 2R determines whether or not the threshold voltage of the memory cell transistor MT is less than the voltage V2. The read operation 3R determines whether or not the threshold voltage of the memory cell transistor MT is less than the voltage V3. The same applies hereinafter.

The above 16 threshold distributions are formed by writing 4-bit (4-page) data constituted of a lower bit, an middle bit, a upper bit, and a top bit. The 16 threshold distributions correspond to 4 bit data items being different from each other. In the present embodiment, as is shown below, data is assigned to the memory cell transistor MT included at each level.

The memory cell transistor MT included at the "0" level retains "1111" ("lower bit/middle bit/upper bit/top bit") data. The memory cell transistor MT included at the "1" level retains "1110" data. The memory cell transistor MT included at the "2" level retains "1100" data. The memory cell transistor MT included at the "3" level retains "1101" data. The memory cell transistor MT included at the "4" level retains "1001" data. The memory cell transistor MT included at the "5" level retains "1000" data. The memory cell transistor MT included at the "6" level retains "1010" data. The memory cell transistor MT included at the "7" level retains "1011" data. The memory cell transistor MT included at the "8" level retains "0011" data. The memory cell transistor MT included at the "9" level retains "0010" data. The memory cell transistor MT included at the "A" level retains "0000" data. The memory cell transistor MT included at the "B" level retains "0001" data. The memory cell transistor MT included at the "C" level retains "0101" data. The memory cell transistor MT included at the "D" level retains "0100" data. The memory cell transistor MT included at the "E" level retains "0110" data. The memory cell transistor MT included at the "F" level retains "0111" data.

In order to determine a value of each bit in a read operation, the sense amplifier module 17 is required to check a voltage at a boundary at which a value changes in each bit. In the above data assignment, the lower bit is determined by the read operation 8R. The middle bit is determined by the read operations 4R and CR. The upper bit is determined by the read operations 2R, 6R, AR, and ER. The top bit is determined by the read operations 1R, 3R, 5R, 7R, 9R, BR, DR, and FR. Namely, the lower bit, the middle bit, the upper bit, and the top bit are determined by one read operation, two read operations, four read operations, and eight read operations, respectively. Hereinafter, such data assignment is referred to as "1-2-4-8 code".

Figure 4:
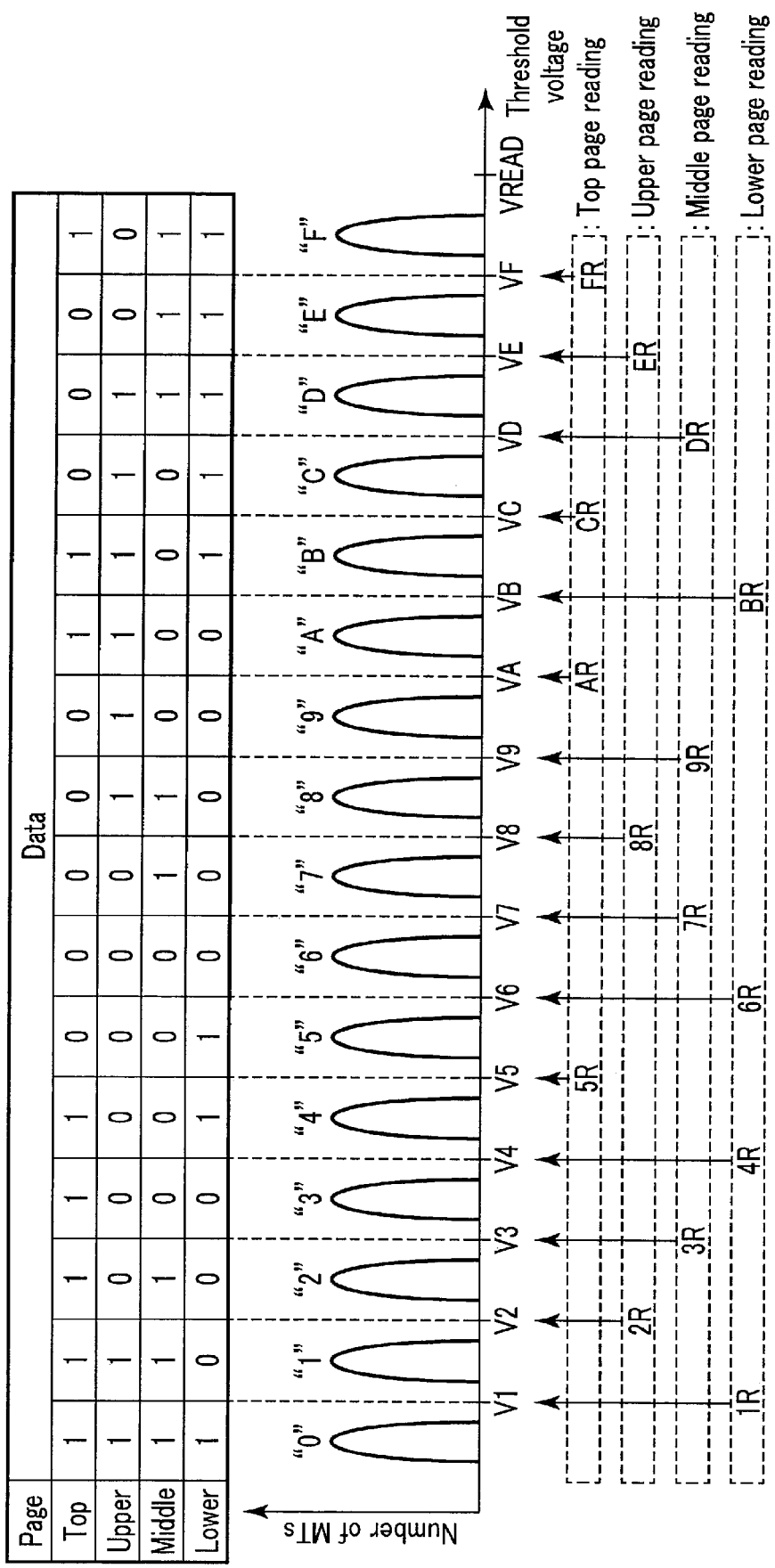

In the present embodiment, data assignment as shown in FIG. 4 is used, for example. In the example shown in FIG. 4, as is shown below, data is assigned to the memory cell transistor MT included at each level.

The memory cell transistor MT included at the "0" level retains "1111" data. The memory cell transistor MT included at the "1" level retains "0111" data. The memory cell transistor MT included at the "2" level retains "0101" data. The memory cell transistor MT included at the "3" level retains "0001" data. The memory cell transistor MT included at the "4" level retains "1001" data. The memory cell transistor MT included at the "5" level retains "1000" data. The memory cell transistor MT included at the "6" level retains "0000" data. The memory cell transistor MT included at the "7" level retains "0100" data. The memory cell transistor MT included at the "8" level retains "0110" data. The memory cell transistor MT included at the "9" level retains "0010" data. The memory cell transistor MT included at the "A" level retains "0011" data. The memory cell transistor MT included at the "B" level retains "1011" data. The memory cell transistor MT included at the "C" level retains "1010" data. The memory cell transistor MT included at the "D" level retains "1110" data. The memory cell transistor MT included at the "E" level retains "1100" data. The memory cell transistor MT included at the "F" level retains "1101" data.

When data thus assigned is read, the lower bit is determined by the read operations 1R, 4R, 6R, and BR. The middle bit is determined by the read operations 3R, 7R, 9R, and DR. The upper bit is determined by the read operations 2R, 8R, and ER. The top bit is determined by the read operations 5R, AR, CR, and FR. Namely, the lower bit, the middle bit, the upper bit, and the top bit are determined by four read operations, four read operations, three read operations, and four read operations, respectively. Hereinafter, this data assignment is referred to as a "4-4-3-4 code".

[1-2] Operation

Next, a write operation and a read operation in the memory system 1 will be described.

[1-2-1] Write Operation of Memory System 1

<Regarding Flow of Write Operation>

Next, the write operation in the memory system 1 will be described. In the write operation in the memory system 1 according to the present embodiment, the controller 20 applies various types of data processing to 4 pages of data received from the host apparatus 30, and this data is divided twice to be transferred to the semiconductor storage device 10 every two pages. The semiconductor storage device 10 then writes data of every two bits in the memory cell transistors MT, sharing the word line WL, by two write operations.

Figure 6:
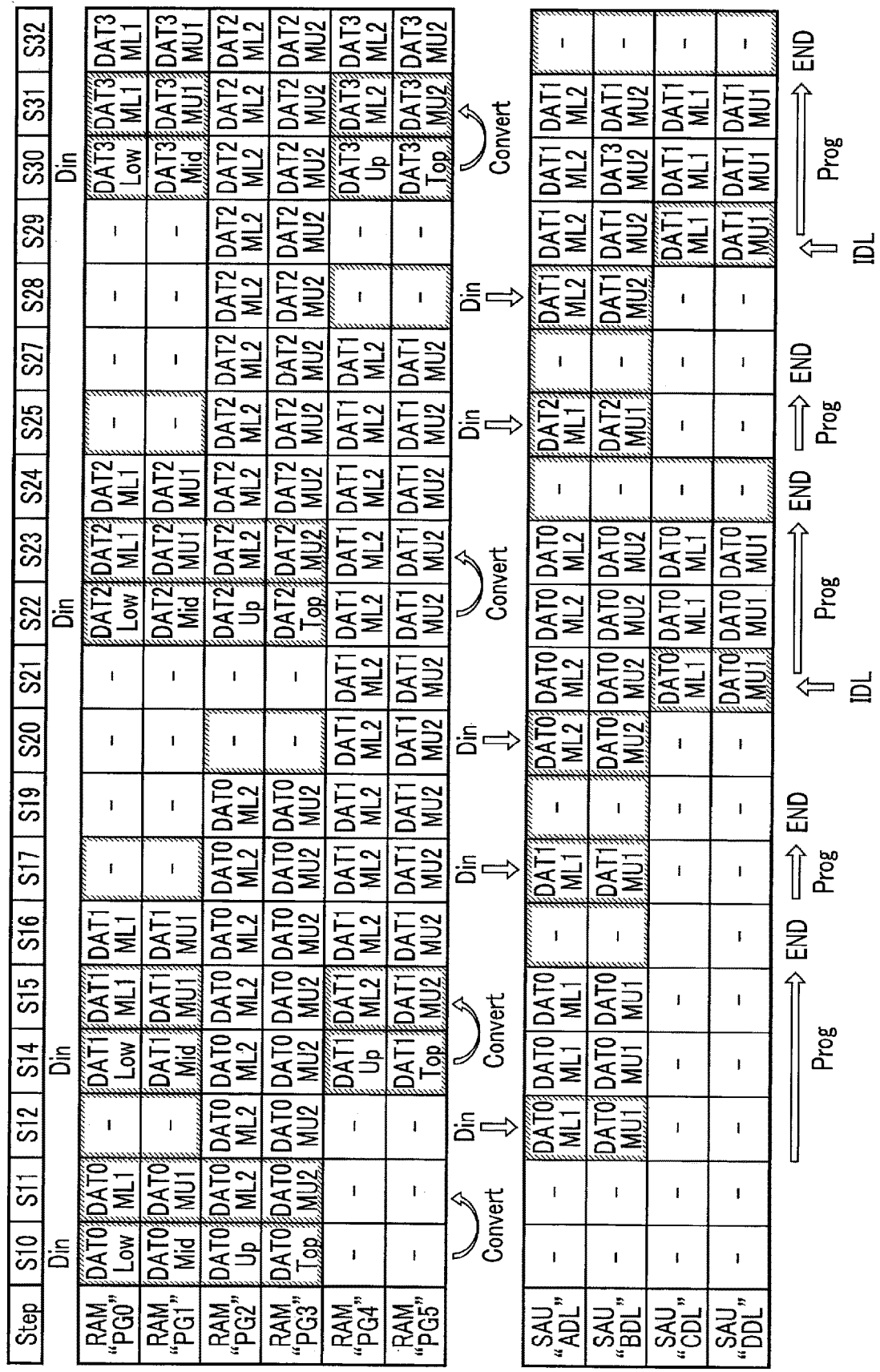
FIG. 6 is a schematic view showing data held by a controller and a sense amplifier in each step during the write operation in the memory system according to the first embodiment.

Hereinafter, the details of the write operation in the memory system 1 will be described using FIGS. 5 and 6. FIG. 5 shows a flow chart of the write operation in the memory system 1, and FIG. 6 shows an example of data retained by the RAM 22 and the sense amplifier unit SAU in each step shown in FIG. 5.

(Step S10)

First, the host apparatus 30 transmits write data to the controller 20. The controller 20 stores the received write data in the buffer memory 24. When the write data stored in the buffer memory 24 reaches four pages, the CPU 23 stores write data DAT0 of the four pages in each region PG of the RAM 22 in the unit of a page. For example, as shown in FIG. 6, lower page data of the data DAT0 is retained in the region PG0, middle page data of the data DAT0 is retained in the region PG1, upper page data of the data DAT0 is retained in the region PG2, and top page data of the data DAT0 is retained in the region PG3.

(Step S11)

Next, the controller 20 applies data processing to the 4 page data DAT0 retained in the RAM 22. FIG. 7 shows the details of the data processing. FIG. 7 shows a flow chart of the data processing executed by the controller 20 in the write operation.

As shown in FIG. 7, the CPU 23 first randomizes the 4 page data DAT, retained by the RAM 22, for each page (step S40). At this time, the 4-4-3-4 code, for example, is applied to the randomized data. Then, the ECC circuit 25 gives parity for each page to the 4 page data DAT retained by the RAM 22 (step S41). Then, the CPU 23 applies code conversion to the 4 page data DAT retained by the RAM 22 (step S42).

FIG. 8 shows the details of the code conversion in step S42. As shown in FIG. 8, in the present embodiment, code conversion from a 4-4-3-4 code to the 1-2-4-8 code is executed. In the present embodiment, the lower page data after code conversion is referred to as first lower page data ML1, the middle page data after code conversion is referred to as first upper page data MU1, the upper page data after code conversion is referred to as second lower page data ML2, and the top page data after code conversion is referred to as second upper page data MU2.

As shown in FIG. 6, the first lower page data ML1 of the data DAT0 is retained in the region PG0, the first upper page data MU1 of the data DAT0 is retained in the region PG1, the second lower page data ML2 of the data DAT0 is retained in the region PG2, and the second upper page data MU2 of the data DAT0 is retained in the region PG3.

(Step S12)

Next, the controller 20 issues a first command set and transmits the first command set to the semiconductor storage device 10. The first command set includes a command instructing writing, the address information ADD specifying the word line WL0, and the 2 page data DAT0. The 2 page data DAT0 of a command set received by the semiconductor storage device 10 is transferred to the latch circuit of the sense amplifier unit SAU. Specifically, as shown in FIG. 6, the data items retained in the regions PG0 and PG1 of the RAM 22 are transferred respectively to the latch circuits ADL and BDL of the sense amplifier unit SAU. Then, the regions PG0 and PG1 of the RAM 22 are cleared when the retained data items are transferred. Here, "clear" corresponds to an operation in which data retained in a latch circuit is discarded.

(Step S13)

Figure 9:
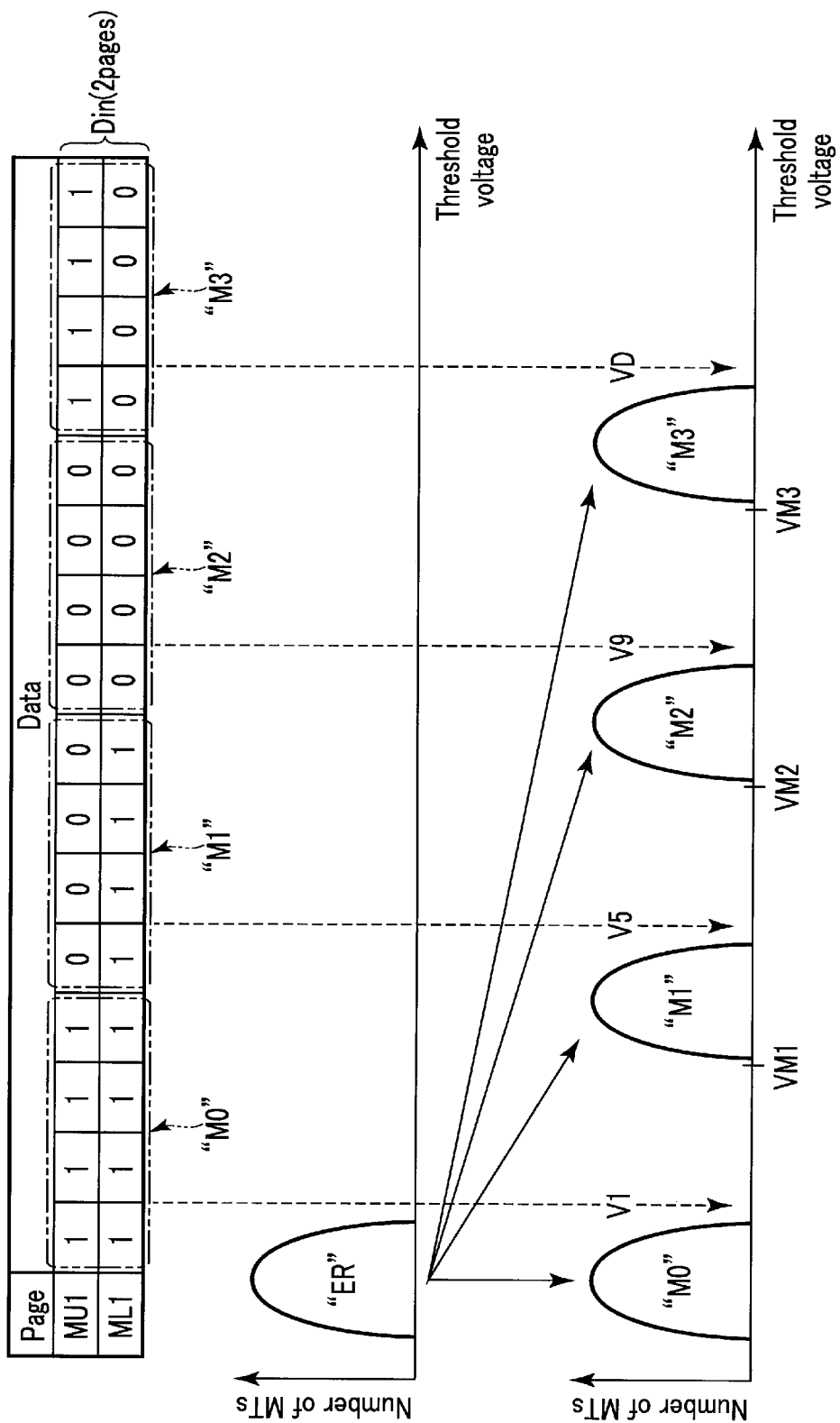
FIGS. 9 and 10 are views showing a change in threshold distribution in the write operation in the semiconductor storage device according to the first embodiment.

When the semiconductor storage device 10 receives the first command set from the controller 20, the semiconductor storage device 10 sets the ready/busy signal RBn to the "L" level and executes the first write operation in which the word line WL0 is selected. FIG. 9 shows an outline of the first write operation. FIG. 9 shows a change in threshold distribution of the memory cell according to the first write operation. As shown in FIG. 9, in the first write operation, the semiconductor storage device 10 executes a two-page write operation based on the first lower page data ML1 and the first upper page data MU1 input from the controller 20.

The threshold voltage of the memory cell transistor MT before execution of the first write operation is distributed at an "ER" level. The threshold voltage at the "ER" level is less than the voltage V1, and as in the above "0" level, the threshold voltage at the "ER" level corresponds to the erase state of the memory cell transistor MT.

In the first write operation, the sequencer 14 uses voltages VM1, VM2, and VM3 as verify voltages. The voltage VM1 is used when "10" ("lower bit/upper bit") data is written, and the voltage VM1 is not less than the voltage V1 and less than the voltage V5. The voltage VM2 is a verify voltage used when "00" data is written, and the voltage VM2 is not less than the voltage V5 and less than the voltage V9. The voltage VM3 is a verify voltage used when "01" data is written, and the voltage VM3 is not less than the voltage V9 and less than the voltage VD.

When the first write operation is executed, the threshold voltage of the memory cell transistor MT increases based on data to be written, and four threshold distributions are formed. An "M0" level shown in FIG. 9 is formed by the memory cell transistors MT in which "11" data is written. An "M1" level is formed by the memory cell transistors MT in which "10" data is written. An "M2" level is formed by the memory cell transistors MT in which "00" data is written. An "M3" level is formed by the memory cell transistors MT in which "01" data is written.

The threshold voltage at the "M0" level is less than the voltage V1, and as in the above "0" level and "ER" level, the threshold voltage at the "M0" level corresponds to the erase state of the memory cell transistor MT. Namely, in the first write operation, the increase in threshold voltage is suppressed in the memory cell transistor MT in which the "11" data is written. A threshold voltage at the "M1" level is not less than the voltage VM1 and less than the voltage V5. A threshold voltage at the "M2" level is not less than the voltage VM2 and less than the voltage V9. A threshold voltage at the "M3" level is not less than the voltage VM3 and less than the voltage VD.

As described above, the voltages VM1, VM2, and VM3 used in verification in the first write operation are set such that the threshold voltage of the memory cell transistor MT having passed verification does not exceed the voltages V5, V9 and VD, respectively.

(Step S14)

When the regions PG0 and PG1 of the RAM 22 are cleared while the semiconductor storage device 10 executes the first write operation in step S13, the CPU 23 transfers 4 page data DAT1, received from the host apparatus 30, from the buffer memory 24 to the RAM 22. For example, as shown in FIG. 6, lower page data of the data DAT1 is retained in the region PG0, middle page data of the data DAT1 is retained in the region PG1, upper page data of the data DAT1 is retained in the region PG4, and top page data of the data DAT1 is retained in the region PG5.

(Step S15)

Next, the controller 20 applies data processing as in step S11 to the 4 page data DAT1 retained in the RAM 22. When the data processing is executed, as shown in FIG. 6, the first lower page data ML1 of the data DAT1 is retained in the region PG0, the first upper page data MU1 of the data DAT1 is retained in the region PG1, the second lower page data ML2 of the data DAT1 is retained in the region PG4, and the second upper page data MU2 of the data DAT1 is retained in the region PG5.

(Step S16)

When the first write operation in step S13 is ended, the semiconductor storage device 10 sets the ready/busy signal RBn to the "H" level and notifies the controller 20 of the end of the write operation. Further, when the first write operation is ended, the latch circuit in the sense amplifier unit SAU is cleared as shown in FIG. 6.

(Step S17)

Next, the controller 20 issues the first command set and transmits the first command set to the semiconductor storage device 10. The first command set includes the address information ADD specifying a word line WL1 and the data DAT1 corresponding to two pages. The 2 page data DAT1 of a command set received by the semiconductor storage device 10 is transferred to the latch circuit of the sense amplifier unit SAU. Specifically, as shown in FIG. 6, the data items retained in the regions PG0 and PG1 of the RAM 22 are transferred respectively to the latch circuits ADL and BDL of the sense amplifier unit SAU. Then, the regions PG0 and PG1 of the RAM 22 are cleared when the retained data items are transferred.

(Step S18)

When the semiconductor storage device 10 receives the first command set from the controller 20, the semiconductor storage device 10 sets the ready/busy signal RBn to the "L" level and executes the first write operation in which the word line WL1 is selected. The first write operation is similar to step S13, whereby the 2 page data based on the first lower page data ML1 and the first upper page data MU1 of the data DAT1 is written in the memory cell transistor MT connected to the word line WL1.

(Step S19)

When the first write operation in step S18 is ended, the semiconductor storage device 10 sets the ready/busy signal RBn to the "H" level and notifies the controller 20 of the end of the write operation. Further, when the first write operation is ended, the latch circuit in the sense amplifier unit SAU is cleared as shown in FIG. 6.

(Step S20)

When the first write operation with respect to the word line WL0 and the first write operation with respect to the word line WL1 are ended, the controller 20 issues a second command set and transmits the second command set to the semiconductor storage device 10. The second command set includes a command instructing writing, the address information ADD specifying the word line WL0, and the 2 page data DAT0. The 2 page data DAT0 of a command set received by the semiconductor storage device 10 is transferred to the latch circuit of the sense amplifier unit SAU. Specifically, as shown in FIG. 6, the data items retained in the regions PG2 and PG3 of the RAM 22 are transferred respectively to the latch circuits ADL and BDL of the sense amplifier unit SAU. The regions PG2 and PG3 of the RAM 22 are cleared when the retained data items are transferred.

(Step S21)

Figure 10:
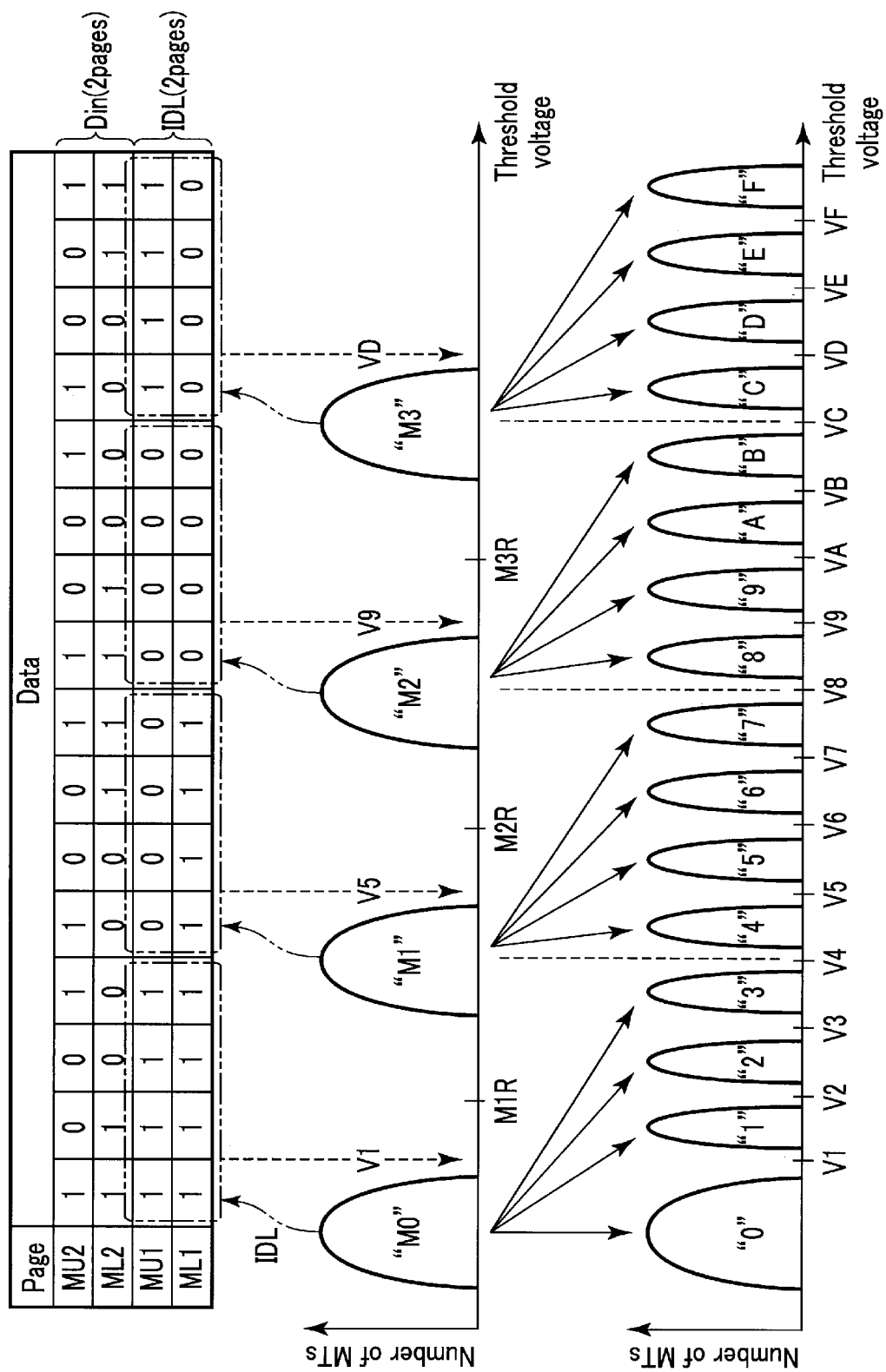

When the semiconductor storage device 10 receives the second command set from the controller 20, the semiconductor storage device 10 sets the ready/busy signal RBn to the "L" level and executes the second write operation in which the word line WL0 is selected. FIG. 10 shows an outline of the second write operation. FIG. 10 shows a change in threshold distribution of the memory cell according to the second write operation. As shown in FIG. 10, in the second write operation in the present embodiment, the semiconductor storage device 10 first executes internal data load (IDL).

IDL is an operation in which data stored in the memory cell transistor MT corresponding to the selected word line WL is read before a write voltage is applied. In the present embodiment, the sense amplifier module 17 executes read operation using voltages M1R, M2R, and M3R. The voltage M1R is not less than the voltage V1 and not more than the voltage VM1, and the sense amplifier part SA determines whether or not the threshold voltage of the memory cell transistor MT is less than the voltage M1R through the read operation using the voltage M1R. The voltage M2R is not less than the voltage V5 and not more than the voltage VM2, and the sense amplifier part SA determines whether or not the threshold voltage of the memory cell transistor MT is less than the voltage M2R through the read operation using the voltage M2R. The voltage M3R is not less than the voltage V9 and not more than the voltage VM3, and the sense amplifier part SA determines whether or not the threshold voltage of the memory cell transistor MT is less than the voltage M3R through the read operation using the voltage M3R.

Consequently, the "11" data, the "10" data, the "00" data, and the "01" data written by the first write operation are restored in the latch circuit in the sense amplifier module SAU. Specifically, as shown in FIG. 6, the first lower page data ML1 and the first upper page data MU1 of the data DAT0 are transferred to the latch circuits CDL and DDL, respectively.

The semiconductor storage device 10 executes a 4 page write operation based on the first lower page data ML1 and the first upper page data MU1 read by IDL and the second lower page data ML2 and the second upper page data MU2 input from the controller 20.

In the second write operation, the sequencer 14 uses the voltages V1, V2, V3, V4, V5, V6, V7, V8, V9, VA, VB, VC, VD, VE, and VF as verify voltages. When the second write operation is executed, the threshold voltage of the memory cell transistor MT increases based on data to be written, and 16 threshold distributions are formed from four levels. For example, the threshold distributions at the "0" level, the "1" level, the "2" level, and the "3" level are formed from the threshold distribution at "M0" level. The threshold distributions at the "4" level, the "5" level, the "6" level, and the "7" level are formed from the threshold distribution at "M1" level. The threshold distributions at the "8" level, the "9" level, the "A" level, and the "B" level are formed from the threshold distribution at "M2" level. The threshold distributions at the "C" level, the "D" level, the "E" level, and the "F" level are formed from the threshold distribution at "M3" level.

(Step S22)

When the regions PG2 and PG3 of the RAM 22 are cleared while the semiconductor storage device 10 executes the second write operation in step S21, the CPU 23 transfers 4 page data DAT2, received from the host apparatus 30, from the buffer memory 24 to the RAM 22. Then, for example, as shown in FIG. 6, lower page data of the data DAT2 is retained in the region PG0, middle page data of the data DAT2 is retained in the region PG1, upper page data of the data DAT2 is retained in the region PG2, and top page data of the data DAT2 is retained in the region PG3.

(Step S23)

Next, the controller 20 applies data processing as in step S11 to the 4 page data DAT2 retained in the RAM 22. When the data processing is executed, as shown in FIG. 6, the first lower page data ML1 of the data DAT2 is retained in the region PG0, the first upper page data MU1 of the data DAT2 is retained in the region PG1, the second lower page data ML2 of the data DAT2 is retained in the region PG2, and the second upper page data MU2 of the data DAT2 is retained in the region PG3.

(Step S24)

When the second write operation in step S21 is ended, the semiconductor storage device 10 sets the ready/busy signal RBn to the "H" level and notifies the controller 20 of the end of the write operation. Further, when the second write operation is ended, the latch circuit in the sense amplifier unit SAU is cleared as shown in FIG. 6.

(Step S25)

Next, the controller 20 issues the first command set and transmits the first command set to the semiconductor storage device 10. The first command set includes the address information ADD specifying a word line WL2 and the 2 page data DAT2. The 2 page data DAT2 of a command set received by the semiconductor storage device 10 is transferred to the latch circuit of the sense amplifier unit SAU. Specifically, as shown in FIG. 6, the data items retained in the regions PG0 and PG1 of the RAM 22 are transferred respectively to the latch circuits ADL and BDL of the sense amplifier unit SAU. Then, the regions PG0 and PG1 of the RAM 22 are cleared when the retained data items are transferred.

(Step S26)

When the semiconductor storage device 10 receives the first command set from the controller 20, the semiconductor storage device 10 sets the ready/busy signal RBn to the "L" level and executes the first write operation in which the word line WL2 is selected. The first write operation is similar to step S13, whereby the 2 bit data based on the first lower page data ML1 and the first upper page data MU1 of the data DAT2 is written in the memory cell transistor MT connected to the word line WL2.

(Step S27)

When the first write operation in step S26 is ended, the semiconductor storage device 10 sets the ready/busy signal RBn to the "H" level and notifies the controller 20 of the end of the write operation. Further, when the first write operation is ended, the latch circuit in the sense amplifier unit SAU is cleared as shown in FIG. 6.

(Step S28)

When the first write operation with respect to the word line WL1 and the first write operation with respect to the word line WL2 are ended, the controller 20 issues the second command set and transmits the second command set to the semiconductor storage device 10. The second command set includes the address information ADD specifying the word line WL1 and the 2 page data DAT1. The 2 page data DAT1 of a command set received by the semiconductor storage device 10 is transferred to the latch circuit of the sense amplifier unit SAU. Specifically, as shown in FIG. 6, the data items retained in the regions PG4 and PG5 of the RAM 22 are transferred respectively to the latch circuits ADL and BDL of the sense amplifier unit SAU. The regions PG4 and PG5 of the RAM 22 are cleared when the retained data items are transferred.

(Step S29)

When the semiconductor storage device 10 receives the second command set from the controller 20, the semiconductor storage device 10 sets the ready/busy signal RBn to the "L" level and executes the second write operation in which the word line WL1 is selected. The second write operation is similar to step S21, and, first, as shown in FIG. 6, the 2 page data stored in the word line WL1 by IDL is restored. The semiconductor storage device 10 executes a 4 page write operation based on the first lower page data ML1 and the first upper page data MU1 read by IDL and the second lower page data ML2 and the second upper page data MU2 input from the controller 20.

(Step S30)

When the regions PG4 and PG5 of the RAM 22 are cleared while the semiconductor storage device 10 executes the second write operation in step S29, the CPU 23 transfers 4 page data DAT3, received from the host apparatus 30, from the buffer memory 24 to the RAM 22. Then, for example, as shown in FIG. 6, lower page data of the data DAT2 is retained in the region PG0, middle page data of the data DAT2 is retained in the region PG1, upper page data of the data DAT2 is retained in the region PG4, and top page data of the data DAT2 is retained in the region PG5.

(Step S31)

Next, the controller 20 applies data processing as in step S11 to the 4 page data DAT3 retained in the RAM 22. When the data processing is executed, as shown in FIG. 6, the first lower page data ML1 of the data DAT3 is retained in the region PG0, the first upper page data MU1 of the data DAT3 is retained in the region PG1, the second lower page data ML2 of the data DAT3 is retained in the region PG4, and the second upper page data MU2 of the data DAT3 is retained in the region PG5.

(Step S32)

When the second write operation in step S31 is ended, the semiconductor storage device 10 sets the ready/busy signal RBn to the "H" level and notifies the controller 20 of the end of the write operation. Further, when the second write operation is ended, the latch circuit in the sense amplifier unit SAU is cleared as shown in FIG. 6.

In the subsequent operation, operation similar to steps S17 to S32 is repeated. When the second write operation corresponding to the last 4 page data is ended, the memory system 1 ends the write operation.

<Regarding Command Sequence>

Figure 12:
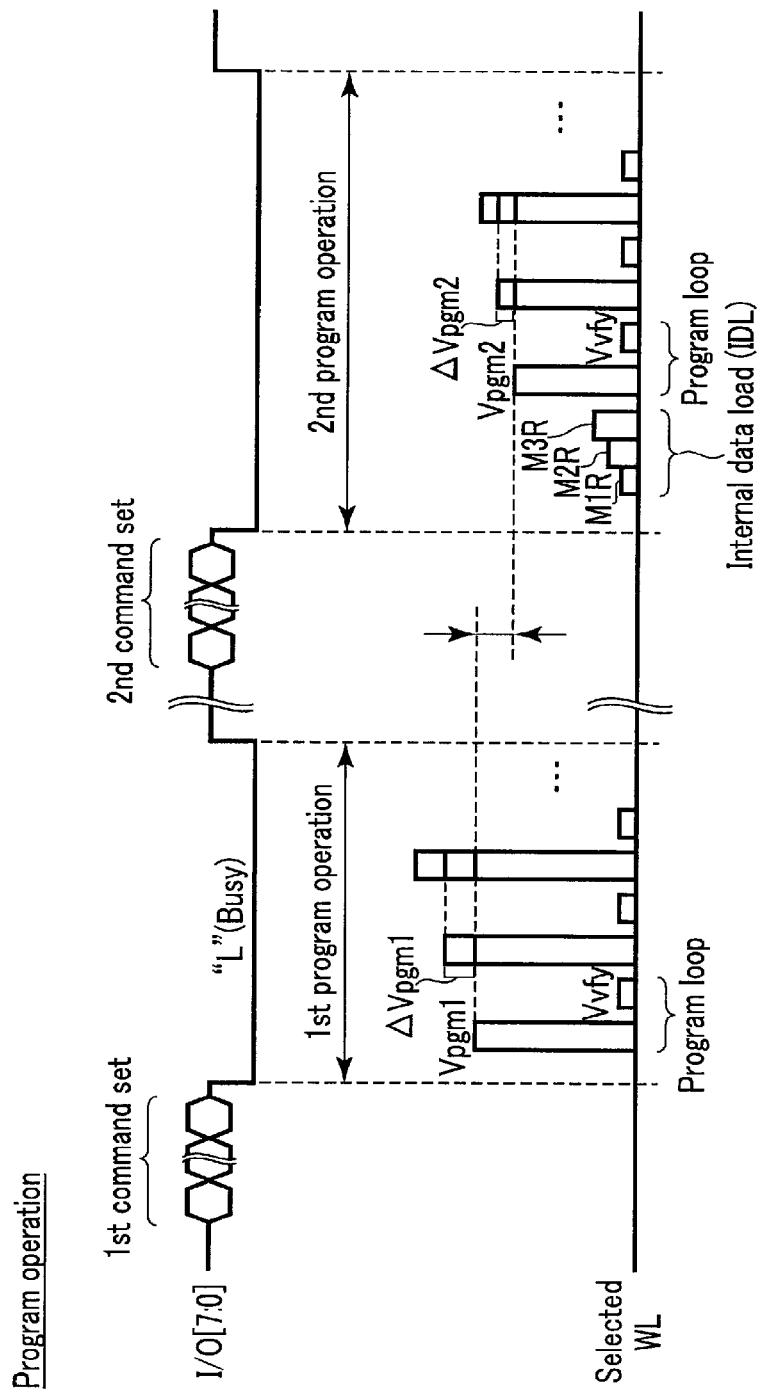
FIG. 12 is a command sequence and a waveform diagram of the write operation in the semiconductor storage device according to the first embodiment.

Next, the details of a command sequence and a waveform in the above write operation will be described using FIGS. 11 and 12. FIG. 11 shows a command sequence corresponding to FIG. 5 and shows the input/output signal I/O input to the semiconductor storage device 10. FIG. 12 shows waveforms of the first and second write operations and shows a voltage applied to the selected word line WL. In the following description, the command CMD input to the semiconductor storage device 10 is stored in the command register 12, the address information ADD is stored in the address register 13, and the data DAT is stored in the latch circuit shown in FIG. 7.

As shown in FIG. 11, in step S12, the controller 20 first issues a command "01h" and transmits the command "01h" to the semiconductor storage device 10. The command "01h" is a command showing that the data DAT to be subsequently received is write data on the first page. Next, the controller 20 issues a command "80h" and transmits the command "80h" to the semiconductor storage device 10. The command "80h" is a command instructing the semiconductor storage device 10 on the write operation. Then, the controller 20 continuously transmits the address information ADD, specifying the word line WL0, and the data DAT0, corresponding to the first lower page data ML1, to the semiconductor storage device 10. The semiconductor storage device 10 allows the received data DAT0 to be retained in the latch circuit XDL of the sense amplifier module 17. Next, the controller 20 issues a command "xyh" and transmits the command "xyh" to the semiconductor storage device 10. The command "xyh" is a command showing that information transmitted so far by the controller 20 corresponds to information corresponding to one page in a plural page write operation.

When the command "xyh" is stored in the command register 12, the sequencer 14 sets the ready/busy signal RBn to the "L" level and transfers the write data retained in the latch circuit XDL to, for example, the latch circuit ADL. The sequencer 14 sets the ready/busy signal RBn to the "H" level. This operation is described as "Dummy busy" in FIG. 11.

When the ready/busy signal RBn is set to the "H" level, the controller 20 issues a command "02h" and transmits the command "02h" to the semiconductor storage device 10. The command "02h" is a command showing that the data DAT to be subsequently received is write data on the second page. Then, the controller 20 continuously transmits the command "80h", the address information ADD specifying the word line WL0, and the data DAT0, corresponding to the first upper page data MU1, to the semiconductor storage device 10. The semiconductor storage device 10 allows the received data DAT0 to be retained in the latch circuit XDL of the sense amplifier module 17. Then, the controller 20 issues a command "10h" and transmits the command "10h" to the semiconductor storage device 10. The command "10h" is a command instructing the semiconductor storage device 10 to execute the write operation.

A group having from the above command "01h" to the command "10h" corresponds to the first command set. When the command "10h" is stored in the command register 12, the sequencer 14 sets the ready/busy signal RBn to the "L" level to transfer the write data retained in the latch circuit XDL to, for example, the latch circuit BDL, and thus to execute the first write operation (step S13). The illustrated tProg (MLC) corresponds to a processing period of the first write operation. FIG. 12 shows an example of a waveform in this first write operation.

As shown in FIG. 12, the row decoder 16 first applies a voltage Vpgm1 to the selected word line WL. A voltage Vpgm is a program voltage and is a high voltage capable of injecting electrons into a charge accumulation layer of the memory cell transistor MT. When the voltage Vpgm1 is applied to the selected word line WL, the threshold voltage of the memory cell transistor MT connected to the selected word line WL is increased by injection of electrons into the charge accumulation layer due to a potential difference between a gate and a channel. Among the memory cell transistors MT connected to the selected word line WL, in the memory cell transistor MT in which writing is inhibited, the corresponding sense amplifier unit SAU, for example, charges the bit line BL to reduce the potential difference between the gate and the channel, and thus to suppress the increase in threshold voltage. Then, the row decoder 16 applies a voltage Vvfy. The voltage Vvfy is a verify voltage and is, for example, the voltage VM1 shown in FIG. 9.

An operation of applying the above program voltage and the verify voltage corresponds to one program loop. Such a program loop is repeated while increasing a value of the program voltage by ΔVpgm1. The value of the voltage Vvfy applied in each program loop is changed to, for example, the voltage VM2 or VM3 according to the progress of the first write operation. A plurality of types of verify voltages may be used in one program loop. When the sequencer 14 has passed verification according to the voltage VM3, for example, the sequencer 14 ends the first write operation and sets the ready/busy signal RBn to the "H" level (step S16).

After that, in step S17, the controller 20 issues the first command set and transmits the first command set to the semiconductor storage device 10. As shown in FIG. 11, relative to the first command set in step S12, the first command set in step S17 is similar to a command set in which the address information ADD specifying the word line WL0 is replaced by the address information ADD specifying the word line WL1 and the page corresponding to the data DAT0 is replaced by the page corresponding to the data DAT1. Since the following similar command sets have similar configurations except that the address information ADD and the data DAT are different, the detailed description will be omitted. When the command "10h" included in the first command set is stored in the command register 12, the semiconductor storage device 10 executes the first write operation in which the word line WL1 is selected (step S18).

After that, in step S20, the controller 20 issues the command "03h" and transmits the command "03h" to the semiconductor storage device 10. The command "03h" is a command showing that the data DAT to be subsequently received is write data on the third page. Then, the controller 20 continuously transmits the command "80h", the address information ADD specifying the word line WL0, and the data DAT0, corresponding to the second lower page data ML2, to the semiconductor storage device 10. The semiconductor storage device 10 allows the received data DAT0 to be retained in the latch circuit XDL of the sense amplifier module 17. Next, the controller 20 issues the command "xyh" and transmits the command "xyh" to the semiconductor storage device 10. When the command "xyh" is stored in the command register 12, the sequencer 14 sets the ready/busy signal RBn to the "L" level and transfers the write data retained in the latch circuit XDL to, for example, the latch circuit ADL. The sequencer 14 sets the ready/busy signal RBn to the "H" level.

When the ready/busy signal RBn is set to the "H" level, the controller 20 issues a command "04h" and transmits the command "04h" to the semiconductor storage device 10. The command "04h" is a command showing that the data DAT to be subsequently received is write data on the fourth page. Then, the controller 20 continuously transmits the command "80h", the address information ADD specifying the word line WL0, and the data DAT0, corresponding to the second upper page data MU2, to the semiconductor storage device 10. The semiconductor storage device 10 allows the received data DAT0 to be retained in the latch circuit XDL of the sense amplifier module 17. Then, the controller 20 issues a command "10h" and transmits the command "10h" to the semiconductor storage device 10.

A group having from the above command "03h" to the command "10h" corresponds to the second command set. When the command "10h" is stored in the command register 12, the sequencer 14 sets the ready/busy signal RBn to the "L" level to transfer the write data retained in the latch circuit XDL to, for example, the latch circuit BDL, and thus to execute the second write operation (step S21). The illustrated tProg (QLC) corresponds to a processing period of the second write operation. FIG. 12 shows an example of a waveform in this second write operation.

As shown in FIG. 12, the row decoder 16 first sequentially applies the voltages M1R, M2R, and M3R to the selected word line WL. This operation corresponds to IDL, and the sense amplifier module 17 reads 2 page data stored in the memory cell transistor MT connected to the selected word line WL. The read 2 page data is retained in, for example, the latch circuits CDL and DDL. Subsequently, the sequencer 14 repeats a program loop based on 4 page data retained in the latch circuits ADL, BDL, CDL, and DDL. In the program loop in the second write operation, relative to the program loop in the first write operation, the value of the program voltage to be applied first, the value of the program voltage incremented for each program loop, and the verify voltage to be used are different.

Specifically, the value of the program voltage to be applied first is Vpgm2, and the value of the incremented program voltage is ΔVpgm2. Some of the voltages V1, V2, V3, V4, V5, V6, V7, V8, V9, VA, VB, VC, VD, VE, and VF as the verify voltages are selected and used in the ascending order of values. Vpgm2 is smaller than Vpgm1, and ΔVpgm2 is smaller than ΔVpgm1. As described above, the second write operation uses the program voltage and ΔVpgm smaller than those in the first write operation and finely controls the threshold voltage of the memory cell transistor MT. When the sequencer 14 has passed verification according to the voltage VF, for example, the sequencer 14 ends the second write operation and sets the ready/busy signal RBn to the "H" level (step S24). Since step S25 and subsequent operations shown in FIG. 11 are similar to the above operations, the description will be omitted.

[1-2-2] Read Operation of Memory System 1

Next, the read operation in the memory system 1 will be described. The read operation in the memory system 1 according to the present embodiment is executed in the unit of four pages. Namely, the controller 20 instructs the semiconductor storage device 10 to read data by four pages. The controller 20 then decodes read data transferred from the semiconductor storage device 10 and transmits the decoded data to the host apparatus 30.

Figure 13:
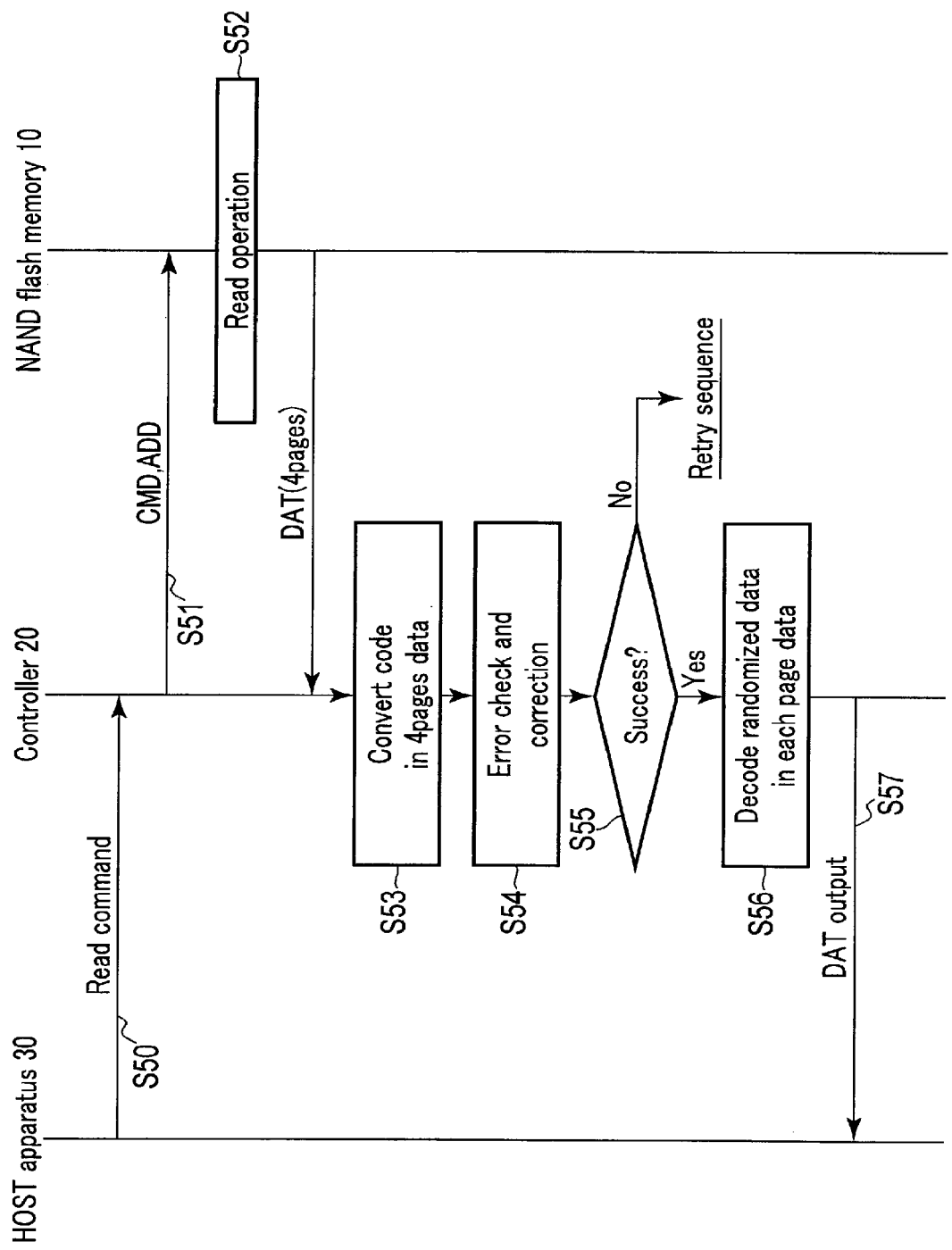
FIG. 13 is a flowchart of a read operation in the memory system according to the first embodiment.

Hereinafter, the details of the read operation in the memory system 1 will be described using FIG. 13. FIG. 13 shows a flowchart of the read operation in the memory system 1.

As shown in FIG. 13, the host apparatus 30 first instructs the controller 20 on the read operation for specified data (step S50). The controller 20 issues the command CMD and the address information ADD based on the received instruction and transmits the command CMD and the address information ADD to the semiconductor storage device 10 (step S51). The semiconductor storage device 10 then executes the read operation based on the received command CMD and address information ADD (step S52).

Figure 14:
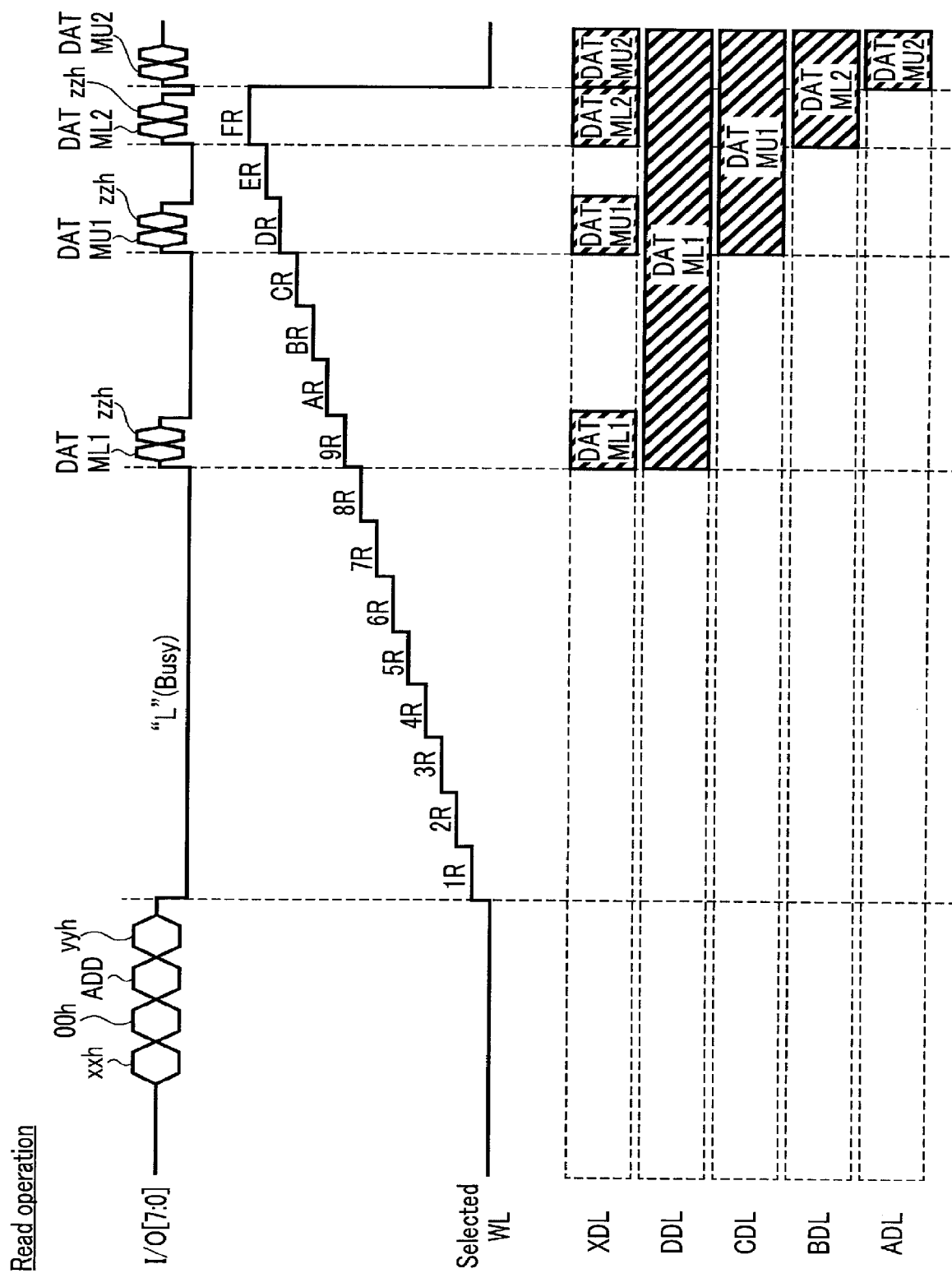
FIG. 14 is a view showing a waveform and a data output timing in the read operation in the semiconductor storage device according to the first embodiment.

FIG. 14 shows the details of a command sequence and the read operation in steps S51 and S52. FIG. 14 shows states of the input/output signal I/O input to the semiconductor storage device 10, a voltage applied to the selected word line WL, and the latch circuits ADL, BDL, CDL, and XDL.

As shown in FIG. 14, the controller 20 first issues a command "xxh" and transmits the command "xxh" to the semiconductor storage device 10. The command "xxh" is a prefix command instructing a plural page read operation with respect to the memory cell transistors MT connected to the common word line WL. Then, the controller 20 issues a command "ooh" and the address information ADD and sequentially transmits the command "00h" and the address information ADD to the semiconductor storage device 10. The command "00h" is a command instructing the semiconductor storage device 10 on the read operation. Subsequently, the controller 20 issues a command "yyh" and transmits the command "yyh" to the semiconductor storage device 10. The command "yyh" is a command instructing the semiconductor storage device 10 to execute the read operation. When the command "yyh" is stored in the command register 12, the sequencer 14 sets the ready/busy signal RBn to the "L" level and executes the read operation.

When the read operation is started, the row decoder 16 increases a voltage to be applied to the selected word line WL in order of V1, V2, V3, V4, V5, V6, V7, V8, V9, VA, VB, VC, VD, VE, and VF. The sense amplifier module 17 executes the read operations 1R, 2R, 3R, 4R, 5R, 6R, 7R, 8R, 9R, AR, BR, CR, DR, ER, and FR in a timing at which each voltage is applied.

In the present embodiment, since the data converted from the 4-4-3-4 code to the 1-2-4-8 code is read, the first lower page data ML1 is determined by the read operation 8R, the first upper page data MU1 is determined by the read operations 4R and CR, the second lower page data ML2 is determined by the read operations 2R, 6R, AR, and ER, and the second upper page data MU2 is determined by the read operations 1R, 3R, 5R, 7R, 9R, BR, DR, and FR. Hereinafter, the present invention will be described, taking as an example a case where the first lower page data ML1, the first upper page data MU1, the second lower page data ML2, and the second upper page data MU2 are assigned respectively to the latch circuits DDL, CDL, BDL, and ADL.

Since data read by the read operation 1R corresponds to the second upper page data MU2, this data is stored in the latch circuit ADL. Since data read by the read operation 2R corresponds to the second lower page data ML2, this data is stored in the latch circuit BDL. Since data read by the read operation 3R corresponds to the second upper page data MU2, this data and data already retained in the latch circuit ADL are subject to arithmetic processing of the operation part OP, and results thereof are stored in the latch circuit ADL. Since data read by the read operation 4R corresponds to the first upper page data MU1, this data is stored in the latch circuit CDL. Hereinafter, the read operation similarly progresses, and the arithmetic processing is executed if needed.

Once the read operation 8R is completed, the final first lower page data ML1 is stored in each of the latch circuits DDL, and the data is transferred to each of the latch circuits XDL. The sequencer 14 then sets the ready/busy signal RBn to the "H" level. The controller 20 responding to this toggles the signal RE and allows read data to be output from the latch circuit XDL to the controller 20. The controller 20 then issues a command "zzh" to transmit the command "zzh" to the semiconductor storage device 10, and thus to read the first upper page data MU1. When the command "zzh" is stored in the command register 12, the sequencer 14 sets the ready/busy signal RBn to the "L" level.

Similarly, once the read operation CR is completed, the final first upper page data MU1 is stored in each of the latch circuits CDL, once the read operation ER is completed, the final second lower page data ML2 is stored in the latch circuit BDL, and once the read operation FR is completed, the final second upper page data MU2 is stored in the latch circuit ADL. Those data items are sequentially transferred to the latch circuit XDL and output to the controller 20 by a method similar to the above data transfer of the first lower page data ML1. Then, the sequencer 14 maintains the ready/busy signal RBn at the "H" level after output of the finally determined second upper page data MU2.

As described above, the 4 page data is read from the semiconductor storage device 10, and the controller 20 allows the RAM 22 to retain the read 4 page data. Then, as shown in FIG. 13, the CPU 23 applies code conversion to the 4 page data DAT retained by the RAM 22 (step S53). The code conversion in step S53 is the reverse processing to the code conversion executed in the write operation. Specifically, code conversion from the 1-2-4-8 code to the 4-4-3-4 code is executed. Consequently, the read data is decoded into a state similar to the state before the code conversion in the write operation.

Next, the ECC circuit 25 applies error correction processing to the 4 page data DAT retained in the RAM 22. Specifically, an error of data is corrected for each page, based on parity given to each page (step S54). When the error correction is failed (No in step S55), the controller 20 executes a retry sequence. When data has passed the error correction (Yes in step S55), the controller 20 decodes data randomized for each page (step S56). Then, the controller 20 transmits this data to the host apparatus 30 (step S57), and the memory system 1 ends the read operation. If data of five or more pages is read, the controller 20 repeats the operations in steps S51 to S57.

[1-3] Effects of First Embodiment

The memory system 1 according to the present embodiment can improve reliability of written data. Hereinafter, the details of the effects of the first embodiment will be described.

In the semiconductor storage device, a memory cell is sometimes formed of a MONOS film, for example. It has been known that the memory cell using the MONOS film has the following characteristics. For example, when electrons are injected into a charge accumulation layer of the memory cell by a write operation, after end of the write operation, there occurs a phenomenon, called initial drop, in which a constant amount of electrons leave based on an amount of the injected electrons. Consequently, the threshold voltage of the memory cell drops, and a lower skirt of the threshold distribution of the memory cell extends. When the write operation of a memory cell adjacent to a memory cell in which data is written is executed, a parasitic capacitance between the memory cells changes upon an increase in the threshold voltage of the adjacent memory cell. Consequently, the threshold voltage of the memory cell in which data is already written rises, and an upper skirt of the threshold distribution of the memory cell extends. As described above, the threshold distribution of the memory cell sometimes deviates from a desired value due to the influence after data is written.

Thus, in a NAND type flash memory including a memory cell capable of retaining 4 bit data, the memory system 1 according to the present embodiment applies the 1-2-4-8 code as coding of data to be written. When the 1-2-4-8 code is used in data assignment, the semiconductor storage device 10 can form a lower page by writing of 1 bit data, can form lower and middle pages by writing of 2 bit data, and can form lower, middle, and upper pages by writing of 3 bit data. Namely, the semiconductor storage device 10 can write 4 bit data for each page.

In the memory system 1 according to the present embodiment, 4 page data is written in the memory cell while the write operation is divisionally performed twice. Specifically, the semiconductor storage device 10 writes two pages including the lower and middle bits in the first write operation (first write operation) and writes two pages including the upper and top bits in the subsequent second write operation (second write operation).

Further, in the memory system 1 according to the present embodiment, the first write operation with respect to the adjacent word line WL is executed between the first write operation and the second write operation. Specifically, for example when the first write operation with respect to the word line WL0 is executed, the first write operation with respect to the next adjacent word line WL1 is executed, and after that, the second write operation with respect to the word line WL0 is executed.

As described above, when the first write operation with respect to the word line WL1 is executed after the first write operation with respect to the word line WL0 is executed, while the first write operation with respect to the word line WL1 is executed, the initial drop occurs in the memory cell corresponding to the word line WL0. Upon the increase in the threshold voltage of the adjacent memory cell due to the first write operation with respect to the word line WL1, the memory cell corresponding to the word line WL0 is affected by a parasitic capacitance between the memory cells. Namely, the second write operation with respect to the word line WL0 is executed from the state affected by the initial drop occurring due to the first write operation with respect to the word line WL0 and the parasitic capacitance between memory cells occurring due to the first write operation with respect to the word line WL1, and therefore, in the threshold distribution to be finally obtained, these influences can be ignored.

Since the second write operation is a write operation with respect to the memory cell transistor MT whose threshold voltage rises to some extent due to the first write operation, a variation of the threshold voltage according to the second write operation is reduced. Namely, in the second write operation, since the amount of electrons injected into the charge accumulation layer is smaller than that in the case of writing data of four bits collectively, an initial drop amount of the threshold voltage of the memory cell transistor MT and the influence of the parasitic capacitance between adjacent memory cells can be reduced.

As described above, in the memory system 1 according to the present embodiment, the influence of the initial drop of the threshold voltage and the influence of the parasitic capacitance between memory cells can be reduced by executing the write operation in which the 4 page data is written divisionally twice. Accordingly, since the memory system 1 can suppress a spread of the threshold distribution in the memory cell in which data is written, reliability of the data can be improved.

In the write operation of the semiconductor storage device 10 in the present embodiment, data items of the lower and middle bits used in the second write operation are restored by being read from the memory cell by IDL. Namely, when 4 page data is written in the first and second write operations, the controller 20 transmits 2 page data to be used in the first write operation to the semiconductor storage device 10 and then can discard the data.

Consequently, the controller 20 can execute the above write operation if the capacitance of the RAM 22 is at least six pages. Namely, in the memory system 1 according to the present embodiment, since the capacity of the RAM 22 can be reduced, the circuit area of the controller 20 can be reduced.

In the write operation in the memory system 1 in the present embodiment, the controller 20 applies various data processings to write data received from the host apparatus 30. Specifically, the CPU 23 executes code conversion into the 4-4-3-4 code with respect to the write data received from the host apparatus 30, and the ECC circuit 25 gives parity to this data. Then, the CPU 23 executes code conversion from the 4-4-3-4 code into the 1-2-4-8 code with respect to the data to which parity is given, and the data subjected to the code conversion to the 1-2-4-8 code is written in the semiconductor storage device 10. In the read operation, reconversion from the 1-2-4-8 code to the 4-4-3-4 code is performed, and an error of data converted to the 4-4-3-4 code is corrected.

Consequently, the ECC circuit 25 can execute the error correction processing in such a state that data of the top page in which an error bit is most likely to occur during reading in the 1-2-4-8 code is dispersed in four pages. In other words, since the ECC circuit 25 executes the error correction processing after averaging the number of error bits between pages, the probability of success of error correction can be increased. Accordingly, the memory system 1 according to the present embodiment can improve the reliability of read data when writing data with the use of the 1-2-4-8 code.

In the above description, the case of using the NOMOS film in the memory cell has been described as an example, but the present invention is not limited to this case. For example, also in a case of using a memory cell using a floating gate, similar effects can be obtained by executing the write operation in the present embodiment.

In the second write operation described in the present embodiment, the voltages M1R, M2R, and M3R used in IDL may be different from the read voltages used in the read operation. For example, the voltages M1R, M2R, and M3R may be different from the voltages V1, V2, ..., and VF. Consequently, the voltages M1R, M2R, and M3R can be set to values optimized to the threshold distribution formed by the first write operation and can be suppressed by the number of error bits generated in IDL.

[2] Second Embodiment

Next, a memory system 1 according to a second embodiment will be described. The memory system 1 according to the present embodiment executes 3 page writing in a first write operation and executes 3 page IDL in a second write operation. Hereinafter, differences from the first embodiment will be described.

[2-1] Configuration of Memory System 1

First, a configuration of the memory system 1 will be described using FIG. 15. The memory system 1 according to the present embodiment differs from the memory system 1 according to the first embodiment in the capacity of the RAM 22 of the controller 20. Specifically, as shown in FIG. 15, the RAM 22 includes the regions PG0 to PG4 and is smaller by one page than the RAM 22 in the first embodiment. Other configurations are similar to those in FIG. 1 described in the first embodiment.

[2-2] Write Operation of Memory System 1

<Regarding Flow of Write Operation>

Next, a write operation in the memory system 1 will be described. In the write operation in the memory system 1 according to the present embodiment, the controller 20 applies various data processings to 4 page data received from a host apparatus 30, and this data is divided into three pages and one page to be transferred to a semiconductor storage device 10. The semiconductor storage device 10 then writes 3 bit data in memory cell transistors MT, sharing a word line WL, in the first write operation and writes 1 bit data in the memory cell transistors MT in the second write operation.

Figure 16:
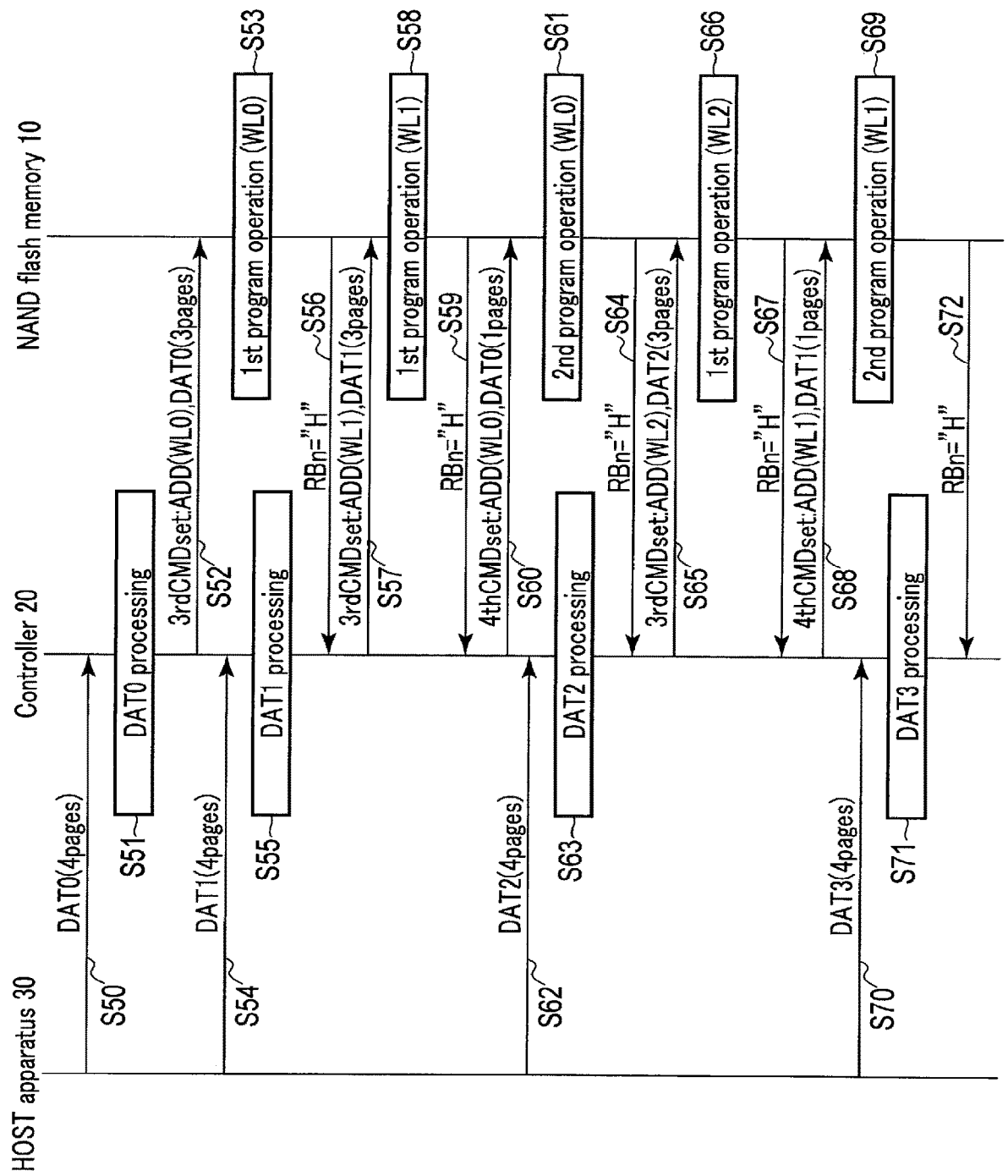
FIG. 16 is a flowchart of a write operation in the memory system according to the second embodiment.
Figure 17:
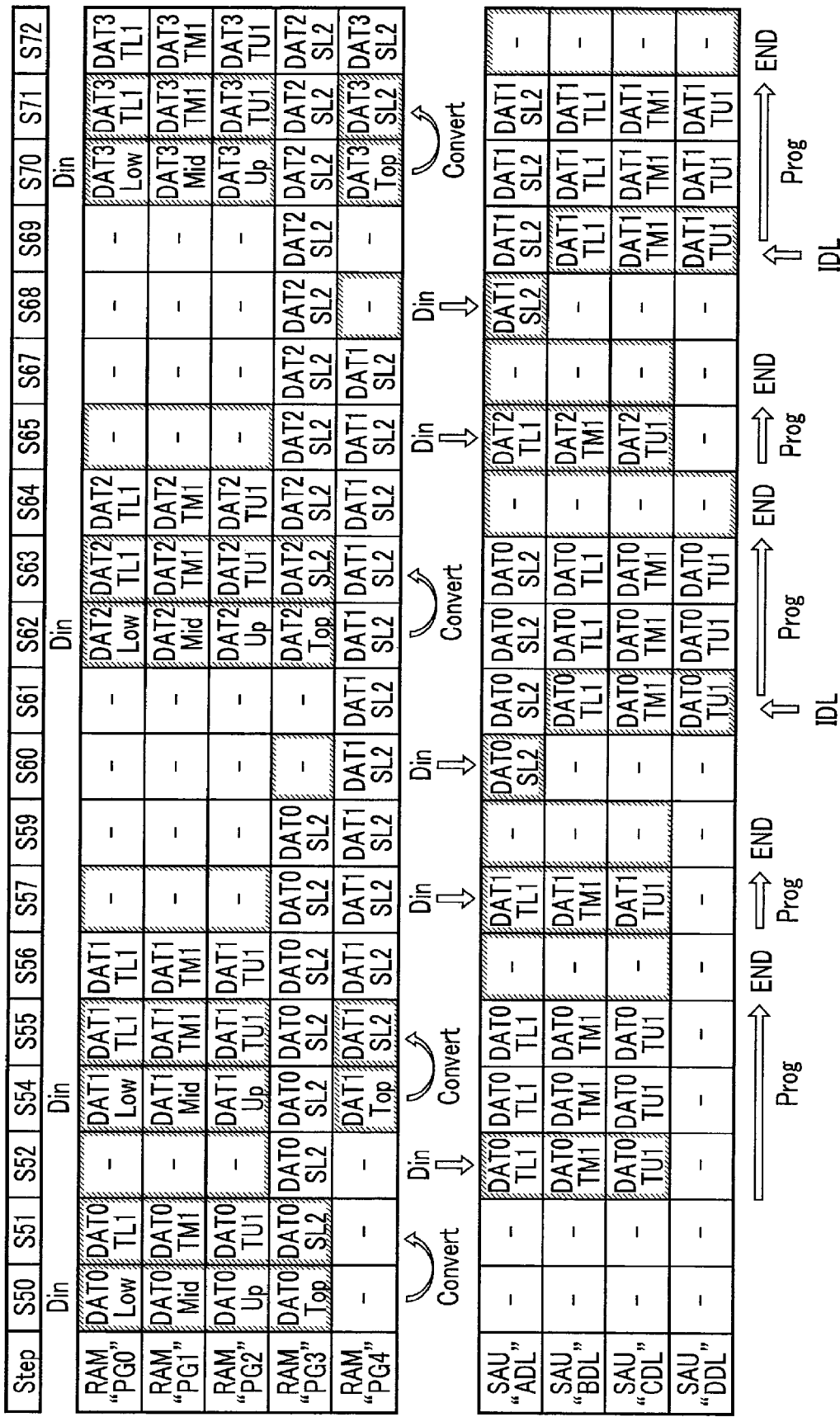
FIG. 17 is a schematic view showing data retained by a controller and a sense amplifier in each step during the write operation in the memory system according to the second embodiment.

Hereinafter, the details of the write operation in the memory system 1 will be described using FIGS. 16 and 17. FIG. 16 shows a flow chart of the write operation in the memory system 1, and FIG. 17 shows an example of data retained by the RAM 22 and a sense amplifier unit SAU in each step shown in FIG. 16.

(Step S50)

First, as in step S10 described in the first embodiment, the controller 20 stores 4 page write data DAT0, received from the host apparatus 30, in each region PG of the RAM 22 in the unit of a page. For example, as shown in FIG. 17, lower page data of the data DAT0 is retained in the region PG0, middle page data of the data DAT0 is retained in the region PG1, upper page data of the data DAT0 is retained in the region PG2, and top page data of the data DAT0 is retained in the region PG3.

(Step S51)

Next, the controller 20 applies data processing as in step S11, described in the first embodiment, to the 4 page data DAT0 retained in the RAM 22. In the data processing in the present embodiment, code conversion as shown in FIG. 18 is executed. In the code conversion shown in FIG. 18, compared to FIG. 8 described in the first embodiment, the name of data corresponding to each page after the code conversion is different.

As shown in FIG. 18, in the present embodiment, the lower page data after code conversion is referred to as first lower page data TL1, the middle page data after code conversion is referred to as first middle page data TM1, the upper page data after code conversion is referred to as first upper page data TU1, and the top page data after code conversion is referred to as second single page data SL2.

As shown in FIG. 17, the first lower page data TL1 of the data DAT0 is retained in the region PG0, the first middle page data TM1 of the data DAT0 is retained in the region PG1, the first upper page data TU1 of the data DAT0 is retained in the region PG2, and the second single page data SL2 of the data DAT0 is retained in the region PG3.

(Step S52)

Next, the controller 20 issues a third command set and transmits the third command set to the semiconductor storage device 10. The third command set includes a command instructing writing, address information ADD specifying the word line WL0, and the 3 page data DAT0. The 3 page data DAT0 of a command set received by the semiconductor storage device 10 is transferred to a latch circuit of the sense amplifier unit SAU. Specifically, as shown in FIG. 17, data items retained in the regions PG0, PG1, and PG2 of the RAM 22 are transferred to latch circuits ADL, BDL, and CDL of the sense amplifier unit SAU, respectively. Then, the regions PG0, PG1, and PG2 of the RAM 22 are cleared when the retained data items are transferred.

(Step S53)

Figure 19:
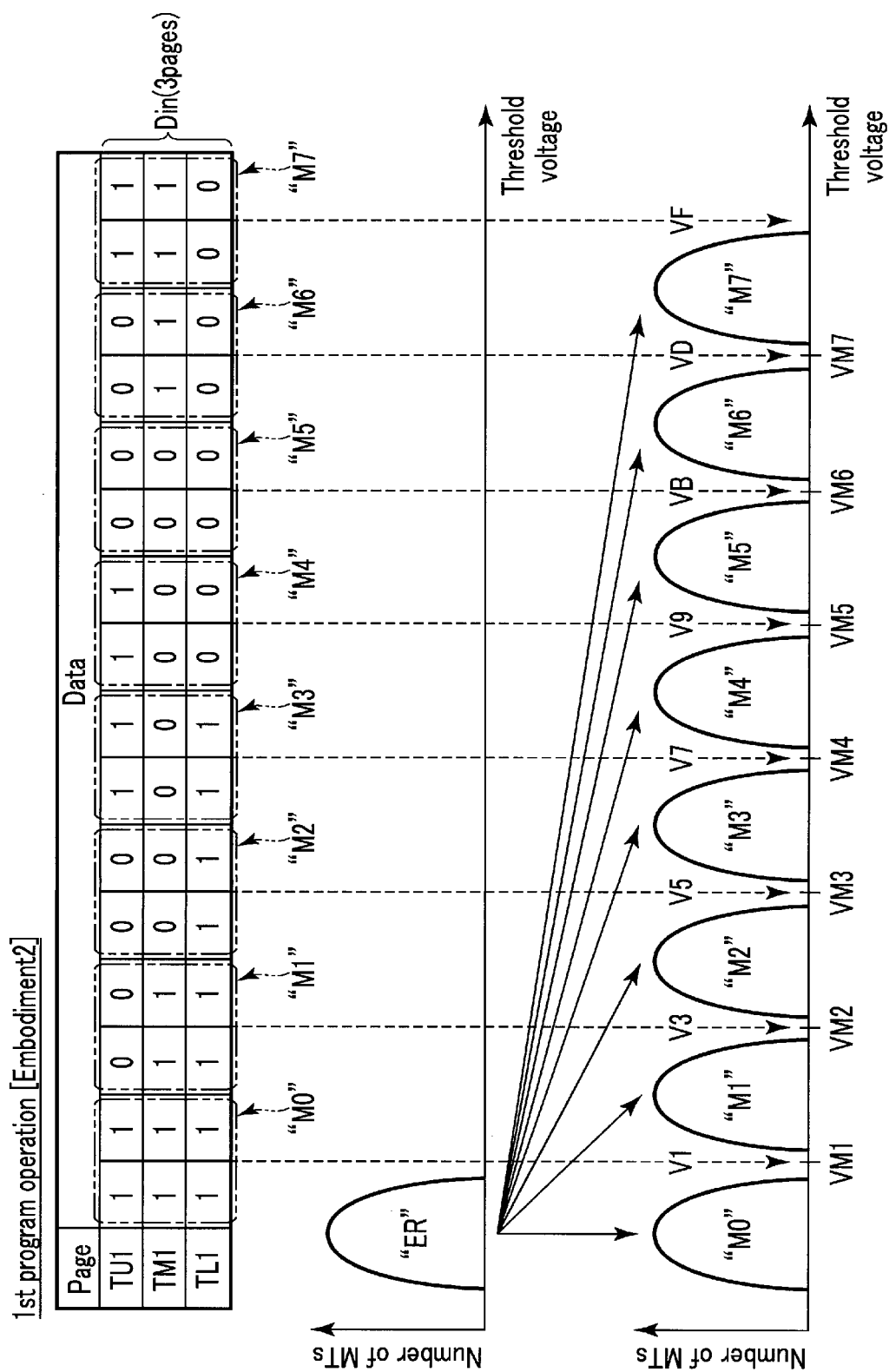

When the semiconductor storage device 10 receives the third command set from the controller 20, the semiconductor storage device 10 sets a ready/busy signal RBn to an "L" level and executes the first write operation in which the word line WL0 is selected. FIG. 19 shows an outline of the first write operation in the present embodiment. FIG. 19 shows a change in threshold distribution of a memory cell according to the first write operation. As shown in FIG. 19, in the first write operation, the semiconductor storage device 10 executes a 3 page write operation based on the first lower page data TL1, the first middle page data TM1, and the first upper page data TU1 input from the controller 20.

The threshold voltage of the memory cell transistor MT before execution of the first write operation is distributed at an "ER" level. In the first write operation, the sequencer 14 uses voltages VM1, VM2, VM3, VM4, VM5, VM6, and VM7 as verify voltages.

In the present embodiment, the voltage VM1 is used when "110" ("lower bit/middle bit/upper bit" after code conversion) data is written, and the voltage VM1 is not less than a voltage V1 and less than a voltage V3. The voltage VM2 is a verify voltage used when "100" data is written, and the voltage VM2 is not less than the voltage V3 and less than a voltage V5. The voltage VM3 is a verify voltage used when "101" data is written, and the voltage VM3 is not less than the voltage V5 and less than a voltage V7. The voltage VM4 is a verify voltage used when "001" data is written, and the voltage VM3 is not less than the voltage V7 and less than a voltage V9. The voltage VM5 is a verify voltage used when "000" data is written, and the voltage VM5 is not less than the voltage V9 and less than a voltage VB. The voltage VM6 is a verify voltage used when "010" data is written, and the voltage VM6 is not less than the voltage VB and less than a voltage VD. The voltage VM7 is a verify voltage used when "011" data is written, and the voltage VM7 is not less than the voltage VD and less than the voltage VF.

When the first write operation is executed, the threshold voltage of the memory cell transistor MT increases based on data to be written, and eight threshold distributions are formed. An "M0" level shown in FIG. 19 is formed by the memory cell transistors MT in which "111" data is written. An "M1" level is formed by the memory cell transistors MT in which "110" data is written. An "M2" level is formed by the memory cell transistors MT in which "100" data is written. An "M3" level is formed by the memory cell transistors MT in which "101" data is written. An "M4" level is formed by the memory cell transistors MT in which "001" data is written. An "M5" level is formed by the memory cell transistors MT in which "000" data is written. An "M6" level is formed by the memory cell transistors MT in which "010" data is written. An "M7" level is formed by the memory cell transistors MT in which "011" data is written.

An "M0" level is less than the voltage V1, and as in the first embodiment, the "M0" level corresponds to an erase state of the memory cell transistor MT. Namely, in the first write operation, the increase in threshold voltage is suppressed in the memory cell transistor MT in which the "111" data is written. A threshold voltage at the "M1" level is not less than the voltage VM1 and less than the voltage V3. A threshold voltage at the "M2" level is not less than the voltage VM2 and less than the voltage V5. A threshold voltage at the "M3" level is not less than the voltage VM3 and less than the voltage V7. The same applies hereinafter.

As described above, the voltages VM1, VM2, VM3, VM4, VM5, VM6, and VM7 used in verification in the first write operation are set such that the threshold voltage of the memory cell transistor MT having passed verification does not exceed the voltages V3, V5, V7, V9, VB, VD, and VF, respectively.

(Step S54)

When the regions PG0, PG1, and PG2 of the RAM 22 are cleared while the semiconductor storage device 10 executes the first write operation in step S53, the CPU 23 transfers 4 page data DAT1, received from the host apparatus 30, from a buffer memory 24 to the RAM 22. Then, for example, as shown in FIG. 17, lower page data of the data DAT1 is retained in the region PG0, middle page data of the data DAT1 is retained in the region PG1, upper page data of the data DAT1 is retained in the region PG2, and top page data of the data DAT1 is retained in the region PG4.

(Step S55)

Next, the controller 20 applies data processing as in step S51 to the 4 page data DAT1 retained in the RAM 22. When the data processing is executed, as shown in FIG. 17, the first lower page data TL1 of the data DAT1 is retained in the region PG0, the first middle page data TM1 of the data DAT1 is retained in the region PG1, the first upper page data TU1 of the data DAT1 is retained in the region PG2, and the second single page data SL2 of the data DAT1 is retained in the region PG4.

(Step S56)

When the first write operation in step S53 is ended, the semiconductor storage device 10 sets the ready/busy signal RBn to an "H" level and notifies the controller 20 of the end of the write operation. Further, when the first write operation is ended, the latch circuit in the sense amplifier unit SAU is cleared as shown in FIG. 17.

(Step S57)

Next, the controller 20 issues the third command set and transmits the third command set to the semiconductor storage device 10. The third command set includes the address information ADD specifying a word line WL1 and the data DAT1 corresponding to three pages. The 3 page data DAT1 of a command set received by the semiconductor storage device 10 is transferred to the latch circuit of the sense amplifier unit SAU. Specifically, as shown in FIG. 17, data items retained in the regions PG0, PG1, and PG2 of the RAM 22 are transferred to latch circuits ADL, BDL, and CDL of the sense amplifier unit SAU, respectively. Then, the regions PG0, PG1, and PG2 of the RAM 22 are cleared when the retained data items are transferred.

(Step S58)

When the semiconductor storage device 10 receives the third command set from the controller 20, the semiconductor storage device 10 sets the ready/busy signal RBn to the "L" level and executes the first write operation in which the word line WL1 is selected. The first write operation is similar to step S53, whereby the 3 page data based on the first lower page data TL1, the first middle page data TM1, and the first upper page data TU1 of the data DAT1 is written in the memory cell transistor MT connected to the word line WL1.

(Step S59)

When the first write operation in step S58 is ended, the semiconductor storage device 10 sets the ready/busy signal RBn to the "H" level and notifies the controller 20 of the end of the write operation. Further, when the first write operation is ended, the latch circuit in the sense amplifier unit SAU is cleared as shown in FIG. 17.

(Step S60)

When the first write operation with respect to the word line WL0 and the first write operation with respect to the word line WL1 are ended, the controller 20 issues a fourth command set and transmits the fourth command set to the semiconductor storage device 10. The fourth command set includes a command instructing writing, the address information ADD specifying the word line WL0, and the 1 page data DAT0. The 1 page data DAT0 of a command set received by the semiconductor storage device 10 is transferred to the latch circuit of the sense amplifier unit SAU. Specifically, as shown in FIG. 17, the data retained in the region PG3 of the RAM 22 is transferred to the latch circuit ADL of the sense amplifier unit SAU. The region PG3 of the RAM 22 is cleared when the retained data is transferred.

(Step S61)

When the semiconductor storage device 10 receives a second command set from the controller 20, the semiconductor storage device 10 sets the ready/busy signal RBn to the "L" level and executes the second write operation in which the word line WL0 is selected. FIG. 20 shows an outline of the second write operation in the present embodiment. FIG. 20 shows a change in threshold distribution of the memory cell according to the second write operation. As shown in FIG. 20, in the second write operation in the present embodiment, the semiconductor storage device 10 first executes internal data load (IDL).

In IDL in the present embodiment, the sense amplifier module 17 executes read operation using voltages M1R, M2R, M3R, M4R, M5R, M6R, and M7R. The voltage M1R is not less than the voltage V1 and not more than the voltage VM1, and a sense amplifier part SA determines whether or not the threshold voltage of the memory cell transistor MT is less than the voltage M1R through the read operation using the voltage M1R. The voltage M2R is not less than the voltage V3 and not more than the voltage VM2, and the sense amplifier part SA determines whether or not the threshold voltage of the memory cell transistor MT is less than the voltage M2R through the read operation using the voltage M2R. The voltage M3R is not less than the voltage V5 and not more than the voltage VM3, and the sense amplifier part SA determines whether or not the threshold voltage of the memory cell transistor MT is less than the voltage M3R through the read operation using the voltage M3R. The same applies hereinafter.

Consequently, the "111" data, the "110" data, the "100" data, the "101" data, the "001" data, the "000" data, the "010" data, and the "011" data written by the first write operation are restored in the latch circuit in the sense amplifier module SAU. Specifically, as shown in FIG. 17, the first lower page data TL1, the first middle page data TM1, and the first upper page data TU1 of the data DAT0 are transferred to the latch circuits BDL, CDL, and DDL.

The semiconductor storage device 10 executes 4 page write operation based on the first lower page data TL1, the first middle page data TM1, and the first upper page data TU1 read by IDL and the second single page data SL2 input from the controller 20.

In the second write operation, the sequencer 14 uses the voltages V1, V2, V3, V4, V5, V6, V7, V8, V9, VA, VB, VC, VD, VE, and VF as verify voltages, as in the first embodiment. When the second write operation is executed, the threshold voltage of the memory cell transistor MT rises based on data to be written, and 16 threshold distributions are formed from eight levels. For example, the threshold distributions at a "0" level and a "1" level are formed from the threshold distribution at the "M0" level. The threshold distributions at a "2" level and a "3" level are formed from the threshold distribution at the "M1" level. The threshold distributions at a "4" level and a "5" level are formed from the threshold distribution at the "M2" level. The threshold distributions at a "6" level and a "7" level are formed from the threshold distribution at the "M3" level. The same applies hereinafter.

(Step S62)

When the region PG3 of the RAM 22 is cleared while the semiconductor storage device 10 executes the second write operation in step S61, the CPU 23 transfers 4 page data DAT2, received from the host apparatus 30, from the buffer memory 24 to the RAM 22. Then, for example, as shown in FIG. 17, lower page data of the data DAT2 is retained in the region PG0, middle page data of the data DAT2 is retained in the region PG1, upper page data of the data DAT2 is retained in the region PG2, and top page data of the data DAT2 is retained in the region PG3.

(Step S63)

Next, the controller 20 executes data processing as in step S51 with respect to the 4 page data DAT2 retained in the RAM 22. When the data processing is executed, as shown in FIG. 17, the first lower page data TL1 of the data DAT2 is retained in the region PG0, the first middle page data TM1 of the data DAT2 is retained in the region PG1, the first upper page data TU1 of the data DAT2 is retained in the region PG2, and the second single page data SL2 of the data DAT2 is retained in the region PG3.

(Step S64)

When the second write operation in step S21 is ended, the semiconductor storage device 10 sets the ready/busy signal RBn to the "H" level and notifies the controller 20 of the end of the write operation. Further, when the second write operation is ended, the latch circuit in the sense amplifier unit SAU is cleared as shown in FIG. 17.
(Step S65)
Next, the controller 20 issues the third command set and transmits the third command set to the semiconductor storage device 10. The third command set includes the address information ADD specifying a word line WL2 and the 3 page data DAT2. The 3 page data DAT2 of a command set received by the semiconductor storage device 10 is transferred to the latch circuit of the sense amplifier unit SAU. Specifically, as shown in FIG. 17, data items retained in the regions PG0, PG1, and PG2 of the RAM 22 are transferred to latch circuits ADL, BDL, and CDL of the sense amplifier unit SAU, respectively. Then, the regions PG0, PG1, and PG2 of the RAM 22 are cleared when the retained data items are transferred.
(Step S66)
When the semiconductor storage device 10 receives the first command set from the controller 20, the semiconductor storage device 10 sets the ready/busy signal RBn to the "L" level and executes the first write operation in which the word line WL2 is selected. The first write operation is similar to step S53, whereby the 3 bit data based on the first lower page data TL1, the first middle page data TM1, and the first upper page data TU1 of the data DAT2 is written in the memory cell transistor MT connected to the word line WL2.
(Step S67)
When the first write operation in step S66 is ended, the semiconductor storage device 10 sets the ready/busy signal RBn to the "H" level and notifies the controller 20 of the end of the write operation. Further, when the first write operation is ended, the latch circuit in the sense amplifier unit SAU is cleared as shown in FIG. 17.
(Step S68)
When the first write operation with respect to the word line WL1 and the first write operation with respect to the word line WL2 are ended, the controller 20 issues the fourth command set and transmits the fourth command set to the semiconductor storage device 10. The fourth command set includes the address information ADD specifying the word line WL1 and the 1 page data DAT1. The 1 page data DAT1 of a command set received by the semiconductor storage device 10 is transferred to the latch circuit of the sense amplifier unit SAU. Specifically, as shown in FIG. 17, data retained in the region PG4 of the RAM 22 is transferred to the latch circuit ADL of the sense amplifier unit SAU. The region PG4 of the RAM 22 is cleared when the retained data is transferred.
(Step S69)
When the semiconductor storage device 10 receives the second command set from the controller 20, the semiconductor storage device 10 sets the ready/busy signal RBn to the "L" level and executes the second write operation in which the word line WL1 is selected. The second write operation is similar to step S61, and, first, as shown in FIG. 17, the 3 page data stored in the word line WL1 by IDL is restored. The semiconductor storage device 10 executes 4 page write operation based on the first lower page data TL1, the first middle page data TM1, and the first upper page data TU1 read by IDL and the second single page data SL2 input from the controller 20.
(Step S70)
When the region PG4 of the RAM 22 is cleared while the semiconductor storage device 10 executes the second write operation in step S69, the CPU 23 transfers 4 page data DAT3, received from the host apparatus 30, from the buffer memory 24 to the RAM 22. Then, for example, as shown in FIG. 17, the lower page data of the data DAT2 is retained in the region PG0, the middle page data of the data DAT2 is retained in the region PG1, the upper page data of the data DAT2 is retained in the region PG2, and the top page data of the data DAT2 is retained in the region PG4.
(Step S71)
Next, the controller 20 executes data processing as in step S51 with respect to the 4 page data DAT3 retained in the RAM 22. When the data processing is executed, as shown in FIG. 17, the first lower page data TL1 of the data DAT3 is retained in the region PG0, the first middle page data TM1 of the data DAT3 is retained in the region PG1, the first upper page data TU1 of the data DAT3 is retained in the region PG2, and the second single page data SL2 of the data DAT3 is retained in the region PG3.
(Step S72)
When the second write operation in step S31 is ended, the semiconductor storage device 10 sets the ready/busy signal RBn to the "H" level and notifies the controller 20 of the end of the write operation. Further, when the second write operation is ended, the latch circuit in the sense amplifier unit SAU is cleared as shown in FIG. 17.
In the subsequent operation, operation similar to steps S57 to S72 is repeated. When the second write operation corresponding to the last 4 page data is ended, the memory system 1 ends the write operation.

<Regarding Command Sequence>

Figure 21:
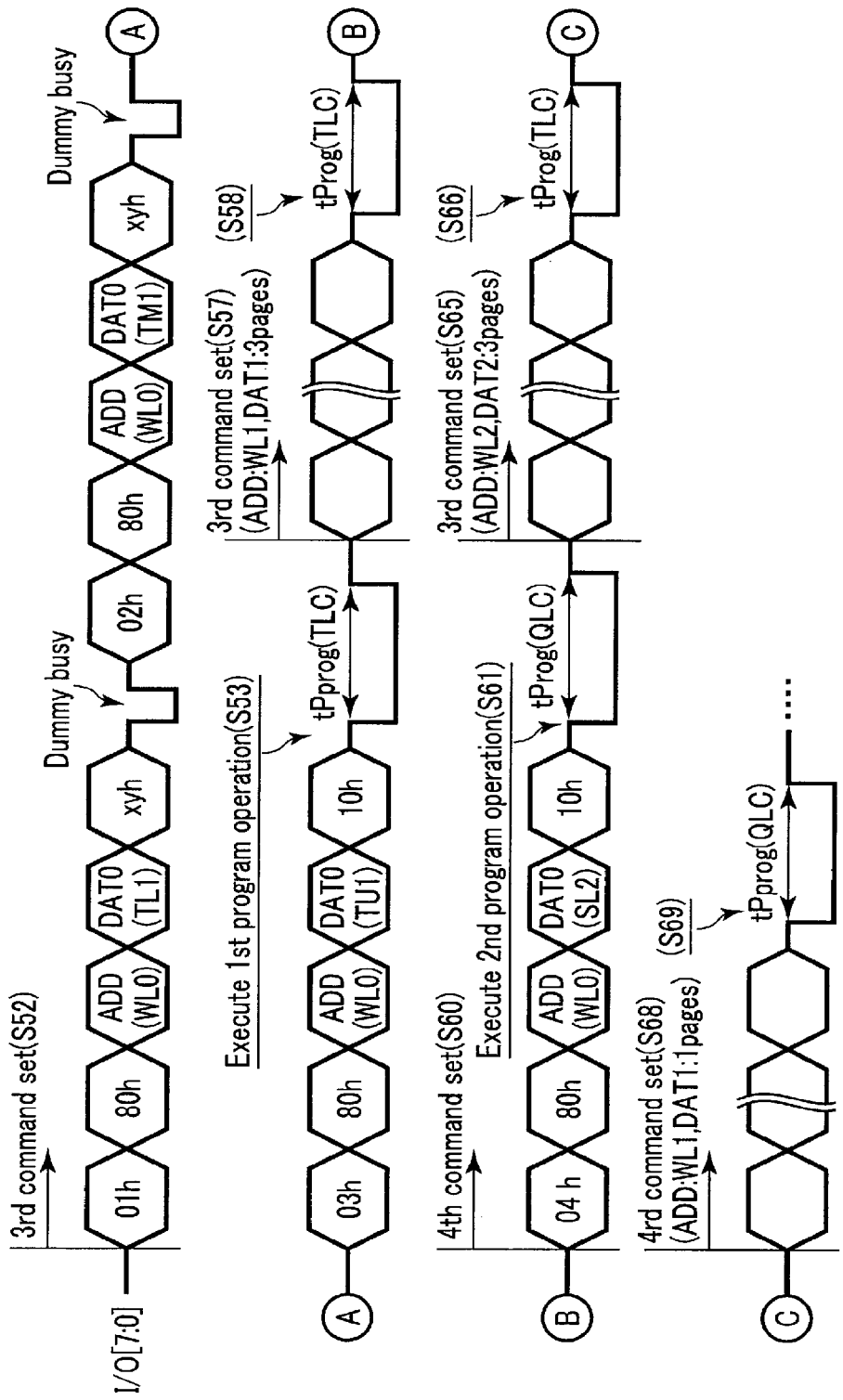
FIG. 21 is a command sequence of the write operation in the memory system according to the second embodiment.
Figure 22:
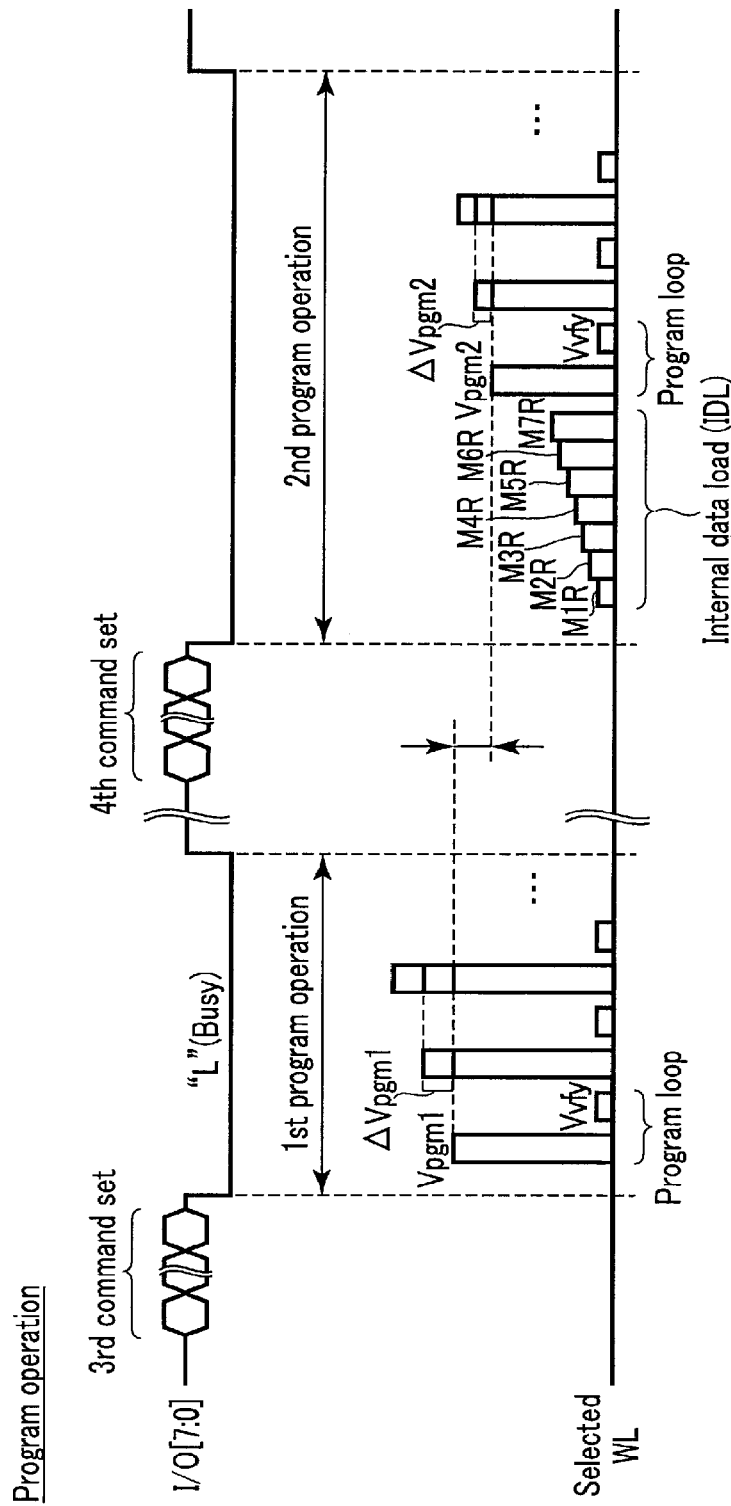
FIG. 22 is a waveform diagram of the write operation in the semiconductor storage device according to the second embodiment.

Next, the details of a command sequence and a waveform in the above write operation will be described using FIGS. 21 and 22. FIG. 21 shows a command sequence corresponding to FIG. 16 and shows an input/output signal I/O input to the semiconductor storage device 10. FIG. 22 shows waveforms of the first and second write operations and shows a voltage applied to the selected word line WL.

As shown in FIG. 21, in step S52, the controller 20 first sequentially transmits a command "01h", a command "80h", the address information ADD specifying the word line WL0, the data DAT0 corresponding to the first lower page data TL1, and a command "xyh" to the semiconductor storage device 10. When the command "xyh" is stored in a command register 12, a sequencer 14 sets the ready/busy signal RBn to the "L" level and transfers the write data retained in the latch circuit XDL to, for example, the latch circuit ADL.

When the ready/busy signal RBn is set to the "H" level, the controller 20 sequentially transmits a command "02h", the command "80h", the address information ADD specifying the word line WL0, the data DAT0 corresponding to the first middle page data TM1, and the command "xyh" to the semiconductor storage device 10. When the command "xyh" is stored in the command register 12, the sequencer 14 sets the ready/busy signal RBn to the "L" level and transfers the write data retained in the latch circuit XDL to, for example, the latch circuit BDL.

When the ready/busy signal RBn is set to the "H" level, the controller 20 sequentially transmits a command "03h", the command "80h", the address information ADD specifying the word line WL0, the data DAT0 corresponding to the first upper page data TU1, and a command "10h" to the semiconductor storage device 10.

A group having from the above command "01h" to the command "10h" corresponds to the third command set. When the command "10h" is stored in the command register 12, the sequencer 14 sets the ready/busy signal RBn to the "L" level to transfer the write data retained in the latch circuit XDL to, for example, the latch circuit CDL, and thus to execute the first write operation (step S53). The illustrated tProg (TLC) corresponds to a processing period of the first write operation. FIG. 22 shows an example of a waveform in this first write operation. As shown in FIG. 22, the waveform in the first write operation in the present embodiment is similar to the waveform in the first write operation shown in FIG. 12 described in the first embodiment.

After that, in step S57, the controller 20 issues the third command set including the address information ADD selecting the word line WL1 and the data DAT1 and transmits the third command set to the semiconductor storage device 10. When the command "10h" included in the third command set is stored in the command register 12, the semiconductor storage device 10 executes the first write operation in which the word line WL1 is selected (step S58).

After that, in step S60, the controller 20 sequentially transmits a command "04h", the command "80h", the address information ADD specifying the word line WL0, the data DAT0 corresponding to the second single page data SL2, and the command "10h" to the semiconductor storage device 10. A group having from the command "04h" to the command "10h" corresponds to the fourth command set. When the command "10h" is stored in the command register 12, the sequencer 14 sets the ready/busy signal RBn to the "L" level to transfer the write data retained in the latch circuit XDL to, for example, the latch circuit ADL, and thus to execute the second write operation (step S61). The illustrated tProg (QLC) corresponds to a processing period of the second write operation. FIG. 22 shows an example of a waveform in this second write operation.

As shown in FIG. 22, the row decoder 16 first sequentially applies the voltages M1R, M2R, M3R, M4R, M5R, M6R, and M7R to the selected word line WL. This operation corresponds to IDL, and the sense amplifier module 17 reads 3 page data stored in the memory cell transistor MT connected to the selected word line WL. The read 3 page data is retained in, for example, the latch circuits BDL, CDL, and DDL. Subsequently, the sequencer 14 repeats a program loop based on 4 page data retained in the latch circuits ADL, BDL, CDL, and DDL. The program loop in the second write operation is similar to the program loop in the second write operation described in the first embodiment with the use of FIG. 12. Also, since the program voltages in the first and second write operations and a magnitude relation of ΔVpgm are similar to those in the first embodiment, the description will be omitted.

When the sequencer 14 has passed verification according to the voltage VF, for example, the sequencer 14 ends the second write operation and sets the ready/busy signal RBn to the "H" level (step S64). Since step S65 and subsequent operations shown in FIG. 21 are similar to the above operations, the description will be omitted.

[2-3] Effects of Second Embodiment

According to the memory system 1 according to the present embodiment, the reliability of data can be improved more than in the first embodiment. Hereinafter, the details of the effects of the second embodiment will be described.

In the memory system 1 according to the present embodiment, as in the first embodiment, the controller 20 applies data processing including code conversion to write data received from the host apparatus 30. In the present embodiment, in the first write operation, the controller 20 transmits the 3 page data to the semiconductor storage device 10, and the semiconductor storage device 10 writes the 3 page data including the lower, middle, and upper bits after code conversion. Then, in the second write operation, the controller 20 transmits 1 page data, including the top bit after code conversion, to the semiconductor storage device 10, and the semiconductor storage device 10 writes data of four pages in total in the memory cell, based on the 3 page data read from the memory cell by IDL and including the lower, middle, and upper bits after code conversion and the 1 page data received from the controller 20 and including the top bit after code conversion.

Consequently, the memory system 1 according to the present embodiment can execute write operation in which the 4 page data is written divisionally twice, as in the first embodiment. In the present embodiment, since the 3 page data is written in the first write operation, by virtue of the subsequent second write operation, the influence of the initial drop of the threshold voltage occurring due to data writing corresponding to three bits and the influence of the parasitic capacitance between memory cells can be ignored in a threshold distribution to be finally obtained. Accordingly, in the memory system 1 according to the present embodiment, since a spread of the threshold distribution in the memory cell can be suppressed more than in the first embodiment, the reliability of data can be improved more than in the first embodiment.

In the memory system 1 according to the present embodiment, in the second write operation, data items of the lower, middle, and upper bits after code conversion written by the first write operation are restored by being read from the memory cell by IDL. Namely, the controller 20 can discard the 3 page data used in the first write operation after transmitting the 3 page data to the semiconductor storage device 10.

Consequently, the controller 20 can execute the above write operation if the capacitance of the RAM 22 is at least five pages. Namely, in the memory system 1 according to the present embodiment, since the capacity of the RAM 22 can be reduced, the circuit area of the controller 20 can be reduced more than in the first embodiment.

[3] Third Embodiment

Next, a memory system 1 according to a third embodiment will be described. In the memory system 1 according to the present embodiment, in the first write operation described in the first embodiment, the semiconductor storage device 10 mixedly executes 2 bit data writing and 3 bit data writing. Hereinafter, differences from the first and second embodiments will be described.

[3-1] Write Operation of Memory System 1

<Regarding Flow of Write Operation>

Next, the write operation in the memory system 1 will be described. In the write operation in the memory system 1 according to the present embodiment, a controller 20 applies various data processings to 4 page data received from the host apparatus 30, and three pages of this data are first transferred to a semiconductor storage device 10. At this time, the controller 20 maintains data corresponding to a high-order page of 3 page data after code conversion. The semiconductor storage device 10 then executes 2 page writing and further applies the first write operation using 3 bit data to only data corresponding to a highest order level of the two pages. After that, the controller 20 transmits retaining 2 page data and applies the second write operation to the 2 page data and 2 page data read by the semiconductor storage device 10 through IDL.

Hereinafter, the details of the write operation in the memory system 1 will be described using FIGS. 23 and 24.

Figure 23:
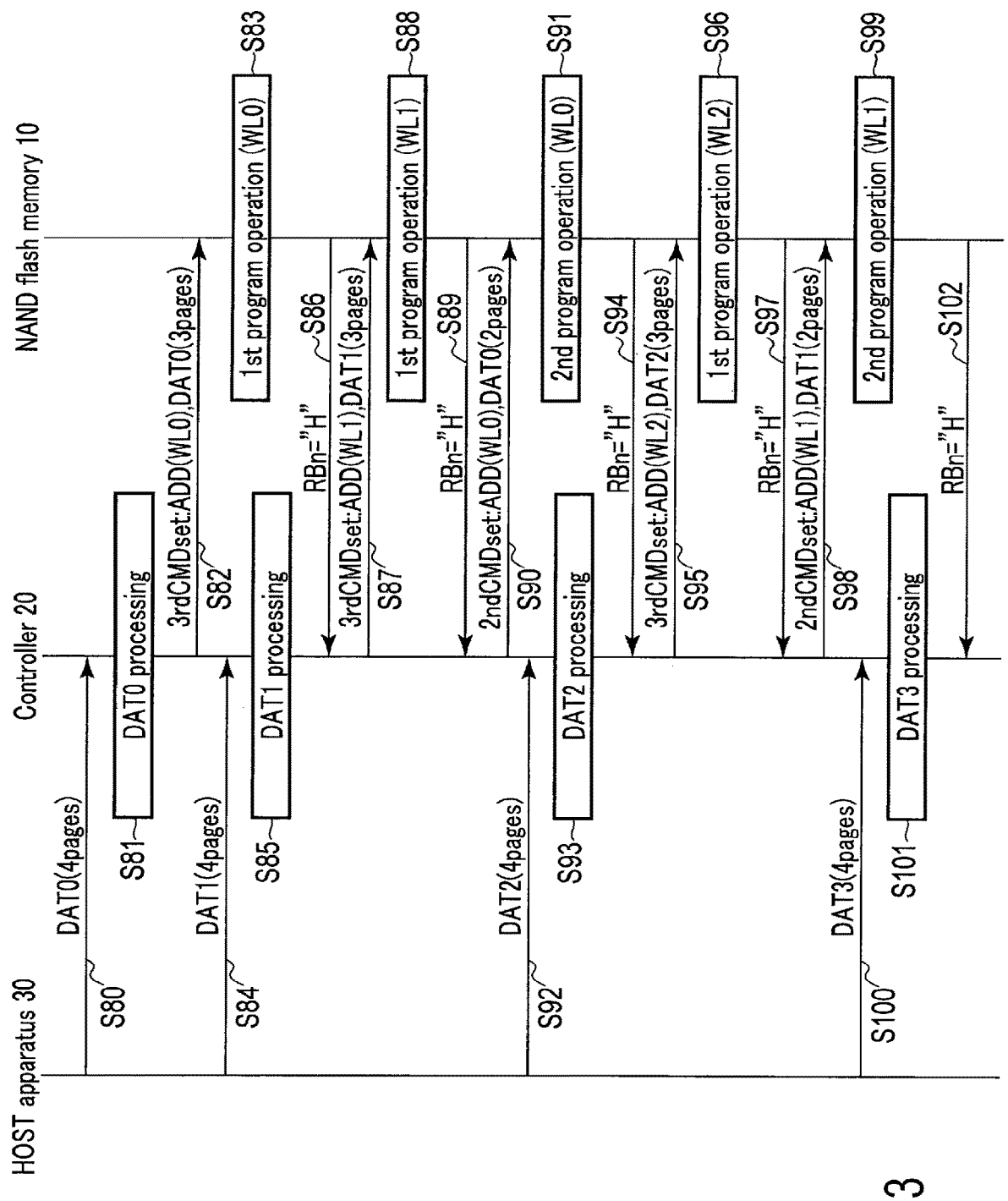
FIG. 23 is a flowchart of a write operation in a memory system according to a third embodiment.
Figure 24:
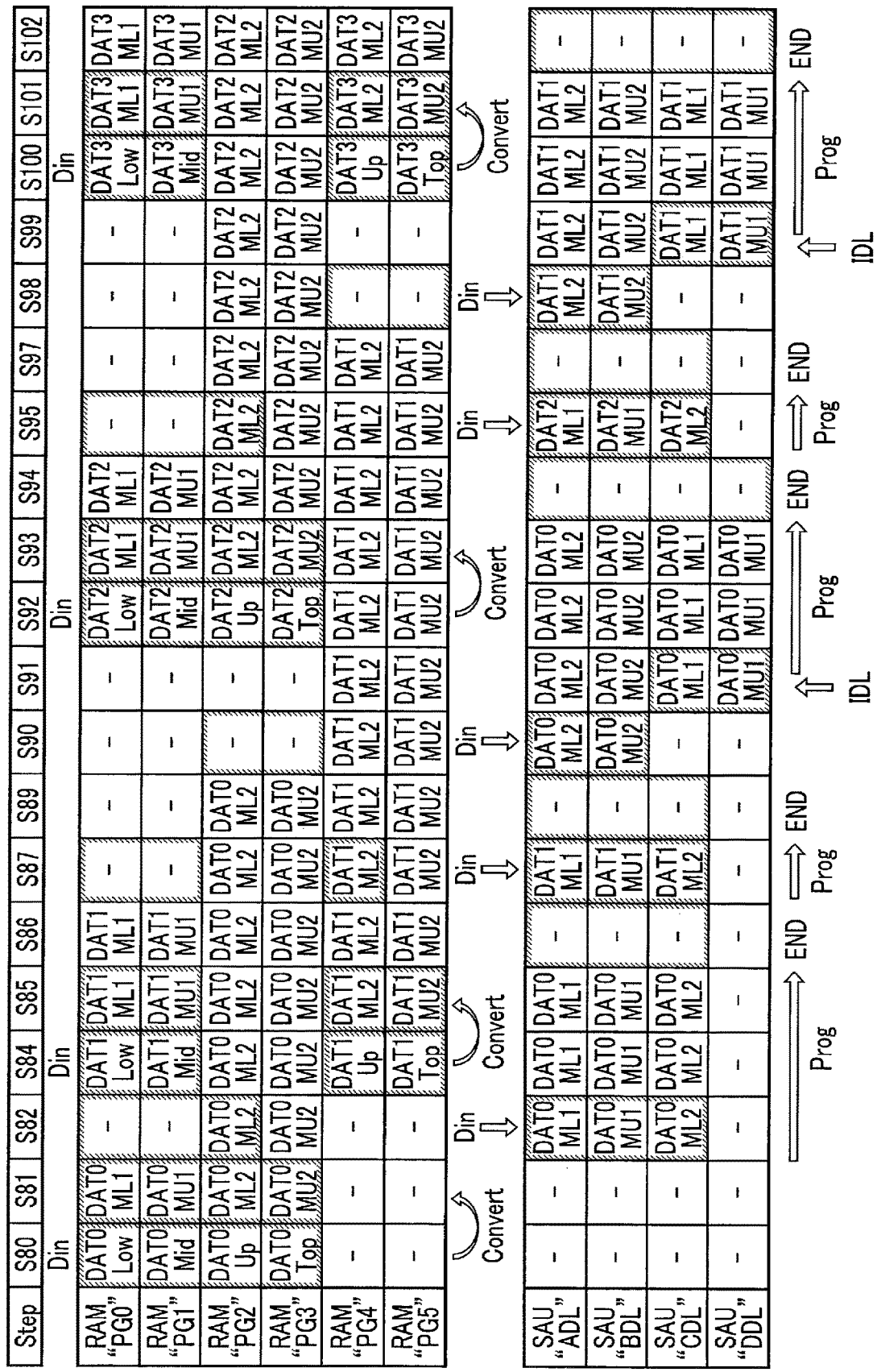
FIG. 24 is a schematic view showing data retained by a controller and a sense amplifier in each step during the write operation in the memory system according to the third embodiment.

FIG. 23 shows a flow chart of the write operation in the memory system 1, and FIG. 24 shows an example of data retained by the RAM 22 and the sense amplifier unit SAU in each step shown in FIG. 23.

Steps S80 to S102 shown in FIG. 23 are operations similar to steps S10 to S32 described in the first embodiment. Hereinafter, only differences from FIG. 5 described in the first embodiment will be described in detail.

(Steps S80 and S81)

Steps S80 and S81 are similar to steps S10 and S11 described in the first embodiment, and the controller 20 applies code conversion to the received 4 page data DAT0.

(Step S82)

The controller 20 selects the word line WL0 and transmits the third command set, including the 3 page data DAT0, to the semiconductor storage device 10. The 3 page data DAT0 of a command set received by the semiconductor storage device 10 is transferred to a latch circuit of the sense amplifier unit SAU. Specifically, as shown in FIG. 24, data items retained in the regions PG0, PG1, and PG2 of the RAM 22 are transferred to the latch circuits ADL, BDL, and CDL of the sense amplifier unit SAU, respectively. Then, when the 3 page data DAT0 is transferred, the RAM 22 clears data retained in the regions PG0 and PG1 and continues to retain data retained in the region PG2.

(Step S83)

Figure 25:
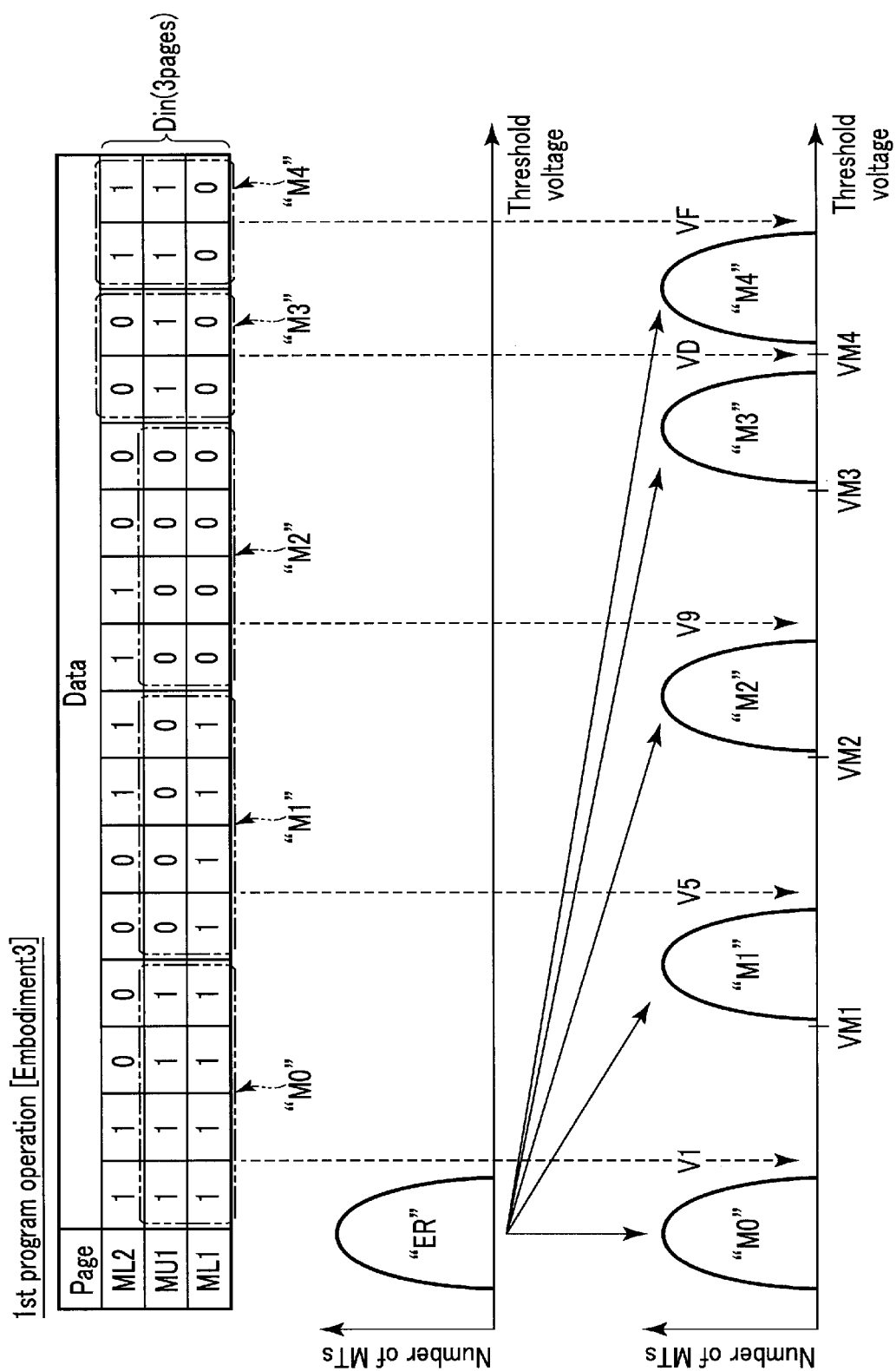

When the semiconductor storage device 10 receives the third command set from the controller 20, the semiconductor storage device 10 sets the ready/busy signal RBn to the "L" level and executes the first write operation in which the word line WL0 is selected. FIG. 25 shows an outline of the first write operation in the present embodiment. FIG. 25 shows a change in threshold distribution of the memory cell according to the first write operation. As shown in FIG. 25, in the first write operation, the semiconductor storage device 10 executes a 2 page write operation based on the first lower page data ML1 and the first upper page data MU1 input from the controller 20 and the write operation using a portion of the second lower page data ML2.

The threshold voltage of the memory cell transistor MT before execution of the first write operation is distributed at the "ER" level. In the first write operation, the sequencer 14 uses the voltages VM1, VM2, VM3, and VM4 as verify voltages.

In the present embodiment, the voltage VM1 is used when "11" (lower bit/middle bit after code conversion) data is written, and the voltage VM1 is not less than the voltage V1 and less than the voltage V5. The voltage VM2 is a verify voltage used when "10" data is written, and the voltage VM2 is not less than the voltage V5 and less than the voltage V9. The voltage VM3 is a verify voltage used when the "010" (lower bit/middle bit/upper bit) data is written, and the voltage VM3 is not less than the voltage V9 and less than the voltage VD. The voltage VM4 is a verify voltage used when the "011" data is written, and the voltage VM4 is not less than the voltage VD and less than the voltage VF. As described above, the write operation based on 2 bit data is applied to data corresponding to a low threshold voltage, and the write operation based on 3 bit data is applied to data corresponding to a high threshold voltage.

When the first write operation is executed, the threshold voltage of the memory cell transistor MT rises based on data to be written, and five threshold distributions are formed. The "M0" level shown in FIG. 25 is formed by the memory cell transistors MT in which the "11" data is written. The "M1" level is formed by the memory cell transistors MT in which the "10" data is written. The "M2" level is formed by the memory cell transistors MT in which "00" data is written. The "M3" level is formed by the memory cell transistors MT in which the "010" data is written. The "M4" level is formed by the memory cell transistors MT in which the "011" data is written.

The "M0" level is less than the voltage V1, and as in the first embodiment, the "M0" level corresponds to the erase state of the memory cell transistor MT. Namely, in the first write operation, the increase in threshold voltage is suppressed in the memory cell transistor MT in which the "11" data is written. A threshold voltage at the "M1" level is not less than the voltage VM1 and less than the voltage V5. A threshold voltage at the "M2" level is not less than the voltage VM2 and less than the voltage V9. A threshold voltage at the "M3" level is not less than the voltage VM3 and less than the voltage VD. A threshold voltage at the "M4" level is not less than the voltage VM4 and less than the voltage VF.

As described above, the voltages VM1, VM2, VM3, and VM4 used in verification in the first write operation are set such that the threshold voltage of the memory cell transistor MT having passed verification does not exceed the voltages V5, V9, VD, and VF, respectively.

In the above description, the case where verification according to the voltage VM4 is executed in the first write operation has been described as an example, but the present invention is not limited to this case. For example, the verification according to the voltage VM4 may not be executed. In this case, after the semiconductor storage device 10 has passed verification according to the voltage VM3, the semiconductor storage device 10 applies an arbitrary number of program pulses and ends the first write operation.

(Steps S84 to S86)

Steps S84 to S86 are similar to steps S14 to S16 described in the first embodiment, and the controller 20 applies code conversion to the received 4 page data DAT1.

(Step S87)

The controller 20 selects the word line WL1 and transmits the third command set, including the 3 page data DAT1, to the semiconductor storage device 10. The 3 page data DAT0 of a command set received by the semiconductor storage device 10 is transferred to the latch circuit of the sense amplifier unit SAU. Specifically, as shown in FIG. 24, data items retained in the regions PG0, PG1, and PG4 of the RAM 22 are transferred to the latch circuits ADL, BDL, and CDL of the sense amplifier unit SAU, respectively. Then, when the 3 page data DAT1 is transferred, the RAM 22 clears data retained in the regions PG0 and PG1 and continues to retain data retained in the region PG4.

(Steps S88 and S89)

As in step S83, the semiconductor storage device 10 executes the first write operation, based on the third command set selecting the word line WL1 and including the 3 page data DAT1.

(Step S90)

The controller 20 selects the word line WL0 and transmits the second command set, including the 2 page data DAT0, to the semiconductor storage device 10. The 2 page data DAT0 of a command set received by the semiconductor storage device 10 is transferred to the latch circuit of the sense amplifier unit SAU. Specifically, as shown in FIG. 24, the data items retained in the regions PG2 and PG3 of the RAM 22 are transferred respectively to the latch circuits ADL and BDL of the sense amplifier unit SAU. Then, when the 2 page data DAT0 is transferred, the RAM 22 clears data retained in the regions PG2 and PG3.

(Step S91)

When the semiconductor storage device 10 receives the second command set from the controller 20, the semiconductor storage device 10 sets the ready/busy signal RBn to the "L" level and executes the second write operation in which the word line WL0 is selected. FIG. 26 shows an outline of the second write operation in the present embodiment. FIG. 26 shows a change in threshold distribution of the memory cell according to the second write operation. As shown in FIG. 26, in the second write operation in the present embodiment, the semiconductor storage device 10 first executes internal data load (IDL).

In IDL in the present embodiment, the sense amplifier module 17 executes read operation using the voltages M1R, M2R, and M3R. The voltages M1R, M2R, and M3R in the present embodiment are similar to the voltages M1R, M2R, and M3R described in the first embodiment with the use of FIG. 10.

Consequently, the "11" data, the "10" data, the "00" data, and the "01" data written by the first write operation are restored in the latch circuit in the sense amplifier module SAU. Specifically, as shown in FIG. 24, the first lower page data ML1 and the first upper page data MU1 of the data DAT0 are transferred to the latch circuits CDL and DDL, respectively.

The semiconductor storage device 10 executes 4 page write operation based on the first lower page data ML1 and the first upper page data MU1 read by IDL and the second lower page data ML2 and the second upper page data MU2 input from the controller 20.

In the second write operation, the sequencer 14 uses the voltages V1, V2, V3, V4, V5, V6, V7, V8, V9, VA, VB, VC, VD, VE, and VF as verify voltages, as in the first embodiment. When the second write operation is executed, the threshold voltage of the memory cell transistor MT rises based on data to be written, and 16 threshold distributions are formed from five levels. For example, the threshold distributions at the "0" level, the "1" level, the "2" level, and the "3" level are formed from the threshold distribution at the "M0" level. The threshold distributions at the "4" level, the "5" level, the "6" level, and the "7" level are formed from the threshold distribution at the "M1" level. The threshold distributions at the "8" level, the "9" level, the "A" level, and the "B" level are formed from the threshold distribution at the "M2" level. The threshold distributions at the "C" level and the "D" level are formed from the threshold distribution at the "M3" level. The threshold distributions at the "E" level and the "F" level are formed from the threshold distribution at the "M4" level.

(Steps S92 to S94)

As in steps S22 to S24 described in the first embodiment, while the first write operation in step S91 is executed, the controller 20 applies code conversion to the received 4 page data DAT2. On the other hand, when the first write operation in step S91 is ended, the semiconductor storage device 10 sets the ready/busy signal RBn to the "H" level and notifies the controller 20 of the end of the write operation.

(Steps S95 to S97)

As in steps S82 to 84, the semiconductor storage device 10 executes the first write operation, based on the third command set selecting the word line WL2 and including the 3 page data DAT2.

(Step S98)

The controller 20 selects the word line WL1 and transmits the second command set, including the 2 page data DAT1, to the semiconductor storage device 10. The 2 page data DAT1 of a command set received by the semiconductor storage device 10 is transferred to the latch circuit of the sense amplifier unit SAU. Specifically, as shown in FIG. 24, the data items retained in the regions PG4 and PG5 of the RAM 22 are transferred respectively to the latch circuits ADL and BDL of the sense amplifier unit SAU. Then, when the 2 page data DAT0 is transferred, the RAM 22 clears data retained in the regions PG4 and PG5.

(Step S99)

As in step S91, the semiconductor storage device 10 executes the first write operation, based on the third command set selecting the word line WL1 and including the 2 page data DAT2. Specifically, the semiconductor storage device 10 executes 4 page write operation based on the first lower page data ML1 and the first upper page data MU1 read by IDL and the second lower page data ML2 and the second upper page data MU2 input from the controller 20.

(Steps S100 and S101)

Steps S100 and S101 are similar to steps S30 and S31 described in the first embodiment, and the controller 20 applies code conversion to the received 4 page data DAT3.

(Step S102)

When the second write operation in step S99 is ended, the semiconductor storage device 10 sets the ready/busy signal RBn to the "H" level and notifies the controller 20 of the end of the write operation. Further, when the second write operation is ended, the latch circuit in the sense amplifier unit SAU is cleared as shown in FIG. 24.

In the subsequent operation, operation similar to steps S87 to S102 is repeated. When the second write operation corresponding to the last 4 page data is ended, the memory system 1 ends the write operation.

<Regarding Command Sequence>

Figure 27:
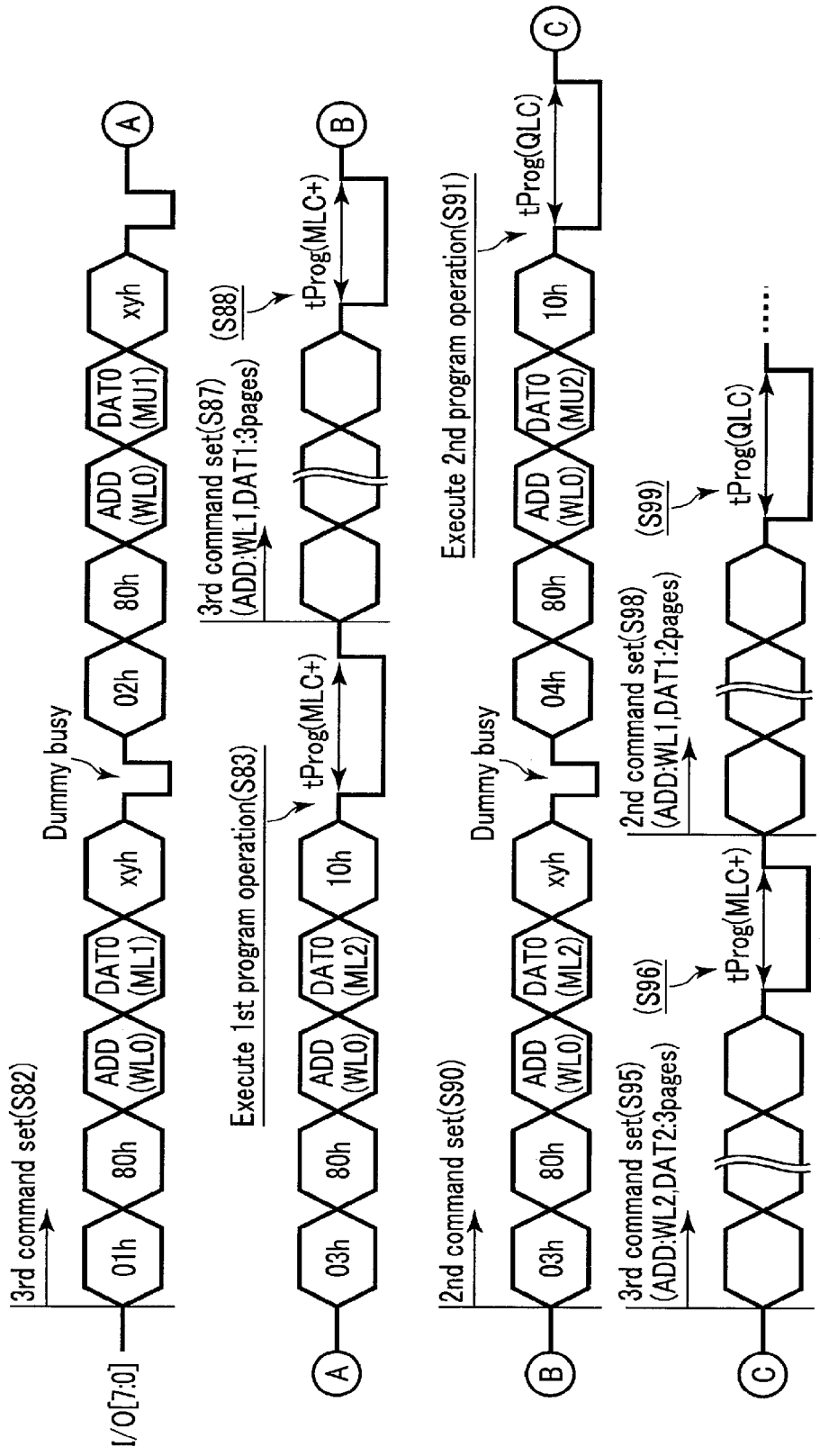
FIG. 27 is a command sequence of the write operation in the memory system according to the third embodiment.

Next, a command sequence in the above write operation will be described using FIG. 27. FIG. 27 shows a command sequence corresponding to FIG. 23 and shows the input/output signal I/O input to the semiconductor storage device 10.

As shown in FIG. 27, relative to the third command set described using FIG. 21 in the second embodiment, the third command set in the present embodiment is similar to a command set in which data of a first page is replaced by the first lower page data ML1, data of a second page is replaced by the first upper page data MU1, and data of a third page is replaced by the second lower page data ML2. The second command set in the present embodiment is similar to the second command set described in the first embodiment with the use of FIG. 11. An illustrated tProg (MLC+) corresponds to a processing period of the first write operation according to the present embodiment and is longer than tProg(MLC) in the first embodiment and shorter than tProg(QLC) in the first embodiment. Since those detailed command sequences are similar to the command sequences described in the first and second embodiments, the description will be omitted.

[3-2] Effects of Third Embodiment

According to the memory system 1 according to the present embodiment, the reliability of data can be improved more than in the first embodiment. Hereinafter, the details of the effects of the third embodiment will be described.

In the memory system 1 according to the present embodiment, as in the first embodiment, the controller 20 applies data processing including code conversion to write data received from the host apparatus 30. In the present embodiment, in the first write operation, the controller 20 transmits the 3 page data to the semiconductor storage device 10. The semiconductor storage device 10 performs writing with the use of 2 bit data in data in which the threshold voltage corresponds to a low level and performs writing with the use of 3 bit data in data in which the threshold voltage corresponds to a high level.

Specifically, in the 2 page data constituted of the first lower page ML1 and the first upper page MU1 of 3 page data received by the semiconductor storage device 10 in the first write operation, the data "11", "10", and "00" in which the threshold voltage is low and the data "01" in which the threshold voltage is high are classified. The data "01" in which the threshold voltage is high is classified into two data items "010" and "011" with the use of data of the second lower page ML2.

The semiconductor storage device 10 forms three threshold distributions by 2 bit data writing using the data "11", "10", and "00" and forms two threshold distributions by 3 bit data writing using the data "010" and "011" in which the threshold voltage is high. As described above, in the first write operation in the present embodiment, the 2 bit data writing and the 3 bit data writing are mixedly executed.

Then, in the second write operation, the controller 20 transmits 2 page data to the semiconductor storage device 10, and the semiconductor storage device 10 writes data of four pages in total in the memory cell, based on the 2 page data read from the memory cell by IDL and including the lower and middle bits after code conversion and the 2 page data received from the controller 20 and including the upper and top bits after code conversion.

Consequently, the memory system 1 according to the present embodiment can execute write operation in which the 4 page data is written divisionally twice, as in the first embodiment. In the present embodiment, in the first write operation, data corresponding to a high level threshold distribution is written by three bits. In such a level that a variation of the threshold voltage is largest, since an initial drop amount of the threshold voltage and the parasitic capacitance with respect to an adjacent memory cell are greatly influenced, the effect of ignoring these influences is increased by the second write operation. Accordingly, in the memory system 1 according to the present embodiment, since a spread of the threshold distribution in the memory cell can be suppressed more than in the first embodiment, the reliability of data can be improved more than in the first embodiment.

[4] Fourth Embodiment

Next, a memory system 1 according to a fourth embodiment will be described. In the memory system 1 according to the present embodiment, in the first write operation described in the first embodiment, the semiconductor storage device 10 executes 3 bit data writing. Hereinafter, differences from the first to third embodiments will be described.

[4-1] Write Operation of Memory System 1

<Regarding Flow of Write Operation>

Next, the write operation in the memory system 1 will be described. In the write operation in the memory system 1 according to the present embodiment, a controller 20 applies various data processings to 4 page data received from the host apparatus 30, and three pages of this data are first transferred to a semiconductor storage device 10. At this time, the controller 20 maintains data corresponding to a high-order page of 3 page data. The semiconductor storage device 10 then executes the first write operation using 3 bit data. After that, the controller 20 transmits the retained 2 page data and applies the second write operation to the 2 page data and 2 page data read by the semiconductor storage device 10 through IDL.

Figure 28:
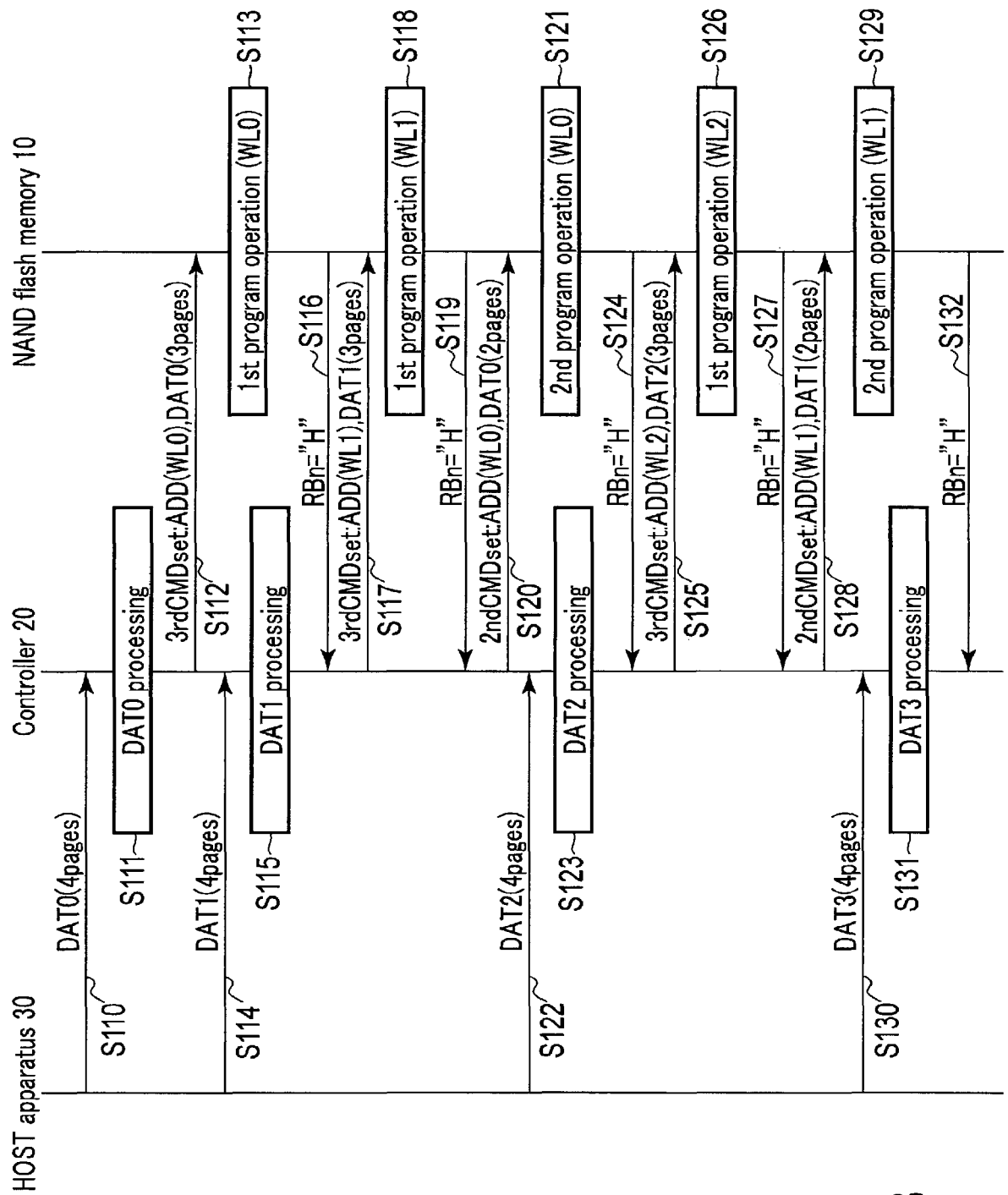
FIG. 28 is a command sequence of a write operation in a memory system according to a fourth embodiment.
Figure 29:
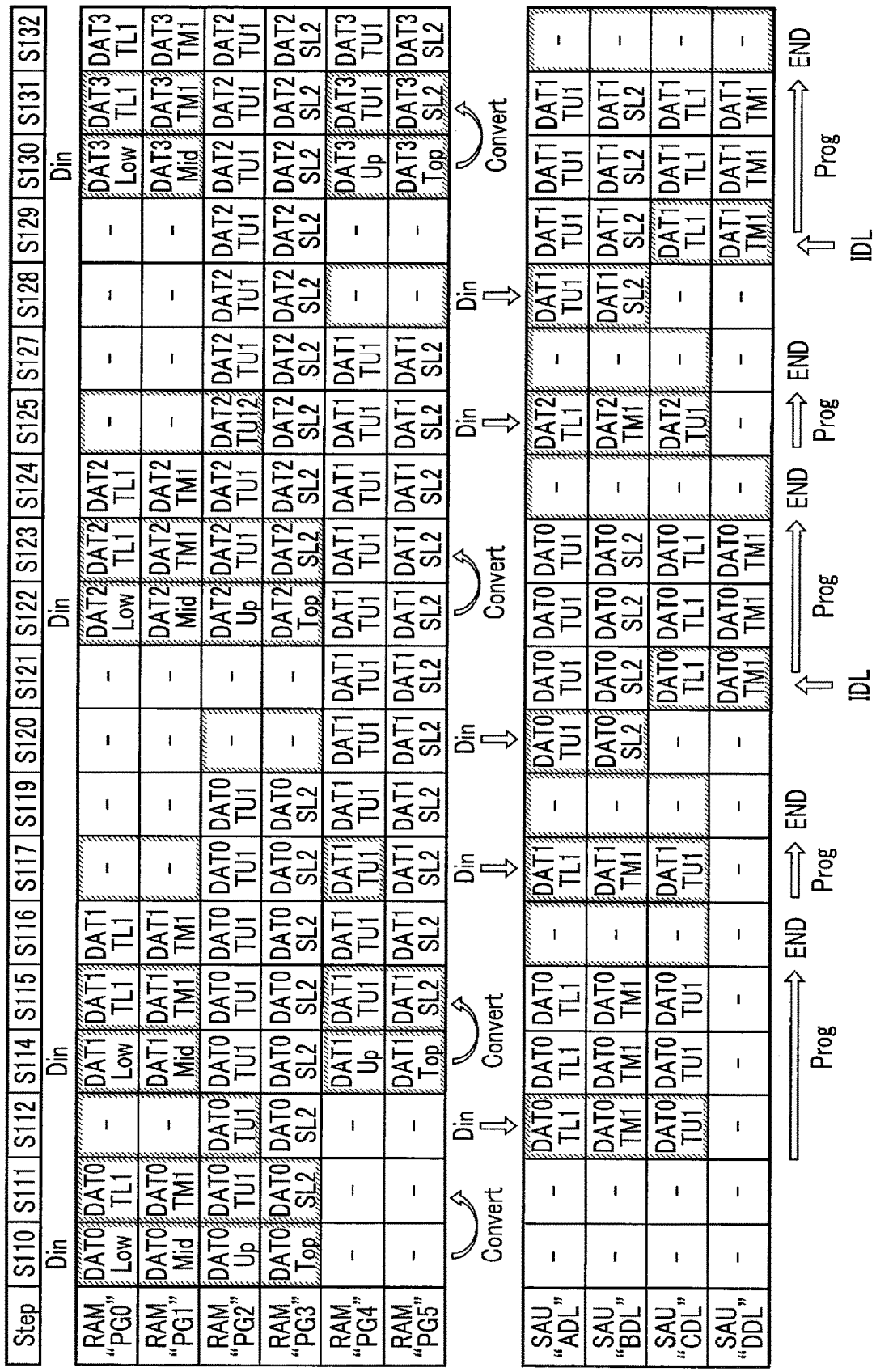
FIG. 29 is a schematic view showing data retained by a controller and a sense amplifier in each step during the write operation in the memory system according to the fourth embodiment.

Hereinafter, the details of the write operation in the memory system 1 will be described using FIGS. 28 and 29. FIG. 28 shows a flow chart of the write operation in the memory system 1, and FIG. 29 shows an example of data retained by the RAM 22 and the sense amplifier unit SAU in each step shown in FIG. 28.

Steps S110 to S132 shown in FIG. 28 are similar to steps S80 to S102 described in the third embodiment and differ in the details of the first and second write operations. In the drawing shown in FIG. 29, relative to FIG. 24 described in the third embodiment, 4 bit data DAT after data processing using the controller 20 is replaced by a first lower page data TL1, a first middle page data TM1, a first upper page data TU1, and a second single page data SL2. Thus, the details of the first and second write operations in the present embodiment will be described.

(First Write Operation)

Figure 30:
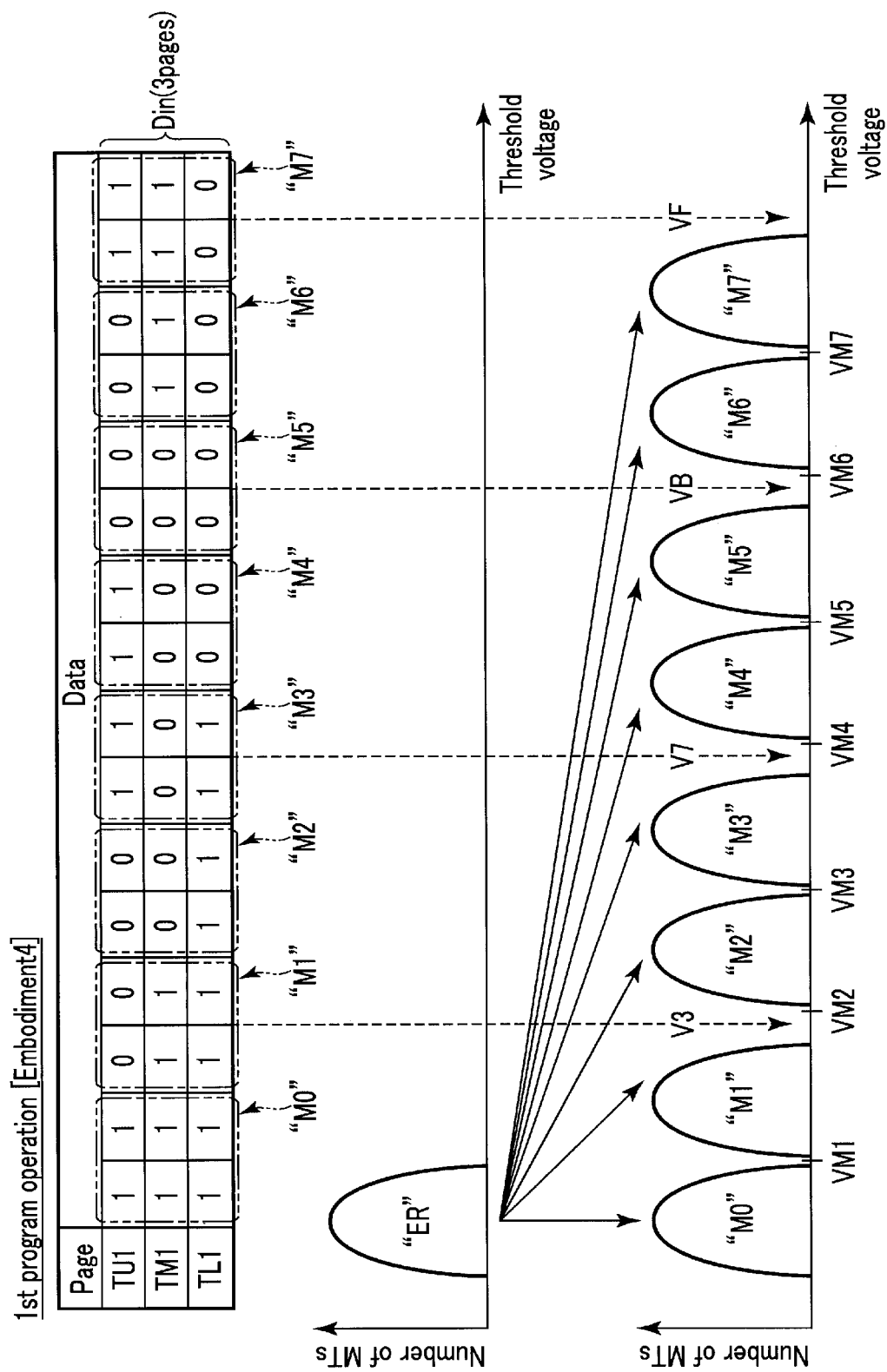
FIGS. 30 and 31 are views showing a change in threshold distribution in the write operation in a semiconductor storage device according to the fourth embodiment.

When the semiconductor storage device 10 receives a third command set from the controller 20 in step S113, for example, the semiconductor storage device 10 sets a ready/busy signal RBn to an "L" level and executes the first write operation in which a word line WL0 is selected. FIG. 30 shows an outline of the first write operation in the present embodiment. FIG. 30 shows a change in threshold distribution of the memory cell according to the first write operation. As shown in FIG. 30, in the first write operation, the semiconductor storage device 10 executes a 3 page write operation based on the first lower page data TL1, the first middle page data TM1, and the first upper page data TU1 input from the controller 20. FIG. 30 differs from FIG. 19 described in the second embodiment in a value of a verify voltage.

A voltage VM1 is set such that the threshold voltage of the memory cell transistor MT having passed verification does not exceed a voltage V3. A voltage VM2 is less than a voltage VM3, and the voltages VM2 and VM3 are set such that the threshold voltage of the memory cell transistor MT having passed verification does not exceed a voltage V7. A voltage VM4 is less than a voltage VM5, and the voltages VM4 and VM5 are set such that the threshold voltage of the memory cell transistor MT having passed verification does not exceed a voltage VB. A voltage VM6 is less than a voltage VM7, and the voltages VM6 and VM7 are set such that the threshold voltage of the memory cell transistor MT having passed verification does not exceed a voltage VF. Since the others are similar to FIG. 19 described in the second embodiment, the description will be omitted.

(Second Write Operation)

Figure 31:
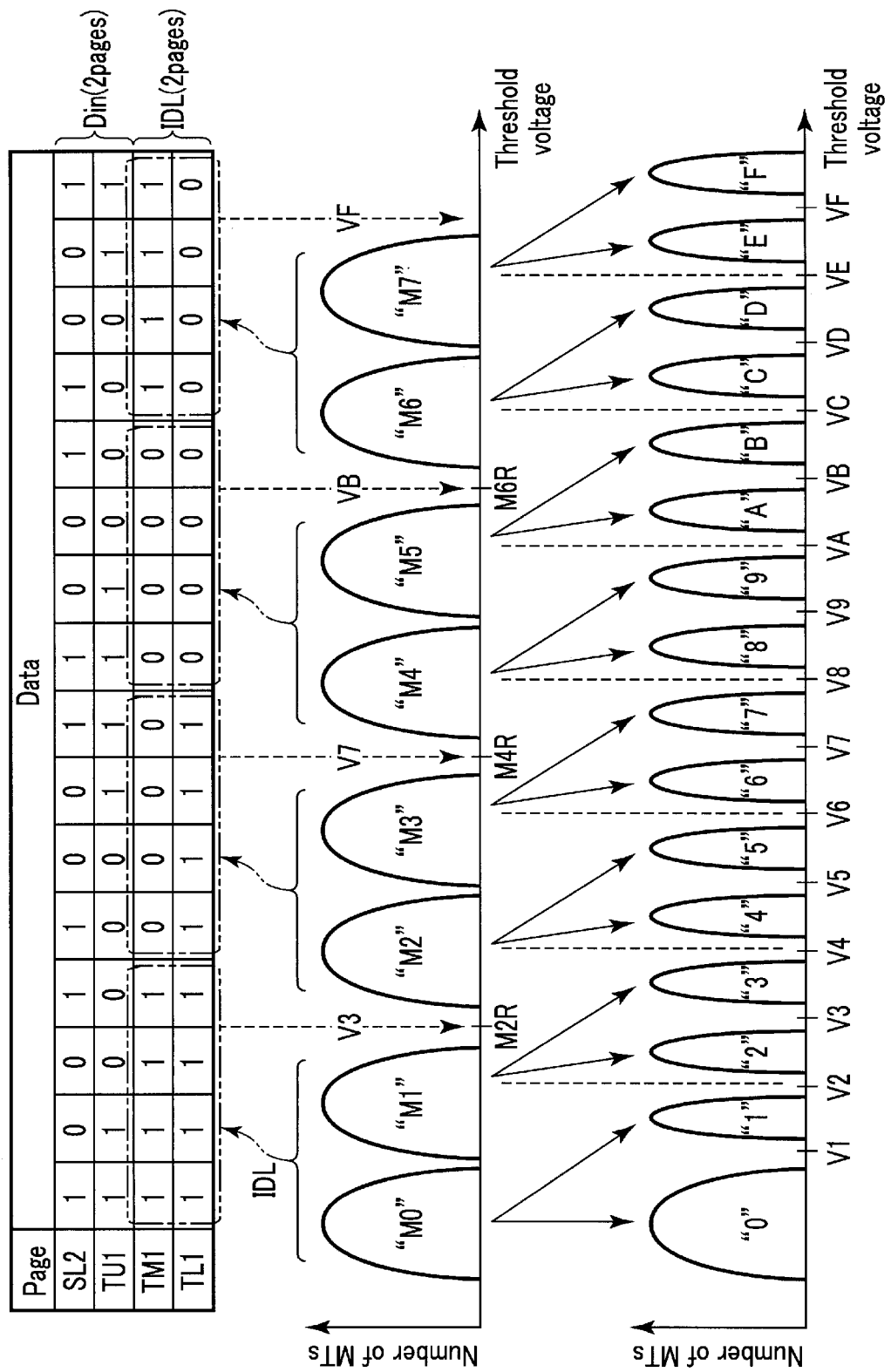

When the semiconductor storage device 10 receives a second command set from the controller 20 in step S121, for example, the semiconductor storage device 10 sets the ready/busy signal RBn to the "L" level and executes the second write operation in which the word line WL0 is selected. FIG. 31 shows an outline of the second write operation in the present embodiment. FIG. 31 shows a change in threshold distribution of the memory cell according to the second write operation. As shown in FIG. 31, in the second write operation in the present embodiment, the semiconductor storage device 10 first executes internal data load (IDL).

In IDL in the present embodiment, a sense amplifier module 17 executes read operation using voltages M2R, M4R, and M6R. In the voltages M2R, M4R, and M6R in the present embodiment, the voltage M2R is not less than the voltage V3 and not more than the voltage VM2, and a sense amplifier part SA determines whether or not the threshold voltage of the memory cell transistor MT is less than a voltage M1R through the read operation using the voltage M2R. The voltage M4R is not less than the voltage V7 and not more than the voltage VM4, and the sense amplifier part SA determines whether or not the threshold voltage of the memory cell transistor MT is less than the voltage M2R through the read operation using the voltage M4R. The voltage M6R is not less than the voltage VB and not more than the voltage VM6, and the sense amplifier part SA determines whether or not the threshold voltage of the memory cell transistor MT is less than the voltage M3R through the read operation using the voltage M6R.

Consequently, the "11" data, the "10" data, the "00" data, and the "01" data written by the first write operation are restored in the latch circuit in the sense amplifier module SAU. Specifically, as shown in FIG. 29, the first lower page data TL1 and the first middle page data TM1 of the data DAT0 are transferred to, for example, the latch circuits CDL and DDL, respectively.

The semiconductor storage device 10 executes 4 page write operation based on the first lower page data TL1 and the first middle page data TM1 read by IDL and the first upper page data TL1 and the second single page data SL2 input from the controller 20.

In the second write operation, the sequencer 14 uses the voltages V1, V2, V3, V4, V5, V6, V7, V8, V9, VA, VB, VC, VD, VE, and VF as verify voltages, as in the first embodiment. When the second write operation is executed, the threshold voltage of the memory cell transistor MT rises based on data to be written, and 16 threshold distributions are formed from eight levels. For example, the threshold distributions at a "0" level and a "1" level are formed from the threshold distribution at an "M0" level. The threshold distributions at a "2" level and a "3" level are formed from the threshold distribution at an "M1" level. The threshold distributions at a "4" level and a "5" level are formed from the threshold distribution at an "M2" level. The threshold distributions at a "6" level and a "7" level are formed from the threshold distribution at an "M3" level. The same applies hereinafter.

<Regarding Command Sequence>

Figure 32:
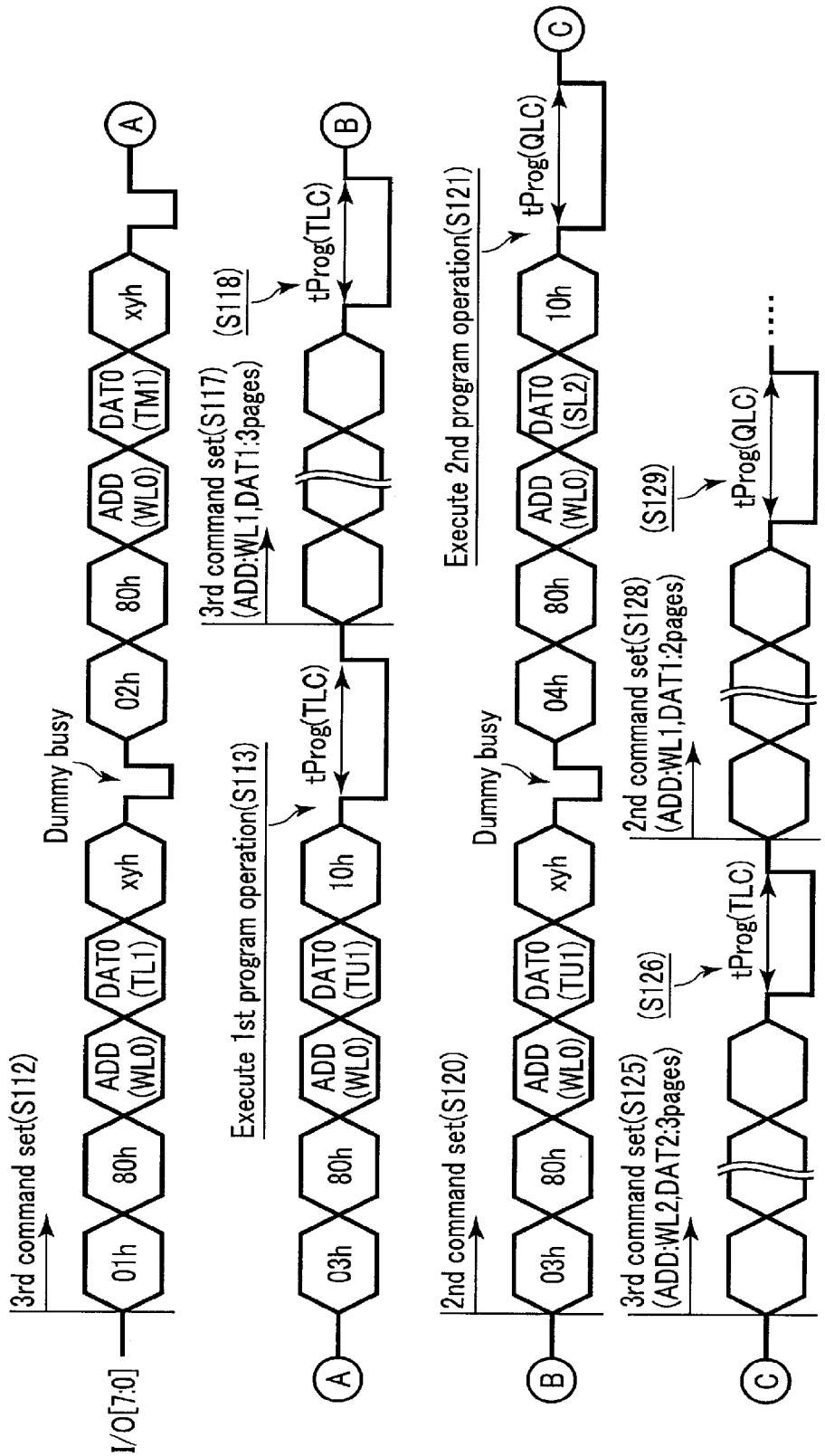
FIG. 32 is a command sequence of the write operation in the memory system according to the fourth embodiment.

Next, a command sequence in the above write operation will be described using FIG. 32. FIG. 32 shows a command sequence corresponding to FIG. 28 and shows an input/output signal I/O input to the semiconductor storage device 10.

As shown in FIG. 32, the third command set in the present embodiment is similar to the third command set described in the second embodiment with the use of FIG. 21. Relative to the second command set described using FIG. 11 in the first embodiment, the second command set in the present embodiment is similar to a command set in which data DAT of a first page is replaced by the first upper page data TU1, and the data DAT of a second page is replaced by the second single page data SL2. Since those detailed command sequences are similar to the command sequences described in the first and second embodiments, the description will be omitted.

[4-2] Effects of Fourth Embodiment

According to the memory system 1 according to the present embodiment, the reliability of data can be improved more than in the first embodiment. Hereinafter, the details of the effects of the fourth embodiment will be described.

In the memory system 1 according to the present embodiment, as in the first embodiment, the controller 20 applies data processing including code conversion to write data received from the host apparatus 30. In the present embodiment, in the first write operation, the controller 20 transmits the 3 page data to the semiconductor storage device 10, and the semiconductor storage device 10 writes the 3 page data including the lower, middle, and upper bits after code conversion. Then, in the second write operation, the controller 20 transmits 2 page data to the semiconductor storage device 10, and the semiconductor storage device 10 writes data of four bits in total, based on the 2 page data received from the controller 20 and including the upper and top bits after code conversion and the 2 page data read by IDL and including the lower and middle bits after code conversion.

As described above, the memory system 1 according to the present embodiment executes write operation in which the 4 page data is written divisionally twice, as in the first embodiment. In the present embodiment, since the 3 bit data is written in the first write operation as in the second embodiment, by virtue of the subsequent second write operation, the influence of the initial drop of the threshold voltage occurring due to data writing corresponding to three bits and the influence of the parasitic capacitance between memory cells can be ignored in a threshold distribution to be finally obtained. Accordingly, the memory system 1 according to the present embodiment can improve the reliability of data as in the second embodiment.

In the memory system 1 according to the present embodiment, in the second write operation, among the lower, middle, and upper bits after code conversion written by the first write operation, only data items of the lower and upper bits are restored by IDL, and data of the upper bit is obtained by being received from the controller 20. Since a time during which data corresponding to one page is re-received from the controller 20 is shorter than a time during which data of the upper bit stored in the memory cell is read by IDL, the write speed in the memory system 1 according to the present embodiment can be accelerated as compared with the second embodiment.

The verify voltages in the present embodiment may be set such that a margin is generated each between the "M1" level and the "M2" level, between the "M3" level and the "M4" level, and between the "M5" level and the "M6" level. As described above, it is possible to reduce the number of error bits occurring when IDL of the 2 bit data is executed in the second read operation.

[5] Fifth Embodiment

Next, a memory system 1 according to the fifth embodiment will be described. In a semiconductor storage device 10 in the present embodiment, each block BLK of a memory cell array 11 includes a plurality of string units. A controller 20 issues instructions for foggy program operation and fine program operation with respect to each string unit to the semiconductor storage device 10 in a predetermined order. Hereinafter, differences from the first to fourth embodiments will be described.

[5-1] Configuration of Memory System 1

First, a configuration of the memory system 1 will be described using FIG. 33. FIG. 33 is a block diagram of a RAM 22 of the controller 20.

As shown in FIG. 33, the RAM 22 includes page clusters CL0 to CL4. Each page cluster CL includes regions PG0 to PG3. Namely, the page clusters CL0 to CL4 each can hold 4 pages data. The storage capacity of the page cluster CL is not limited to 4 pages and may be 2 pages, 3 pages, or not less than 5 pages.

Next, a configuration of the memory cell array 11 will be described using FIG. 34. FIG. 34 is a circuit diagram of the memory cell array 11 and shows a detailed circuit configuration of one of the blocks BLK in the memory cell array 11. The circuit configuration of the memory cell array 11 in this embodiment is different from the circuit configuration of the memory cell array 11 described using FIG. 2 in the first embodiment in that a plurality of string units SU are provided in each of the blocks BLK.

The block BLK comprises, for example, string units SU0 to SU3, as shown in FIG. 34. Each of the string units SU includes m NAND strings 18. The configuration of the NAND string 18 is similar to that described using FIG. 2 in the first embodiment.

Gates of select transistors ST1 in the string units SU0 to SU3 are commonly connected to select gate lines SGD0 to SGD 3, respectively. Drains of the select transistors ST1 on the same column in the same block are commonly connected to the corresponding bit line BL. Namely, the drains of the select transistors ST1 on the same column are commonly connected between the blocks BLK. Control gates of memory transistors MT0 to MT7 in the same block are commonly connected respectively to word lines WL0 to WL7. Gates of select transistors ST2 in the same block are commonly connected to select gate lines SGS. Sources of select transistors ST2 in the same block are commonly connected to a source line SL. Namely, the sources of the select transistors ST2 are commonly connected between the blocks BLK. Other configurations are similar to the first embodiment, and therefore description thereof is omitted.

[5-2] Write Operation of Memory System 1

<Regarding Flow of Write Operation>

Next, the write operation of the memory system 1 will be described. In the write operation in the memory system 1 according to the present embodiment, writing of 4 pages data is divisionally executed twice, once with foggy program operation, and once with fine program operation. The foggy program operation and the fine program operation are each executed based on write data of four pages. Details of these program operations will be described later.

Hereinafter, details of the write operation of the memory system 1 will be described using FIG. 35. FIG. 35 is a flow chart of the write operation of the memory system 1. The following write operation will be described, taking as an example a case where a 4-4-3-4 code is applied to write data. In the following description, variables i and j are used for ease of explanation. The variables i and j are held by a counter of the controller 20, for example, and incremented by control from the controller 20.

As shown in FIG. 35, first, the semiconductor storage device 10 executes the foggy program operation in which a word line WLi (i=0) is selected, and the string units SU0 to SU3 are selected in sequence (step S200). FIG. 36 shows details of the foggy program operation. FIG. 36 shows a change in threshold distribution of a memory cell according to the foggy program operation.

As shown in FIG. 36, the semiconductor storage device 10 executes the foggy program operation based on the 4 pages data input from the controller 20.

A threshold voltage of the memory cell transistor MT before execution of the foggy program operation is distributed at an "ER" level. The threshold voltage at the "ER" level is less than a voltage V1, and as in the "0" level described above, the threshold voltage at the "ER" level corresponds to an erase state of the memory cell transistor MT.

In the foggy program operation, a sequencer 14 uses voltages VM1, VM2, VM3, VM4, VM5, VM6, VM7, VM8, VM9, VMA, VMB, VMC, VMD, VME, and VMF as verify voltages. The voltages VM1, VM2, VM3, VM4, VM5, VM6, VM7, VM8, VM9, VMA, VMB, VMC, VMD, VME, and VMF are used respectively when "1111" ("lower bit/middle bit/upper bit/top bit") data, "0111" data, "0101" data, "0001" data, "1001" data, "1000" data, "0000" data, "0100" data, "0110" data, "0010" data, "0011" data, "1011" data, "1010" data, "1110" data, "1100" data, and "1101" data are written. The voltage VM1 is less than the voltage V1. The voltage VM2 is not less than the voltage V1 and less than the voltage V2. The voltage VM3 is not less than the voltage V2 and less than the voltage V3. The same applies hereinafter.

When the foggy program operation is executed, the threshold voltage of the memory cell transistor MT increases based on data to be written, and 16 threshold distributions are formed. As shown in FIG. 36, the 16 threshold distributions sometimes overlap the adjacent threshold voltages. An "M0" level shown in FIG. 36 is formed by the memory cell transistors MT in which "1111" data is written. An "M1" level is formed by the memory cell transistors MT in which "0111" data is written. An "M2" level is formed by the memory cell transistors MT in which "0101" data is written. The same applies hereinafter.

The threshold voltage at the "M0" level is less than the voltage V1, and as in the "0" level and the "ER" level described above, the threshold voltage at the "M0" level corresponds to the erase state of the memory cell transistor MT. Namely, in the first program operation, the increase in threshold voltage is suppressed in the memory cell transistor MT in which the "1" data is written. A threshold voltage at the "M1" level is not less than the voltage VM1 and less than the voltage V2. A threshold voltage at the "M2" level is not less than the voltage VM2 and less than the voltage V3. The same applies hereinafter.

Thus, the voltages VM1, VM2, VM3, VM4, VM5, VM6, VM7, VM8, VM9, VMA, VMB, VMC, VMD, VME, and VMF used in verification in the foggy program operation are set such that the threshold voltage of the memory cell transistor MT having passed verification does not exceed the voltages V2, V3, V4, V5, V6, V7, V8, V9, VA, VB, VC, VD, VE, VF, and VREAD, respectively.

Returning to FIG. 35, when the foggy program operation in step S200 is ended, the variable i is incremented, and the variable j is reset (j=0) (step S201). Then, the semiconductor storage device 10 executes the foggy program operation in which the word line WLi is selected, and a string unit SUj is selected (step S202). Specifically, the semiconductor storage device 10 executes the foggy program operation in which the word line WL1 is selected, and the string unit SU0 is selected.

Figure 37:
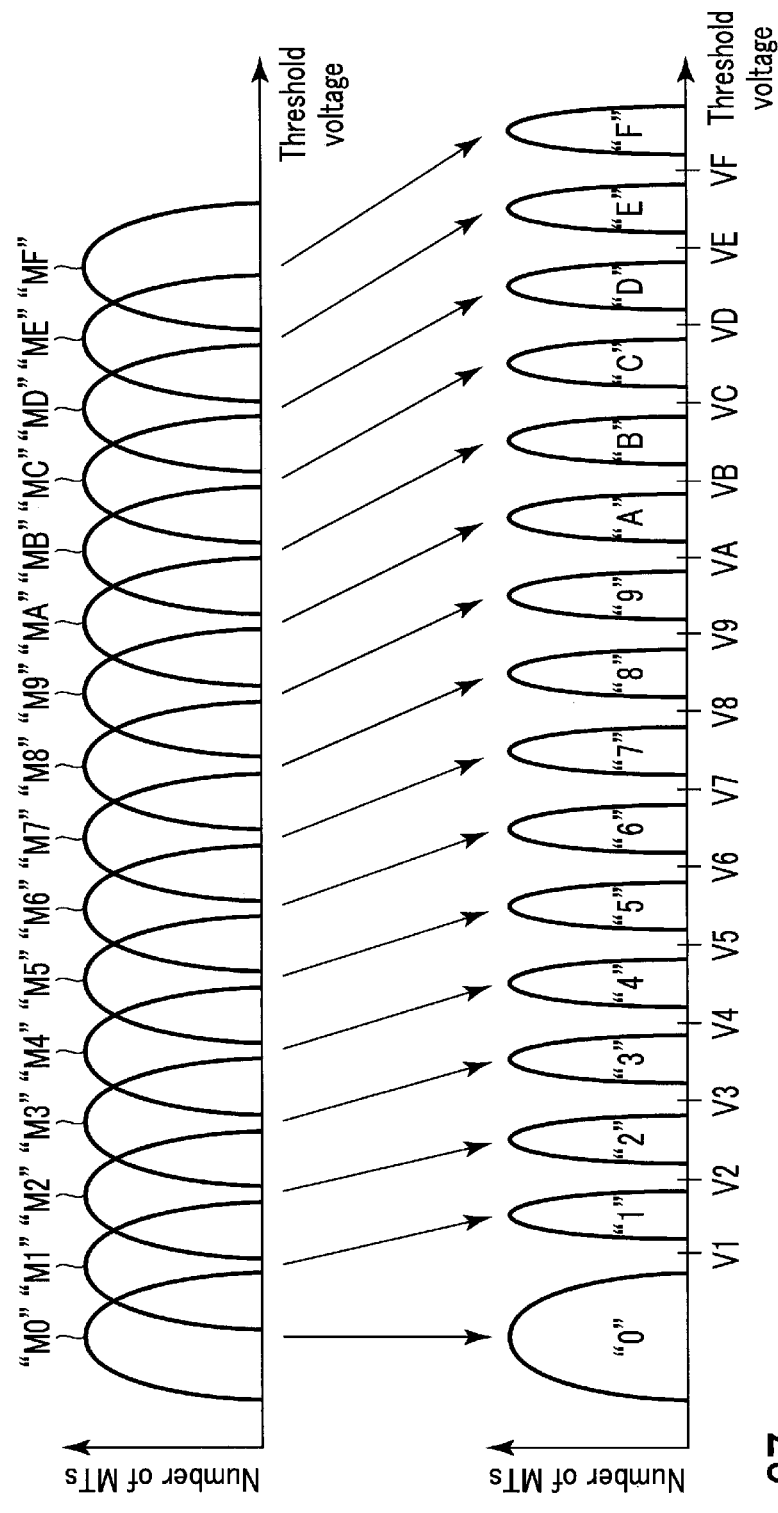

Next, the semiconductor storage device 10 executes the fine program operation in which a word line WL(i−1) is selected, and the string unit SUj is selected (step S203). Specifically, the semiconductor storage device 10 executes the fine program operation in which the word line WL0 is selected, and the string unit SU0 is selected. FIG. 37 shows details of the fine program operation. FIG. 37 shows a change in threshold distribution of the memory cell according to the fine program operation.

As shown in FIG. 37, the semiconductor storage device 10 executes the fine program operation based on the 4 pages data input from the controller 20.

In the fine program operation, as in the foggy program operation, the sequencer 14 uses voltages V1, V2, V3, V4, V5, V6, V7, V8, V9, VA, VB, VC, VD, VE, and VF as verify voltages. When the fine program operation is executed, the threshold voltage of the memory cell transistor MT increases based on data to be written, and 16 thin threshold distributions are formed from 16 wide threshold distributions. For example, a threshold distribution at the "0" level is formed from a threshold distribution at the "M0" level, a threshold distribution at a "1" level is formed from a threshold distribution at the "M1" level, and a threshold distribution at a "2" level is formed from a threshold distribution at the "M2" level. The same applies hereinafter.

Returning to FIG. 35, when j=3 is not satisfied once the fine program operation in step S203 is ended (step S204, No), the variable j is incremented (step S205), and step S202 and subsequent operations are repeated. On the other hand, when j=3 (step S204, Yes), the value of the variable i is continuously confirmed (step S206).

When i=7 is not satisfied (step S206, No), the operation returns to step S201. After the variable i is incremented, and, at the same time, the variable j is reset, step S202 and subsequent operations are repeated. On the other hand, when i=7 (step S206, Yes), the semiconductor storage device 10 executes the fine program operation in which a word line WLi (i=7) is selected, and the string units SU0 to SU3 are selected in sequence (step S207).

Figure 38:
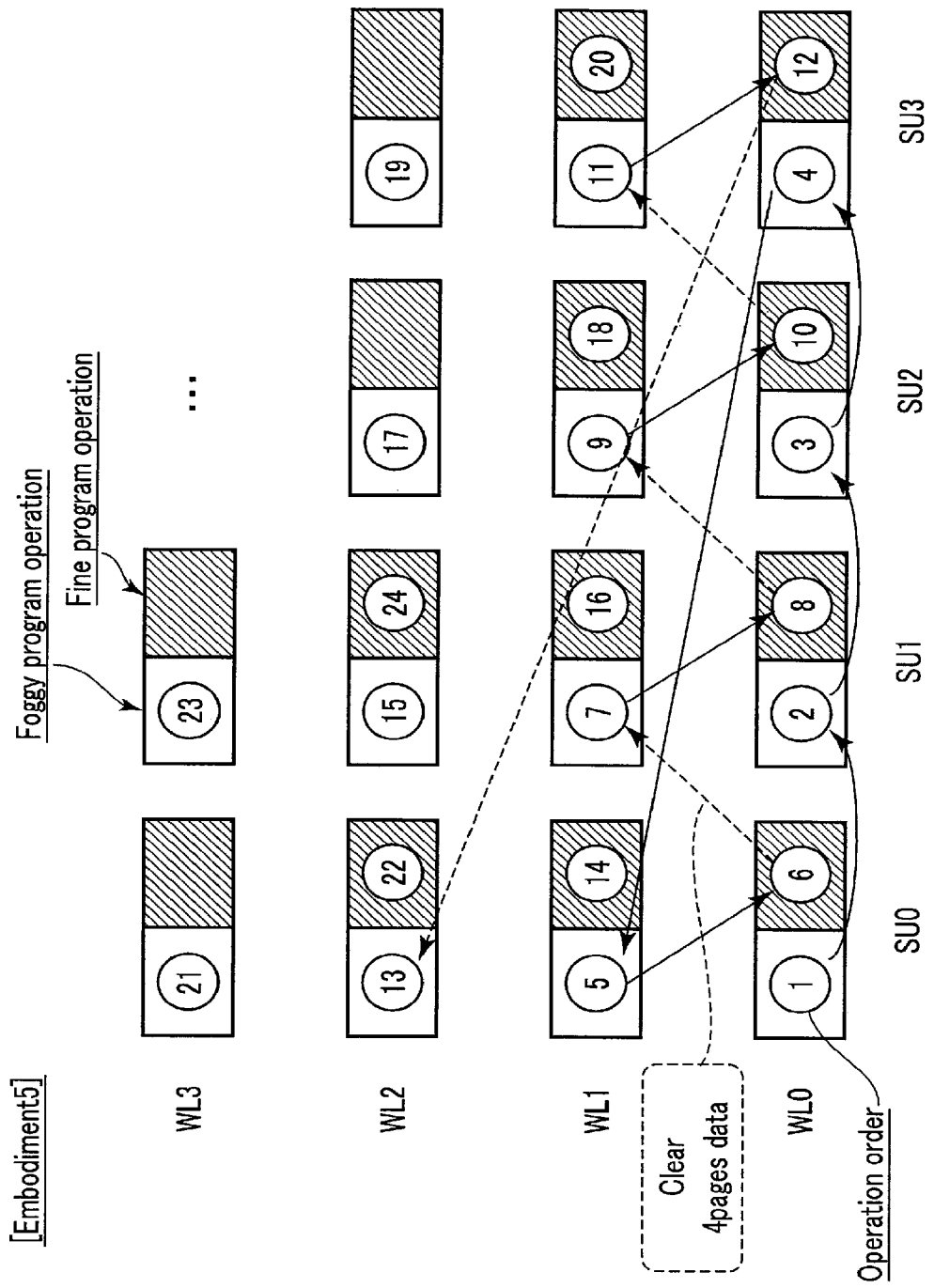
FIG. 38 is a view showing a writing order in the program operation in the memory system according to the fifth embodiment.

FIG. 38 shows a writing order in each program operation described above. FIG. 38 shows combinations of the word lines WL and the string units SU in a certain block BLK. FIG. 38 further shows a frame (background: white) corresponding to the foggy program operation and a frame (background: diagonal lines) corresponding to the fine program operation in each combination and displays, in each frame, the number representing the order for executing the operation. The dashed arrows shown in FIG. 38 show that four page write data retained in any of the page clusters CL is cleared from the inside of the controller 20 according to the operation at the start point of the arrow, and a memory region of the RAM 22 is released.

As shown in FIG. 38, the semiconductor storage device 10 executes the foggy program operation with respect to each of the string units SU, in which the word line WL0 is selected, and then alternately executes the foggy program operation in which the word line WL1 is selected and the fine program operation in which the word line WL0 is selected. This operation is executed such that the string units SU0 to SU3 are selected in sequence. The memory system 1 executes the fine program operation in which the word line WL0 and the string unit SU3 are selected and then alternately executes the foggy program operation in which the word line WL2 is selected and the fine program operation in which the word line WL1 is selected. The same applies hereinafter.

In such a write operation, for example, the 4 pages data to be written to the memory cell corresponding to the word line WL0 and the string unit SU0 is retained in the regions PG0 to PG3 of the page cluster CL0. The 4 pages data is cleared from the controller 20 after the controller 20 instructs the fine program operation with respect to the word line WL0 and the string unit SU0, and the memory region in the RAM 22 is released. Namely, the RAM 22 retains the 4 pages data, which is to be written to the memory cell corresponding to the word line WL0 and the string unit SU0, in the page cluster CL0 until the first operation shown in FIG. 38 to the sixth operation are executed. During this period, the RAM 22 retains the 4 pages data, which are to be used in the second to fifth operations, for example, in the page clusters CL1 to CL4.

<Regarding Command Sequence>

Next, details of command sequences and waveforms in the above write operations will be described using FIGS. 39 to 41. FIGS. 39 and 40 show respective command sequences in the foggy program operation and the fine program operation and show an input/output signal I/O input to the semiconductor storage device 10. FIG. 41 shows the waveforms of the foggy program operation and the fine program operation and shows a voltage applied to the selected word line WL.

First, the command sequence of the foggy program operation will be described. In the following description, a combination of commands shown in FIG. 39 is referred to as a fifth command set.

As shown in FIG. 39, in the foggy program operation the controller 20 first transmits a command "xzh" to the semiconductor storage device 10. The command "xzh" is a command instructing the semiconductor storage device 10 to execute the foggy program operation. The controller 20 then transmits a command "01h", a command "80h", address information ADD, lower page data DAT1, and a command "xyh" to the semiconductor storage device 10 in sequence. When the command "xyh" is stored in a command register 12, a sequencer 14 sets a ready/busy signal RBn to an "L" level to transfer write data retained in a latch circuit XDL to, for example, a latch circuit ADL.

When the ready/busy signal RBn is set to an "H" level, the controller 20 transmits the command "xzh", a command "02h", the command "80h", the address information ADD, middle page data DAT2, and the command "xyh" to the semiconductor storage device 10 in sequence. When the command "xyh" is stored in the command register 12, the sequencer 14 sets the ready/busy signal RBn to the "L" level to transfer the write data retained in the latch circuit XDL to, for example, a latch circuit BDL.

When the ready/busy signal RBn is set to the "H" level, the controller 20 transmits the command "xzh" a command "03h", the command "80h", the address information ADD, upper page data DAT3, and the command "xyh" to the semiconductor storage device 10 in sequence. When the command "xyh" is stored in the command register 12, the sequencer 14 sets the ready/busy signal RBn to the "L" level to transfer the write data retained in the latch circuit XDL to, for example, a latch circuit CDL.

When the ready/busy signal RBn is set to the "H" level, the controller 20 transmits the command "xzh" a command "04h", the command "80h", the address information ADD, top page data DAT4, and a command "10h" to the semiconductor storage device 10 in sequence.

When the command "10h" is stored in the command register 12, the sequencer 14 sets the ready/busy signal RBn to the "L" level to transfer the write data retained in the latch circuit XDL to, for example, a latch circuit DDL, and thus to execute the foggy program operation. The illustrated tProg (Foggy) corresponds to a processing period of the foggy program operation. FIG. 41 shows an example of the waveform of the foggy program operation. As shown in FIG. 41, the waveform of the foggy program operation is similar to the waveform of the first program operation described using FIG. 12 in the first embodiment, and therefore description thereof is omitted.

Next, the command sequence of the fine program operation will be described. In the following description, a combination of commands shown in FIG. 40 is referred to as a sixth command set.

As shown in FIG. 40, the command sequence of the fine program operation is similar to the command sequence of the foggy program operation described using FIG. 39, except that the command "xzh" is removed.

When the command "10h" as the last command shown in FIG. 40 is stored in the command register 12, the sequencer 14 sets the ready/busy signal RBn to the "L" level to execute the fine program operation. The illustrated tProg (Fine) corresponds to a processing period of the fine program operation. tProg (Fine) is longer than tProg (Foggy). FIG. 41 shows an example of the waveform of the fine program operation. As shown in FIG. 41, the waveform of the fine program operation is similar to the waveform of the second program operation described using FIG. 12 in the first embodiment, except that the waveform corresponding to the internal data load (IDL) is removed, and therefore description thereof is omitted.

Figure 42:
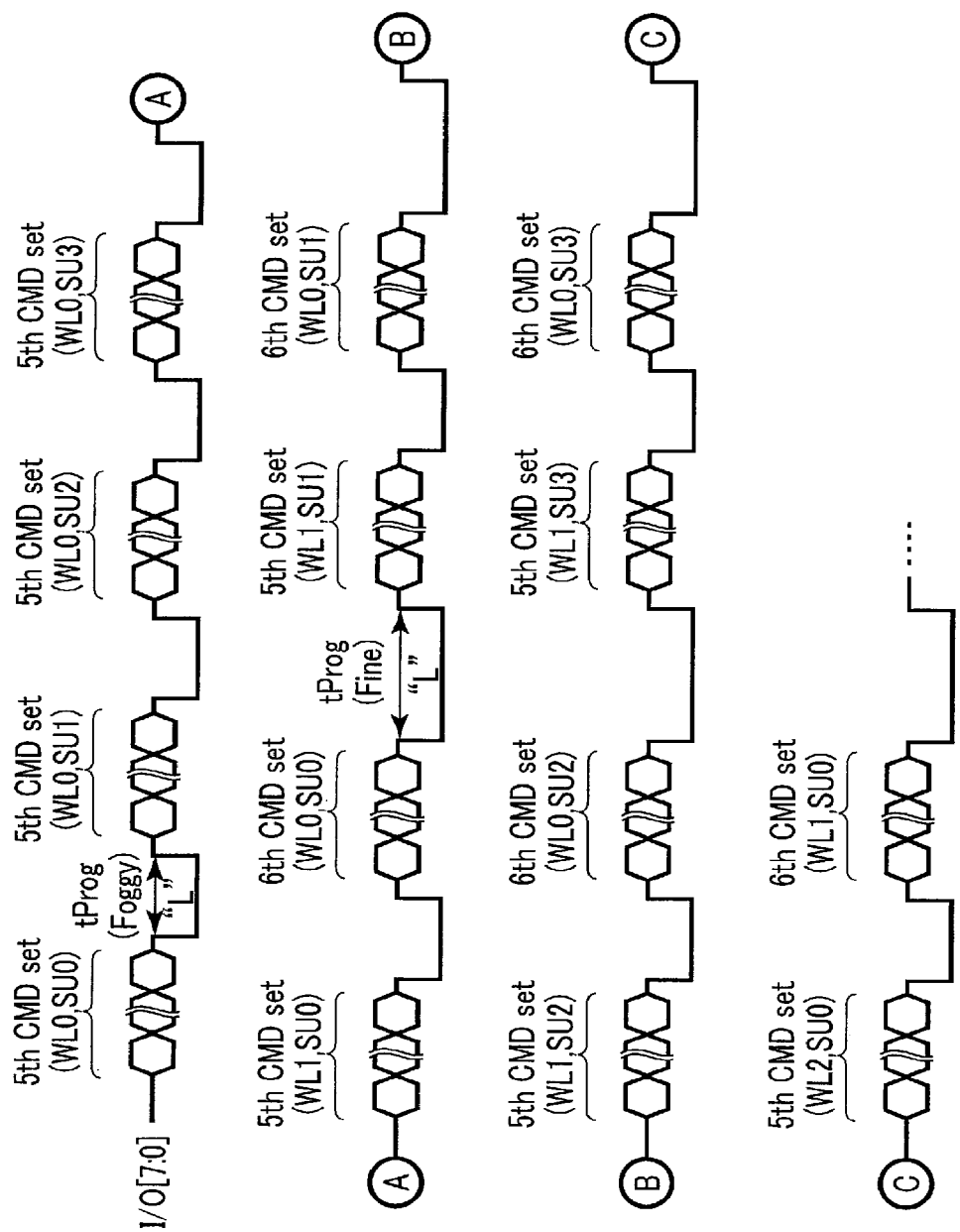
FIG. 42 is a command sequence of the program operation in the memory system according to the fifth embodiment.

As described above, in the foggy program operation and the fine program operation, the fifth and sixth command sets are used, respectively. Accordingly, the operation described using FIG. 35 is achieved by the command sequence shown in FIG. 42. FIG. 42 shows a command sequence corresponding to the operation described using FIG. 35 and shows the input/output signal I/O input to the semiconductor storage device 10.

As shown in FIG. 42, the controller 20 first transmits the fifth command set in which the word line WL0 and each of the string units SU are selected to the semiconductor storage device 10 and makes the semiconductor storage device 10 execute, in sequence, the foggy program operation in which the word line WL0 and each of the string units SU are selected (step S201).

When the foggy program operation in which the word line WL0 is selected is ended, the controller 20 transmits the fifth command set in which the word line WL1 and the string unit SU0 are selected to the semiconductor storage device 10 and makes the semiconductor storage device 10 execute the foggy program operation in which the word line WL1 and the string unit SU0 are selected (step S202).

When the foggy program operation in which the word line WL1 and the string unit SU0 are selected is ended, the controller 20 transmits the sixth command set in which the word line WL0 and the string unit SU0 are selected to the semiconductor storage device 10 and makes the semiconductor storage device 10 execute the fine program operation in which the word line WL0 and the string unit SU0 are selected (step S203).

Although description of the subsequent command sequence is omitted, as shown in FIG. 42, the controller 20 appropriately selects a suitable command set and instructs the semiconductor storage device 10 to execute various program operations.

[5-3] Effects of Fifth Embodiment

The memory system 1 according to the present embodiment can control the storage capacity of the RAM 22. Hereinafter, the details of the effects of fifth embodiment will be described.

There has been known a method of writing data of a plurality of bits to a memory cell while the program operation is divisionally executed twice, once with the foggy program operation, and once with the fine program operation. In both the foggy program operation and the fine program operation, the data of a plurality of bits to be written to the memory cell is used. When such a writing method is applied to a memory system in which each of the blocks BLK comprises the string units SU, as the writing order in the foggy program operation and the fine program operation, the order shown in FIG. 43 is considered.

Figure 43:
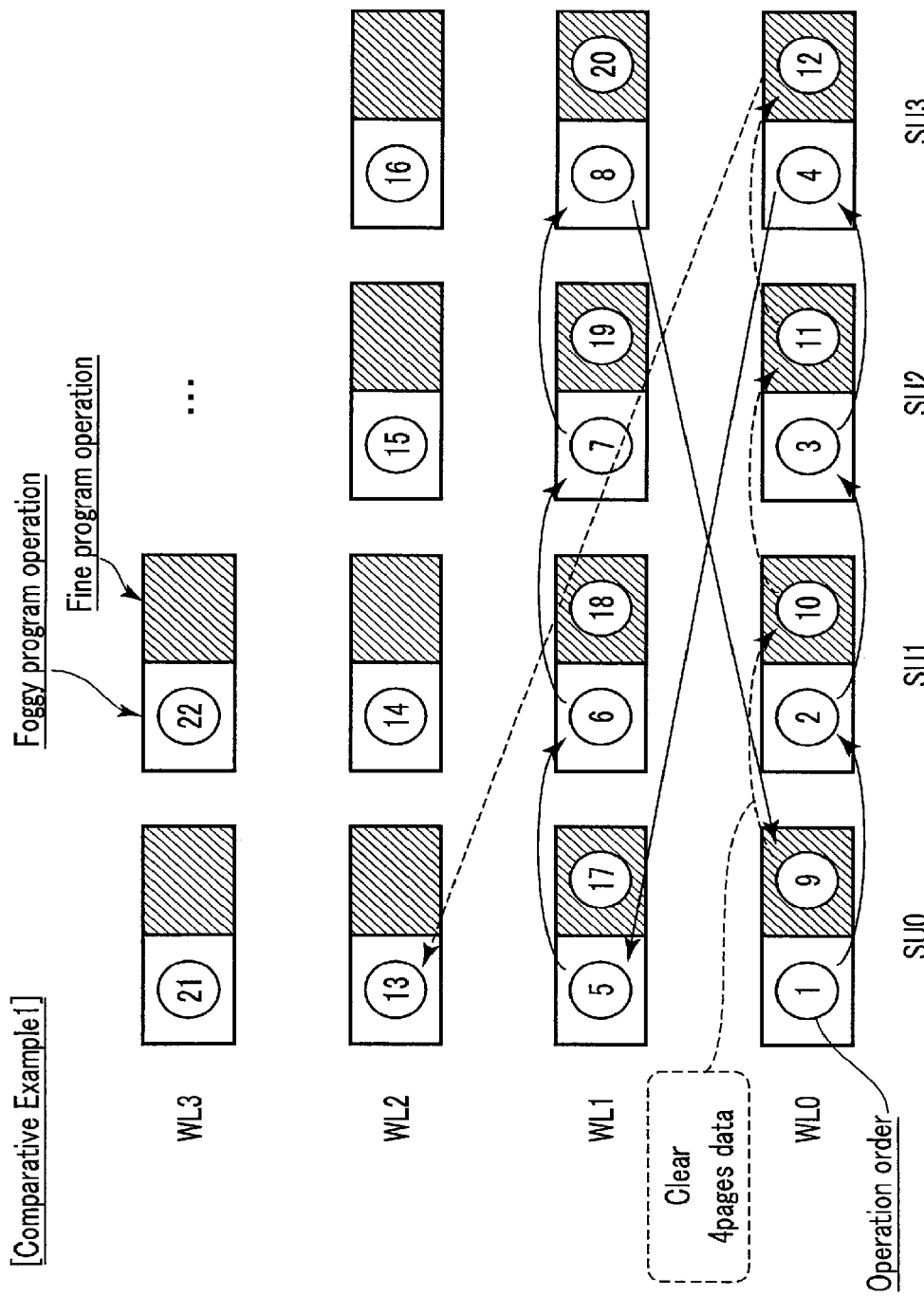
FIG. 43 is a view showing a writing order in a program operation in a memory system according to a comparative example of the fifth embodiment.

In a comparative example (first comparative example) of the fifth embodiment shown in FIG. 43, after the foggy program operation in which the word line WL0 and each of the string units SU are selected, the foggy program operation in which the word line WL1 and each of the string units SU are selected is executed. After the foggy program operation in which the word line WL1 and each of the string units SU are selected is executed, the fine program operation in which the word line WL0 and each of the string units SU are selected is executed. Namely, in a memory system in the first comparative example, the order for executing the foggy program operation and the fine program operation is managed in the unit of word line WL.

On the other hand, in this embodiment, as shown in FIG. 38, after the foggy program operation in which the word line WL0 and each of the string units SU are selected, the foggy program operation in which the word line WL1 and the string unit SU0 are selected is executed. After the foggy program operation in which the word line WL1 and the string unit SU0 are selected is executed, the fine program operation in which the word line WL0 and the string unit SU0 are selected is executed. As described above, in this embodiment, the memory system 1 sequentially executes the fine program operation from the string unit SU in which the foggy program operation with respect to the adjacent word line WL is ended.

Figure 44:
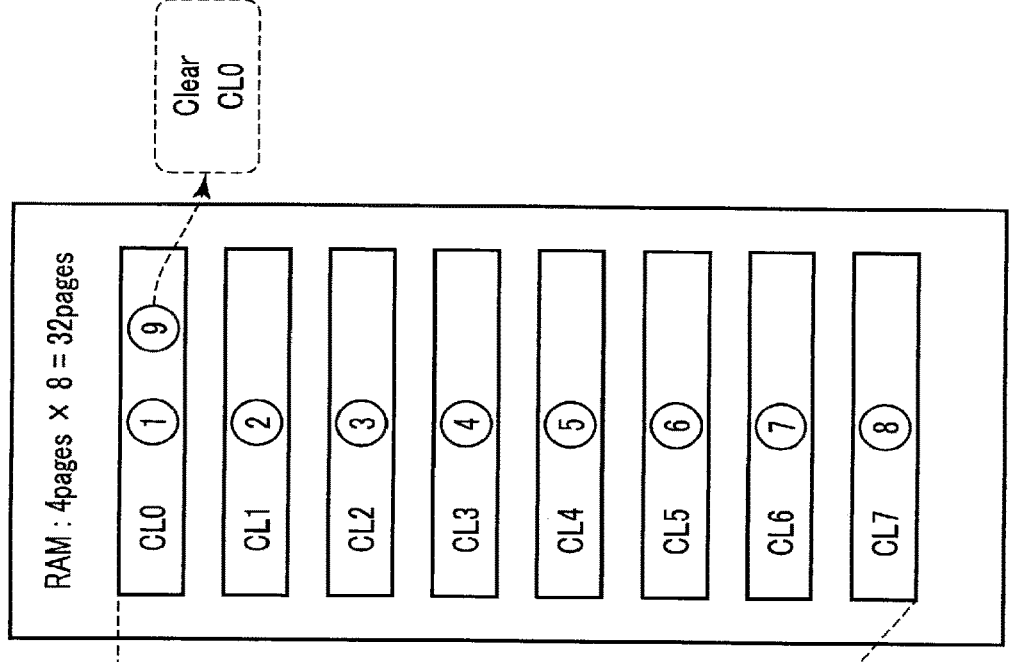
FIG. 44 is a view for comparing a storage capacity of RAM between a controller according to the fifth embodiment and a controller according to the comparative example.
Figure 44:
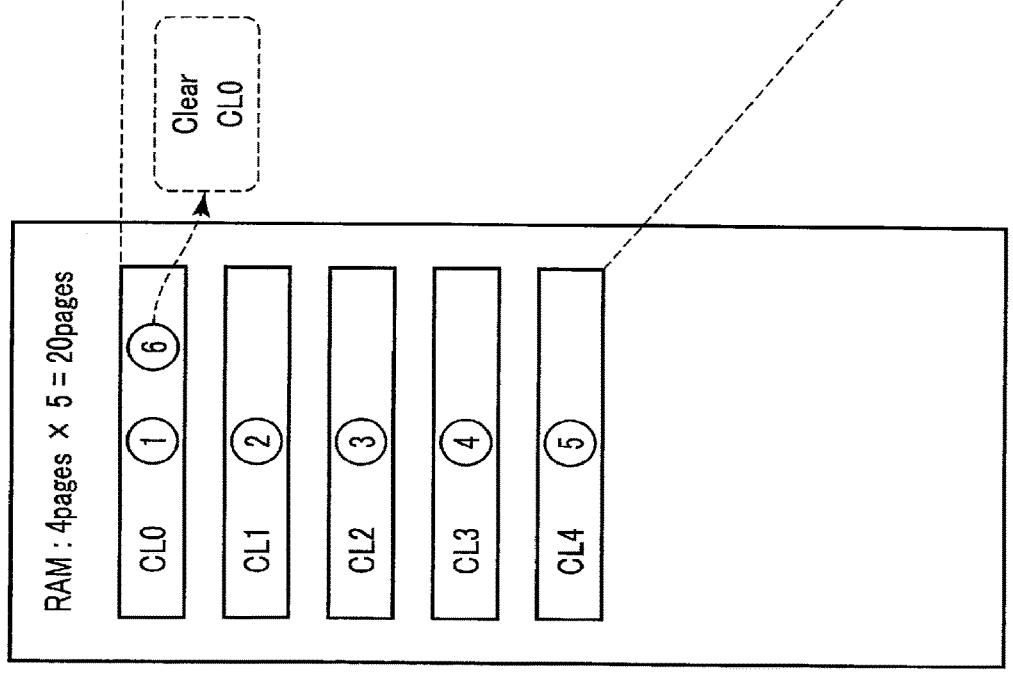

From the above, in this embodiment and the first comparative example, the minimum required storage capacity of the RAM 22 is one shown in FIG. 44. FIG. 44 shows an example of the configuration of the RAM 22 in each of this embodiment and the first comparative example.

As shown in FIGS. 43 and 44, in the first comparative example, the RAM 22 clears four page write data, which is to be written to the memory cell corresponding to the word line WL0 and the string unit SU0, according to the ninth operation and releases the memory region (for example, the page cluster CL0). Considering the fact that the RAM 22 retains four page write data in the second to eighth operations at this time, the minimum required storage capacity of the RAM 22 in the first comparative example is 32 pages (corresponding to eight page clusters CL).

On the other hand, as shown in FIGS. 38 and 44, in this embodiment, the RAM 22 clears the four page write data, which is to be written to the memory cell corresponding to the word line WL0 and the string unit SU0, according to the sixth operation and releases the memory region (for example, the page cluster CL0). Considering the fact that the RAM 22 retains four page write data in the second to fifth operations at this time, the minimum required storage capacity of the RAM 22 in this embodiment is 20 pages (corresponding to five page clusters CL).

As described above, in the program operation in the memory system 1 according to this embodiment, when the period by which the fine program operation is executed is reduced, the period during which the RAM 22 retains write data is reduced, and therefore, the consumption of the RAM 22 can be controlled. Consequently, the memory system 1 according to this embodiment can control the storage capacity of the RAM 22.

Figure 45:
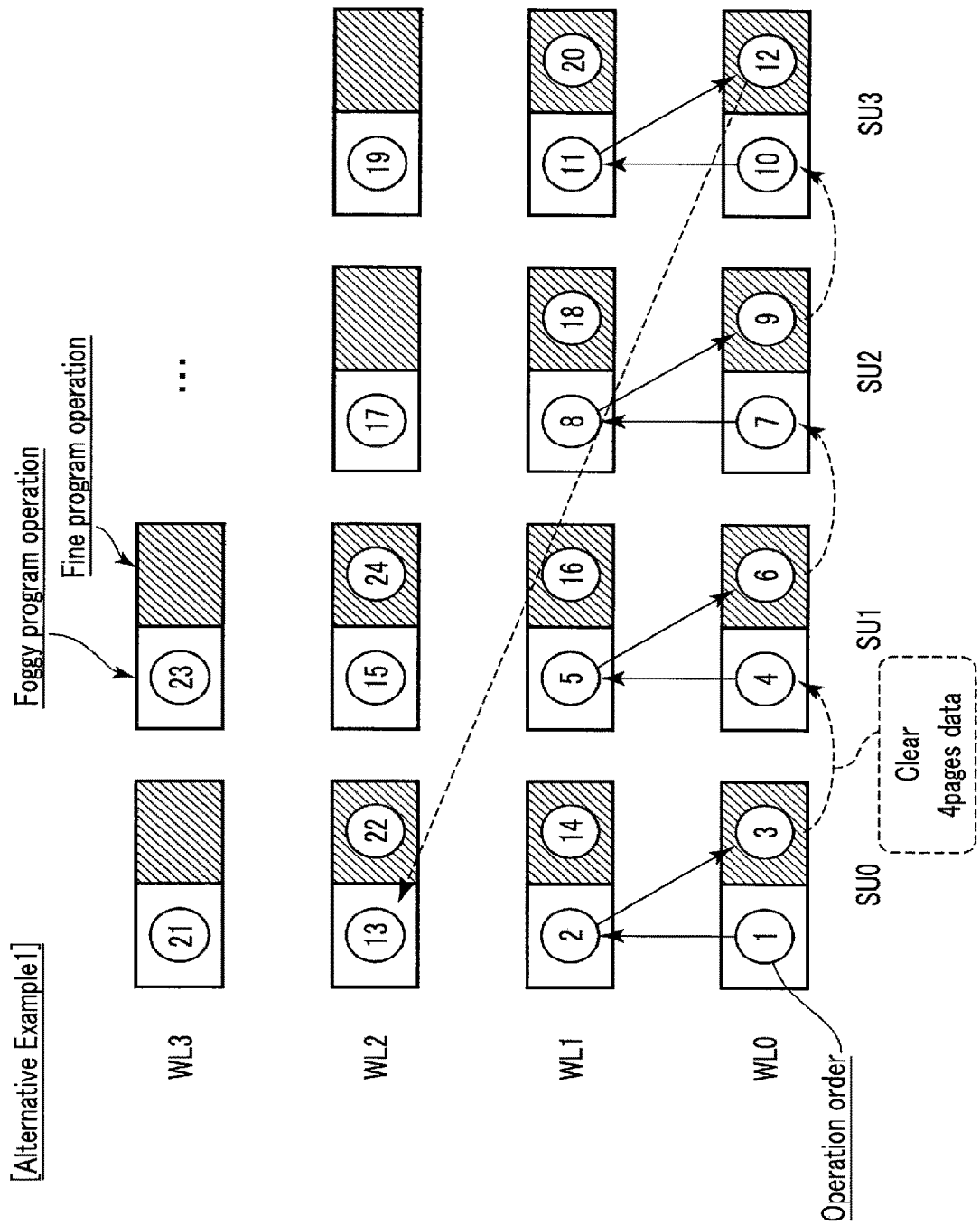
FIG. 45 is a view showing the writing order in the program operation in the memory system according to a variation of the fifth embodiment.

The writing order where the period by which the fine program operation is executed is reduced may be the order shown in FIG. 45. In a variation (first variation) of the fifth embodiment shown in FIG. 45, after the foggy program operation in which the word line WL0 and the string unit SU0 are selected, the foggy program operation in which the word line WL1 and the string unit SU0 are selected is executed. After the foggy program operation in which the word line WL1 and the string unit SU0 are selected is executed, the fine program operation in which the word line WL0 and the string unit SU0 are selected is executed. The writing order continues until the fine program operation in which the word line WL0 and the string unit SU3 are selected is executed, the subsequent writing order is similar to FIG. 38 described in this embodiment. The memory system 1 can similarly control the storage capacity of the RAM 22 when such a writing order is applied.

[6] Sixth Embodiment

Next, a memory system 1 according to the sixth embodiment will be described. The present embodiment is a combination of the writing method described in the first embodiment and the writing order described in the fifth embodiment. Hereinafter, differences from the first to fifth embodiments will be described.

[6-1] Write Operation of Memory System 1

<Regarding Flow of Write Operation>

First, the write operation of the memory system 1 will be described. In the write operation of the memory system 1 according to this embodiment, in a semiconductor storage device 10 in which each block BLK includes a plurality of string units, the first and second program operations described in the first embodiment are executed in the order described in the fifth embodiment. In the write operation to be described below, as in the first embodiment, coding conversion from a 4-4-3-4 code into a 1-2-4-8 code is executed, for example.

The writing order in the first and second program operations in this embodiment is shown in FIG. 46. FIG. 46 shows combinations of word lines WL and string units SU in a certain block BLK. FIG. 46 further shows a frame (background: white) corresponding to the first program operation and a frame (background: diagonal lines) corresponding to the second program operation in each combination and displays, in each frame, the number representing the order for executing the operation. The solid arrows shown in FIG. 46 show that two page write data (lower and middle page data) retained by a RAM 22 is cleared from the inside of a controller 20 according to the operation at the start point of the arrow, and a memory region of the RAM 22 is released. Similarly, the dashed arrows show that two page write data (upper and top page data) retained by the RAM 22 is cleared from the inside of the controller 20 according to the operation at the start point of the arrow, and the memory region of the RAM 22 is released.

As shown in FIG. 46, the writing order in various program operations in this embodiment is similar to the writing order where the foggy program operation and the fine program operation described in the fifth embodiment are replaced respectively with the first program operation and the second program operation described in the first embodiment. In such a program operation, of 4 pages data to be written to a memory cell corresponding to a word line WL0 and a string unit SU0, the RAM 22 retains the lower and middle page data until the first operation shown in FIG. 46 and retains the upper and top page data from the first operation shown in FIG. 46 to execution of the sixth operation. When the sixth operation is executed, the RAM 22 retains the upper and top page data of 4 pages data used in each of the second to fifth operations, for example.

<Regarding Command Sequence>

Figure 47:
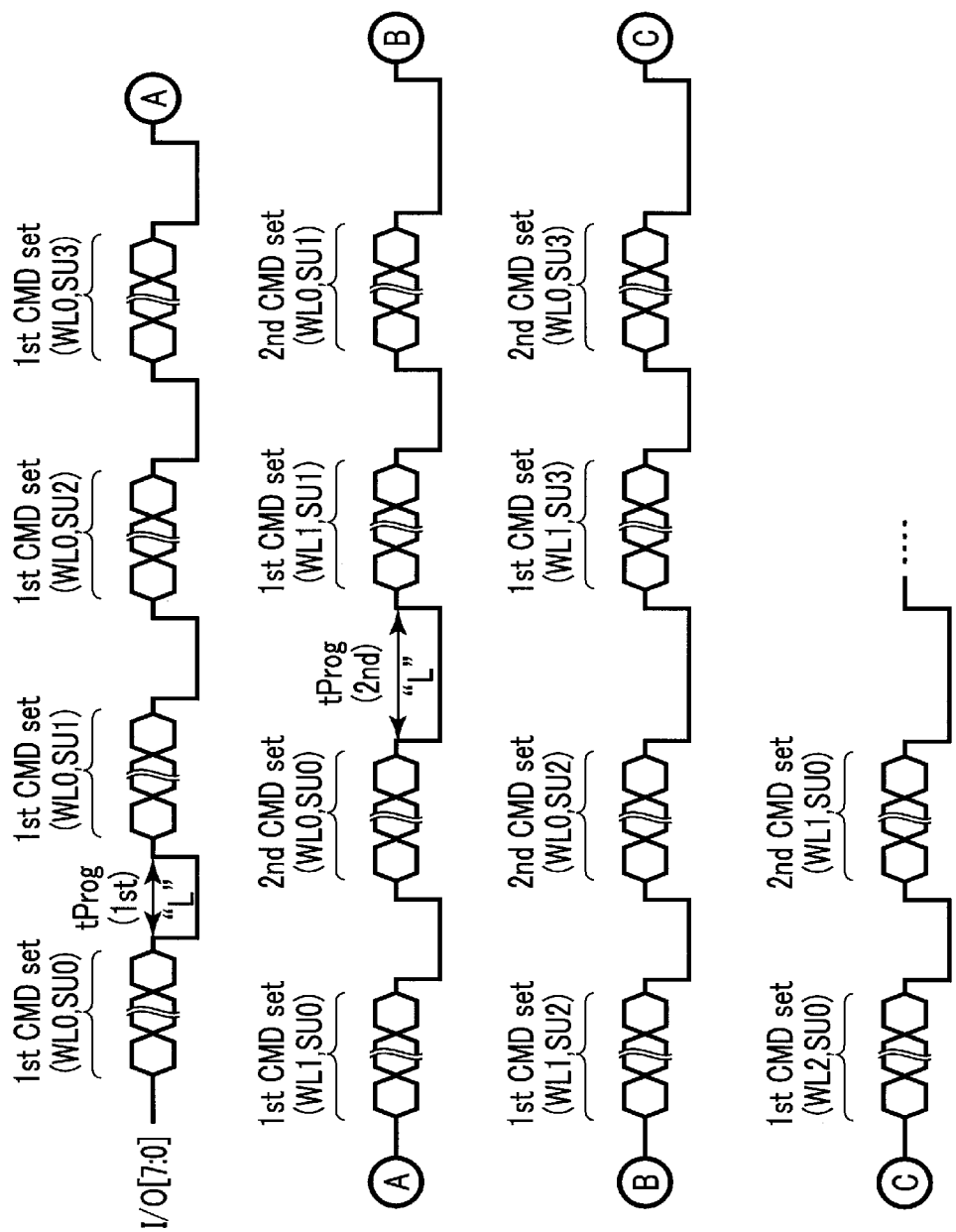
FIG. 47 is a command sequence of the program operation in the memory system according to the sixth embodiment.

Next, a command sequence in the above write operation will be described using FIG. 47. FIG. 47 shows a command sequence corresponding to the operation described using FIG. 46 and shows an input/output signal I/O input to the semiconductor storage device 10.

As shown in FIG. 47, the controller 20 first transmits a first command set in which the word line WL0 and each of the string units SU are selected to the semiconductor storage device 10 and makes the semiconductor storage device 10 execute, in sequence, the first program operation in which the word line WL0 and each of the string units SU are selected.

When the first program operation in which the word line WL0 is selected is ended, the controller 20 transmits the first command set in which the word line WL1 and the string unit SU0 are selected to the semiconductor storage device 10 and makes the semiconductor storage device 10 execute the first program operation in which the word line WL1 and the string unit SU0 are selected.

When the first program operation in which the word line WL1 and the string unit SU0 are selected is ended, the controller 20 transmits a second command set in which the word line WL0 and the string unit SU0 are selected to the semiconductor storage device 10 and makes the semiconductor storage device 10 execute the second program operation in which the word line WL0 and the string unit SU0 are selected.

Although description of the subsequent command sequence is omitted, as shown in FIG. 47, the controller 20 appropriately selects a suitable command set and instructs the semiconductor storage device 10 to execute various program operations.

[6-2] Effects of Sixth Embodiment

The memory system 1 according to the present embodiment can control the storage capacity of the RAM 22 as compared with the fifth embodiment. Hereinafter, the details of the effects of sixth embodiment will be described.

When the first and second program operations described in the first embodiment are applied to a memory system in which each of the blocks BLK comprises the string units SU, as the writing order in the first and second program operations, the order shown in FIG. 48 is considered.

The writing order in a comparative example (second comparative example) of the sixth embodiment shown in FIG. 48 is similar to one in which the writing orders in the foggy program operation and the fine program operation in the first comparative example described using FIG. 43 are replaced respectively with the first program operation and the second program operation described in the first embodiment.

On the other hand, the writing order in this embodiment is similar to one in which the writing orders in the foggy program operation and the fine program operation in the fifth embodiment described using FIG. 38 are replaced respectively with the first program operation and the second program operation.

From the above, in this embodiment and the second comparative example, the minimum required storage capacity of the RAM 22 is one shown in FIG. 49. FIG. 49 shows an example of the configuration of the RAM 22 in each of this embodiment and the second comparative example.

As shown in FIGS. 48 and 49, in the second comparative example, the RAM 22 clears two page write data (lower and middle page data) of four page write data, which is to be written to the memory cell corresponding to the word line WL0 and the string unit SU0, according to the first operation and releases the memory region. The RAM 22 clears the remaining two page write data (upper and top page data) according to the ninth operation and releases the memory region. Considering the fact that the RAM 22 retains the two page write data (upper and top page data) of four page write data in the second to eighth operations at this time, the minimum required storage capacity of the RAM 22 in the second comparative example is 18 pages.

On the other hand, as shown in FIGS. 46 and 49, in the this embodiment, the RAM 22 clears two page write data (lower and middle page data) of four page write data, which is to be written to the memory cell corresponding to the word line WL0 and the string unit SU0, according to the first operation and releases the memory region. The RAM 22 clears the remaining two page write data (upper and top page data) according to the sixth operation and releases the memory region. Considering the fact that the RAM 22 retains the two page write data (upper and top page data) in the second to fifth operations at this time, the minimum required storage capacity of the RAM 22 in this embodiment is 12 pages.

As described above, in the write operation in the memory system 1 according to this embodiment, when the period until the second program operation is executed is reduced, the period during which the RAM 22 retains write data is reduced, and therefore, the consumption of the RAM 22 can be controlled. Consequently, the memory system 1 according to this embodiment can control the storage capacity of the RAM 22.

The writing order where the period until the fine program operation is executed is reduced may be the order shown in FIG. 50. The writing order in a variation (second variation) of the sixth embodiment shown in FIG. 50 is similar to one in which the writing orders in the foggy program operation and the fine program operation in the first variation described using FIG. 45 are replaced respectively with the first program operation and the second program operation. The memory system 1 can similarly control the storage capacity of the RAM 22 when such a writing order is applied.

[7] Seventh Embodiment

Next, a memory system 1 according to the seventh embodiment will be described. The memory system 1 according to the present embodiment is a variation of the first embodiment, one page writing is executed in the first program operation, and one page IDL is executed in the second program operation. Hereinafter, differences from the first to sixth embodiments will be described.

[7-1] Write Operation of Memory System 1

First, the write operation of the memory system 1 will be described. In the write operation of the memory system 1 according to this embodiment, the data processing described using FIG. 7 in the first embodiment is applied to write data received from a host apparatus 30. Namely, in this embodiment, a controller 20 executes coding conversion from a 4-4-3-4 code into a 1-2-4-8 code, for example, with respect to the write data received from the host apparatus 30. According to this constitution, the memory system 1 can use IDL when 4-bit data is written while the write operation is divisionally performed twice. The memory system 1 executes one page writing in the first program operation and executes one page IDL in the second program operation.

Specifically, in the first program operation, the memory system 1 executes a one-page write operation based on 1 page data (lower page data) received by a semiconductor storage device 10 from the controller 20. In the second program operation, the memory system 1 executes a four-page write operation based on 3 pages data (middle, upper, and top page data) received by the semiconductor storage device 10 from the controller 20 and the 1 page data (lower page data) read by IDL.

Hereinafter, outlines of the first and second program operations in the memory system 1 of this embodiment will be described.

Figure 51:
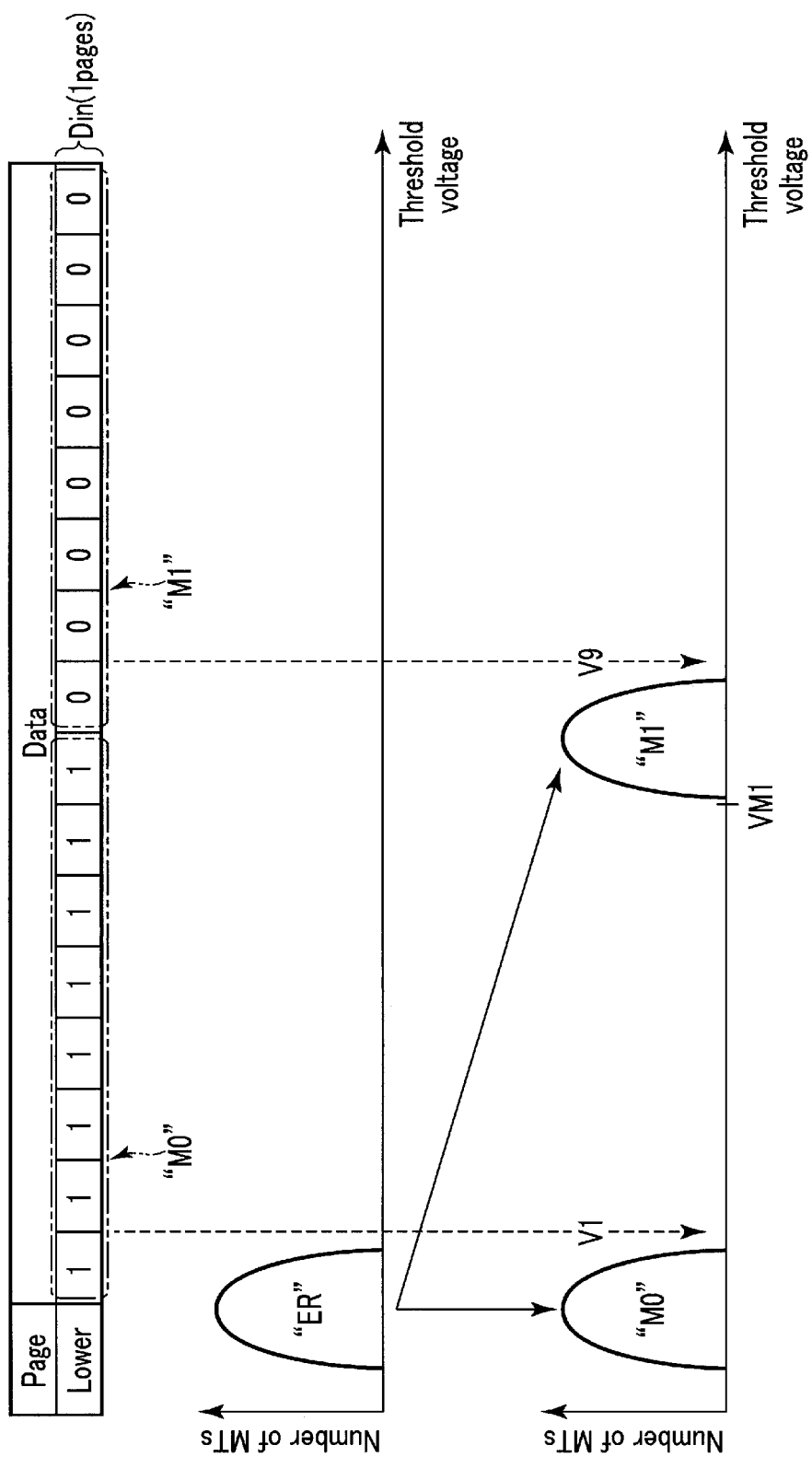
FIGS. 51 and 52 are views showing a change in threshold distribution in a program operation in a semiconductor storage device according to a seventh embodiment.

First, the outline of the first program operation will be described using FIG. 51. FIG. 51 shows a change in threshold distribution of a memory cell according to the first program operation. As shown in FIG. 51, in the first program operation the semiconductor storage device 10 executes a one-page write operation based on the lower page data input from the controller 20.

A threshold voltage of a memory cell transistor MT before execution of the first program operation is distributed at an "ER" level. The threshold voltage at the "ER" level is less than a voltage V1, and as in the "0" level described above, the threshold voltage at the "ER" level corresponds to an erase state of the memory cell transistor MT.

In the first program operation, a sequencer 14 uses a voltage VM1 as a verify voltage. The voltage VM1 is used when "0" ("lower bit") data is written and is not less than a voltage V1 and less than a voltage V9.

When the first program operation is executed, the threshold voltage of the memory cell transistor MT increases based on data to be written, and two threshold distributions are formed. An "M0" level shown in FIG. 51 is formed by the memory cell transistors MT in which "1" data is written. An "M1" level is formed by the memory cell transistors MT in which "0" data is written.

The threshold voltage at the "M0" level is less than the voltage V1, and as in the "0" level and the "ER" level described above, the threshold voltage at the "M0" level corresponds to the erase state of the memory cell transistor MT. Namely, in the first program operation, the increase in threshold voltage is suppressed in the memory cell transistor MT in which the "1" data is written. A threshold voltage at the "M1" level is not less than the voltage VM1 and less than the voltage V9. Thus, the voltage VM1 used in verification in the first program operation is set such that the threshold voltage of the memory cell transistor MT having passed verification does not exceed a voltage V5.

Figure 52:
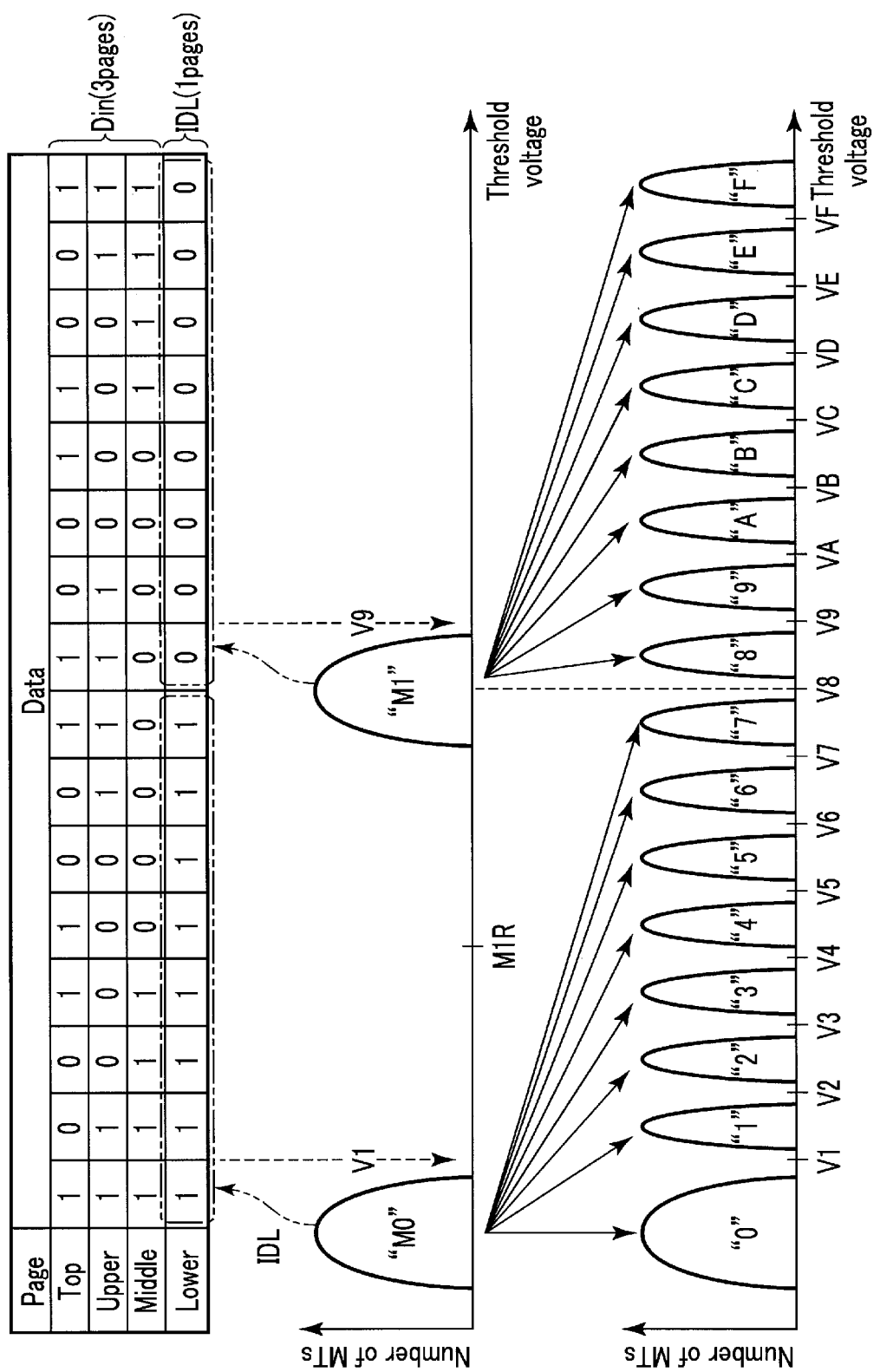

Next, the outline of the second program operation will be described using FIG. 52. FIG. 52 shows a change in threshold distribution of the memory cell according to the second program operation. As shown in FIG. 52, in the second program operation in this embodiment, the semiconductor storage device 10 first executes internal data load (IDL).

In the IDL in this embodiment, the sense amplifier module 17 executes read operation using a voltage M1R. The voltage M1R is not less than the voltage V1 and not more than the voltage VM1, and a sense amplifier part SA determines whether or not the threshold voltage of the memory cell transistor MT is less than the voltage M1R through the read operation using the voltage M1R.

Consequently, the "1" data and "0" written by the first program operation are restored in a latch circuit in a sense amplifier unit SAU.

The semiconductor storage device 10 executes a four-page write operation based on the lower page data read by IDL and the middle page data, the upper page data, and the top page data input from the controller 20.

In the second program operation, as in the first embodiment, the sequencer 14 uses voltages V1, V2, V3, V4, V5, V6, V7, V8, V9, VA, VB, VC, VD, VE, and VF as verify voltages. When the second program operation is executed, the threshold voltage of the memory cell transistor MT increases based on data to be written, and 16 threshold distributions are formed from two levels. For example, threshold distributions at the "0" level, "1" level, "2" level, "3" level, "4" level, "5" level, "6" level, and "7" level are formed from a threshold distribution at the "M0" level. Threshold distributions at the "8" level, "9" level, "A" level, "B" level, "C" level, "D" level, "E" level, and "F" level are formed from a threshold distribution at the "M1" level.

[7-2] Effects of Seventh Embodiment

The memory system 1 according to this embodiment can improve reliability of written data. Hereinafter, the details of the effects of seventh embodiment will be described.

In the memory system 1 according to this embodiment, as in the first embodiment, the controller 20 applies data processing including code conversion to write data received from the host apparatus 30. In this embodiment, in the first program operation the controller 20 transmits 1 page data to the semiconductor storage device 10, and the semiconductor storage device 10 writes 1 page data including the lower bit after code conversion Then, in the second program operation, the controller 20 transmits 3 pages data, including the middle, upper, and top bits after code conversion, to the semiconductor storage device 10, and the semiconductor storage device 10 writes data of four pages in total to the memory cell, based on the 1 page data read from the memory cell by the semiconductor storage device 10 through IDL and including the lower bit after code conversion and the 3 pages data received from the controller 20 and including the middle, upper, and top bits after code conversion.

Consequently, the memory system 1 according to this embodiment can execute write operation in which the 4 pages data is written divisionally twice, as in the first embodiment. In this embodiment, since the 1 page data is written in the first program operation, by virtue of the subsequent second program operation, an influence of an initial fall of a threshold voltage occurring due to data writing corresponding to one bit and an influence of a parasitic capacitance between memory cells can be ignored in a threshold distribution to be finally obtained. Accordingly, in the memory system 1 according to this embodiment, since a spread of the threshold distribution can be suppressed, the reliability of data can be improved.

In the memory system 1 according to this embodiment, in the second program operation, data of the lower bit after code conversion written by the first program operation is restored by being read from the memory cell by IDL. Namely, the controller 20 can clear the 1 page data used in the first program operation after transmitting the 1 page data to the semiconductor storage device 10.

Consequently, the controller 20 can execute the above write operation if the storage capacity of the RAM 22 is at least seven pages. Namely, in the memory system 1 according to this embodiment, since the storage capacity of the RAM 22 can be controlled, the circuit area of the controller 20 can be controlled.

[8] Variations

The semiconductor storage device 10 according to the above embodiment includes a first memory cell capable of storing n-bit data (n is a natural number not less than 4). When receiving first data, including first and second bits <Lower/Middle> of the n-bit data, from a controller 20, the semiconductor storage device 10 writes the received first data to the first memory cell. After receiving the first data, when the semiconductor storage device receives second data including third and fourth bits <Upper/Top> of the n-bit data, the semiconductor storage device reads the first and second bits from the first memory cell <IDL, FIG. 10> and writes the n-bit data to the first memory cell based on the read first and second bits and the received second data.

According to this constitution, the reliability of the read data can be improved.

The configuration of the memory system 1 is not limited thereto, and various aspects can be taken. For example, as the memory system 1 according to the above embodiment, the memory system 1 in which the single controller 20 and the single semiconductor storage device 10 are combined has been described as one example; however, this invention is not limited thereto. For example, with respect to the single controller 20, a plurality of the semiconductor storage devices 10 may be provided. In this case, the storage capacity of the RAM 22 of the controller 20 changes based on the number of the semiconductor storage devices 10. For example, in the case of the memory system 1 including the two semiconductor storage devices 10, in order to execute the write operation in the first embodiment, the RAM 22 of the controller 20 is configured such that data of ten pages can be retained.

In the write operation described in the above embodiment, data retained in the RAM 22 and the latch circuit of the sense amplifier unit SAU may not be cleared after end of desired operation. For example, when the region PG and the latch circuit are used in the subsequent operation, they are used by overwriting of data. Also in such case, the operation in the above embodiment can be achieved.

In the write operation described in the above embodiment, although the case where data is transferred for each four pages from the host apparatus 30 to the controller 20 has been described as an example, this invention is not limited thereto. For example, when the capacity of the buffer memory 24 of the controller 20 is sufficient, a larger amount of write data is retained, and the write operation may be executed sequentially. Although the case where the 4 pages data retained in the buffer memory 24 is collectively transferred to the region PG of the RAM 22 has been described as an example, this invention is not limited thereto. For example, if 1 page data is accumulated in the buffer memory 24, the data may be sequentially transferred to the region PG of the RAM 22.

In the write operation described in the above embodiment, when the controller 20 executes coding conversion of write data, although the case where the 4-4-3-4 code is applied as coding before conversion into the 1-2-4-8 code has been described as an example, this invention is not limited thereto. As coding used before coding conversion, all other coding can be used.

In the fifth embodiment, although the case where the 4-4-3-4 code is applied to the write data has been described as an example, this invention is not limited thereto. As coding used in the fifth embodiment, all other coding can be used.

In the sixth embodiment, although the case where the writing method described in the first embodiment and the writing order described in the fifth embodiment are combined has been described as an example, this invention is not limited thereto. For example, the writing method described in the second to fourth embodiments or seventh embodiment and the writing order described in the fifth embodiment may be combined.

In the fifth and sixth embodiments, although each block BLK includes the four string units SU, this invention is not limited thereto. For example, the number of the string units SU may be two, three, or five or more. The determination value of the variable j in step S204 and the determination value of the variable i in step S206 used in the description in the flow chart of FIG. 35 are just examples, and this invention is not limited thereto. These determination values are set based on the number of the string units SU corresponding to one block BLK and the number of the word lines WL, for example.

For example, when the number of the string units SU is changed, the writing order is one where with respect to the flow chart of FIG. 35, the number of the string units SU to be written in steps S200 and S207 is changed, and the determination value of the variable j in step S204 is changed to (the number of the string units SU−1).

In the write operation described in the above embodiment, although the case where data of four bits is stored in the single memory cell has been described as an example, this invention is not limited thereto. For example, data of three bits or five or more bits may be stored in the single memory cell. Also in such a case, the operation described in the above embodiment can be achieved by selecting suitable coding.

The "connection in this specification means electrical connection and does not exclude the fact that another element is interposed in the connection.

In the above embodiments, the memory cell array 11 may be configured such that the memory cell transistor MT is three-dimensionally stacked above a semiconductor substrate. Such a configuration is described in, for example, "Three dimensional stacked nonvolatile semiconductor memory" in Specification of U.S. patent application Publication Ser. No. 12/407,403 filed on Mar. 19, 2009. In addition, such a configuration is described in Specification of U.S. patent application Publication Ser. No. 12/406,524 filed on Mar. 18, 2009, titled "THREE DIMENSIONAL STACKED NONVOLATILE SEMICONDUCTOR MEMORY", Specification of U.S. patent application Publication Ser. No. 12/679,991 filed on Mar. 25, 2010, titled "NONVOLATILE SEMICONDUCTOR STORAGE DEVICE AND METHOD OF MANUFACTURING THE SAME", and Specification of U.S. patent application Publication Ser. No. 12/532,030 filed on Mar. 23, 2009, titled "SEMICONDUCTOR MEMORY AND METHOD FOR MANUFACTURING SAME". The above patent applications are incorporated by reference herein in their entirety.

In the above embodiments, the block BLK may not be the data erase unit. For example, other erase operations are described in Specification of U.S. patent application Publication Ser. No. 13/235,389 filed on Sep. 18, 2011, titled "NONVOLATILE SEMICONDUCTOR STORAGE DEVICE" and Specification of U.S. patent application Publication Ser. No. 12/694,690 filed on Jan. 27, 2010, titled "NONVOLATILE SEMICONDUCTOR STORAGE DEVICE". The above patent applications are incorporated by reference herein in their entirety.

Regarding the details of tracking read in the above embodiments, it is possible to apply the method described in Specification of U.S. patent application Publication Ser. No. 13/544,147 filed on Jul. 9, 2012, titled "SEMICONDUCTOR STORAGE DEVICE WHICH STORES MULTIVALUED DATA". The contents of the above patent application are incorporated by reference herein in their entirety.

In each of the above embodiments, (1) in the read operation, the voltage applied to the word line selected in the read operation at the "A" level is between 0 V and 0.55 V, for example. The present invention is not limited thereto, and the voltage may be any of between 0.1 V and 0.24 V, between 0.21 V and 0.31 V, between 0.31 V and 0.4 V, between 0.4 V and 0.5 V, and between 0.5 V and 0.55 V.

The voltage applied to the word line selected in the read operation at the "B" level is between 1.5 V and 2.3 V, for example. The present invention is not limited thereto, and the voltage may be any of between 1.65 V and 1.8 V, between 1.8 V and 1.95 V, between 1.95 V and 2.1 V, and between 2.1 V and 2.3 V.

The voltage applied to the word line selected in the read operation at the "C" level is between 3.0 V and 4.0 V, for example. The present invention is not limited thereto, and the voltage may be any of between 3.0 V and 3.2 V, between 3.2 V and 3.4 V, between 3.4 V and 3.5 V, between 3.5 V and 3.6 V, and between 3.6 V and 4.0 V.

A time (tRead) of the read operation may be between 25 μs and 38 μs, between 38 μs and 70 μs, or between 70 μs and 80 μs, for example.

(2) The write operation includes the program operation and the verify operation, as described above. In the write operation, the voltage first applied to the word line selected in the program operation is between 13.7 V and 14.3 V, for example. The present invention is not limited thereto, and the voltage may be any of between 13.7 V and 14.0 V and between 14.0 V and 14.6 V, for example.

The voltage first applied to the selected word line when an odd-number-th word line is written and the voltage first applied to the selected word line when an even-number-th word line is written may be changed.

When the program operation is of an ISPP (Incremental Step Pulse Program) type, a voltage of a step-up is approximately 0.5 V, for example.

The voltage applied to a unselected word line may be between 6.0 V and 7.3 V, for example. The present invention is not limited to this case, and the voltage may be between 7.3 V and 8.4 V, for example, or may be not more than 6.0 V.

A pass voltage to be applied may be changed depending on whether the unselected word line is an odd-number-th word line or an even-number-th word line.

The time (tProg) of the write operation may be between 1700 μs and 1800 μs, between 1800 μs and 1900 μs, or between 1900 μs and 2000 μs, for example.

(3) In the erase operation, a voltage first applied to a well provided at an upper portion of a semiconductor substrate and including the memory cell disposed above is between 12.0 V and 13.6 V, for example. The present invention is not limited thereto, and the voltage may be any of between 13.6

V and 14.8 V, between 14.8 V and 19.0 V, between 19.0 V and 19.8 V, and between 19.8 V and 21.0 V.

A time (tErase) of the erase operation may be between 3000 µs and 4000 µs, between 4000 µs and 5000 µs, or between 4000 µs and 9000 µs, for example.

(4) As the structure of the memory cell, the memory cell has on a semiconductor substrate (a silicon substrate) a charge accumulation layer disposed through a tunnel insulating film having a film thickness of 4 to 10 nm. The charge accumulation layer may have a laminate structure including an insulating film, such as SiN or SiON having a film thickness of 2 to 3 nm and polysilicon having a film thickness of 3 to 8 nm. Polysilicon may contain a metal such as Ru. An insulating film is provided on the charge accumulation layer. The insulating film has, for example, a lower layer High-k film having a film thickness of 3 to 10 nm, an upper layer High-k film having a film thickness of 3 to 10 nm, and a silicon oxide film having a film thickness of 4 to 10 nm. Examples of a High-k film include HfO. The film thickness of the silicon oxide film may be increased so as to be larger than the film thickness of the High-k film. On the insulating film, a control electrode having a film thickness of 30 to 70 nm is formed through a material having a film thickness of 3 to 10 nm. Here, the material is a metal oxide film, such as TaO, or a metal nitride film, such as TaN. As the control electrode, W or the like may be used.

An air gap may be formed between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   first and second memory cells;
   a third memory cell, one end of the third memory cell being connected to one end of the first memory cell;
   a fourth memory cell, one end of the fourth memory cell being connected to one end of the second memory cell;
   a first select transistor connected to another end of the third memory cell;
   a second select transistor connected to another end of the fourth memory cell;
   a first word line connected to each gate of the first and second memory cells;
   a second word line connected to each gate of the first and second memory cells, the second word line being adjacent to the first word line; and
   a controller configured to execute a first write and a second write, wherein
   in a write operation, the controller sequentially executes the first write for the third memory cell, the second write for the first memory cell, and the first write for the fourth memory cell.

2. The device of claim 1, wherein
   in the first write, a first program pulse is applied a plurality of times to a selected word line, wherein a voltage of the first program pulse increases, from a first voltage, by a second voltage for each application of the first program pulse,
   in the second write, a second program pulse is applied a plurality of times to a selected word line, wherein a voltage of the second program pulse increases, from a third voltage, by a fourth voltage for each application of the second program pulse,
   the first voltage is higher than the third voltage, and
   the second voltage is higher than the fourth voltage.

3. The device of claim 1, wherein, in the write operation, the controller executes the second write for the second memory cell after the first write for the fourth memory cell.

4. The device of claim 1, further comprising:
   fifth and sixth memory cells, the first word line being connected to each gate of the fifth and sixth memory cells;
   a seventh memory cell, a gate of the seventh memory cell being connected to the first word line, one end of the seventh memory cell being connected to one end of the fifth memory cell;
   an eighth memory cell, a gate of the eighth memory cell being connected to the second word line, one end of the eighth memory cell being connected to one end of the sixth memory cell;
   a third select transistor connected to another end of the seventh memory cell; and
   a fourth select transistor connected to another end of the eighth memory cell, wherein
   in the write operation, the controller executes the first write for the third memory cell after sequentially executing the first write for the first memory cell, the first write for the second memory cell, the first write for the fifth memory cell, and the first write for the sixth memory cell.

5. The device of claim 4, wherein
   in the first write, a first program pulse is applied a plurality of times to a selected word line, wherein a voltage of the first program pulse increases, from a first voltage, by a second voltage for each application of the first program pulse,
   in the second write, a second program pulse is applied a plurality of times to a selected word line, wherein a voltage of the second program pulse increases, from a third voltage, by a fourth voltage for each application of the second program pulse,
   the first voltage is higher than the third voltage, and
   the second voltage is higher than the fourth voltage.

6. The device of claim 4, further comprising:
   a ninth memory cell connected between the other end of the third memory cell and the first select transistor;
   a tenth memory cell connected between the other end of the fourth memory cell and the second select transistor;
   an eleventh memory cell connected between the other end of the seventh memory cell and the third select transistor;
   a twelfth memory cell connected between the other end of the eighth memory cell and the fourth select transistor; and
   a third word line connected to each gate of the ninth to twelfth memory cells, the third word line being adjacent to the second word line, wherein
   in the write operation, the controller executes the first write for the ninth memory cell after the second write for the sixth memory cell.

7. The device of claim 1, wherein
   in the write operation, the controller executes the first write for the third memory cell when the controller receives a first command set from a host apparatus, and executes the second write for the first memory cell when the controller receives a second command set from the host apparatus, the first command set includes first data and a first command instructing the controller to execute the first write, and the second command set includes second data and a second command instructing the controller to execute the second write.

8. The device of claim 7, wherein in the write operation, the controller executes the first write for the first memory cell when the controller receives a third command set from the host apparatus before the controller receives the first command set, and the third command set includes the first command and the second data.

9. A semiconductor storage device comprising:

first to fourth memory cells;

a fifth memory cell, one end of the fifth memory cell being connected to one end of the first memory cell;

a sixth memory cell, one end of the sixth memory cell being connected to one end of the second memory cell;

a seventh memory cell, one end of the seventh memory cell being connected to one end of the third memory cell;

a eighth memory cell, one end of the eighth memory cell being connected to one end of the fourth memory cell;

a first select transistor connected to another end of the fifth memory cell;

a second select transistor connected to another end of the sixth memory cell;

a third select transistor connected to another end of the seventh memory cell;

a fourth select transistor connected to another end of the eighth memory cell;

a first word line connected to each gate of the first to fourth memory cells;

a second word line connected to each gate of the fifth to eighth memory cells, the second word line being adjacent to the first word line; and a controller configured to execute a first write and a second write, wherein in a write operation, the controller sequentially executes the first write for the first memory cell, the first write for the second memory cell, the first write for the third memory cell, the first write for the fourth memory cell, the first write for the fifth memory cell, and the second write for the first memory cell.

10. The device of claim 9, wherein in the first write, a first program pulse is applied a plurality of times to a selected word line, wherein a voltage of the first program pulse increases, from a first voltage, by a second voltage for each application of the first program pulse, in the second write, a second program pulse is applied a plurality of times to a selected word line, wherein a voltage of the second program pulse increases, from a third voltage, by a fourth voltage for each application of the second program pulse, the first voltage is higher than the third voltage, and the second voltage is higher than the fourth voltage.

11. The device of claim 9, wherein, in the write operation, the controller executes the first write for the sixth memory cell after the second write for the first memory cell.

12. The device of claim 11, wherein, in the write operation, the controller executes the second write for the second memory cell after the first write for the sixth memory cell.

13. The device of claim 9, wherein in the write operation, the controller executes the first write for the first memory cell when the controller receives a first command set from a host apparatus, and executes the second write for the first memory cell when the controller receives a second command set from the host apparatus, the first command set includes first data and a first command instructing the controller to execute the first write, and the second command set includes the first data and a second command instructing the controller to execute the second write.

14. The device of claim 9, further comprising:

a ninth memory cell connected between the other end of the fifth memory cell and the first select transistor;

a tenth memory cell connected between the other end of the sixth memory cell and the second select transistor;

an eleventh memory cell connected between the other end of the seventh memory cell and the third select transistor;

a twelfth memory cell connected between the other end of the eighth memory cell and the fourth select transistor; and a third word line connected to each gate of the ninth to twelfth memory cells, the third word line being adjacent to the second word line, wherein in the write operation, the controller executes the first write for the ninth memory cell after the second write for the fourth memory cell.

* * * * *